(12) United States Patent
Tanaka

(10) Patent No.: US 7,803,716 B2
(45) Date of Patent: *Sep. 28, 2010

(54) FABRICATION METHOD OF SEMICONDUCTOR DEVICE

(75) Inventor: Hiroshi Tanaka, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 194 days.

This patent is subject to a terminal disclaimer.

(21) Appl. No.: 12/112,495

(22) Filed: Apr. 30, 2008

(65) Prior Publication Data

US 2008/0299752 A1 Dec. 4, 2008

Related U.S. Application Data

(63) Continuation of application No. 11/623,343, filed on Jan. 16, 2007, now Pat. No. 7,439,190.

(30) Foreign Application Priority Data

Jan. 16, 2006 (JP) ............................. 2006-007667

(51) Int. Cl.
*H01L 21/302* (2006.01)
(52) U.S. Cl. ............................ 438/756; 43/692; 43/745; 216/92
(58) Field of Classification Search ................. 438/692, 438/693, 745, 750, 753, 756, 757; 216/91, 216/92
See application file for complete search history.

(56) References Cited

U.S. PATENT DOCUMENTS 6,096,233 A * 8/2000 Taniyama et al. ............. 216/92
6,727,155 B1 * 4/2004 Yang et al. ................... 438/366
7,271,109 B2 * 9/2007 Konuma ...................... 438/745

2003/0109137 A1 6/2003 Iwamoto et al.

(Continued)

FOREIGN PATENT DOCUMENTS

JP 2000-212773 8/2000

(Continued)

OTHER PUBLICATIONS

Chinese Official Action issued on Jun. 19, 2009, for Application No. 2007100009576.

*Primary Examiner*—Lan Vinh
(74) *Attorney, Agent, or Firm*—Antonelli, Terry, Stout & Kraus, LLP.

(57) ABSTRACT

Provided is a fabrication method of a semiconductor device having an improved production yield.

An insulating film for forming sidewall insulating films of a gate electrode is deposited on the main surface of a semiconductor wafer and then, subjected to the treatment for equalizing the film thickness distribution. In this treatment, the semiconductor wafer is fixed onto a spin stage of an etching apparatus and rotated; and an etchant is supplied from an etchant nozzle to the main surface of the rotating semiconductor wafer while moving thereabove the etchant nozzle from the peripheral side to the central side on the main surface of the semiconductor wafer. The moving speed of the etchant nozzle is controlled, depending on the thickness distribution of the insulating film and is made lower in a region where a change rate of the thickness of the insulating film in a radial direction of the semiconductor wafer is large than in a region where the change rate is small.

1 Claim, 25 Drawing Sheets

U.S. PATENT DOCUMENTS

2005/0000940 A1 1/2005 Iwamoto et al.
2005/0064641 A1 3/2005 Konuma

FOREIGN PATENT DOCUMENTS

| JP | 2002-134466 | 5/2002 |
| JP | 2004-335923 | 11/2004 |
| JP | 2005-311012 | 11/2005 |

* cited by examiner $$ET(n) = \sum_{n=1}^{n} T(n) \quad \cdots \text{ (EQUATION 7)}$$

$$ETr(n) = \sum_{n=1}^{n} Tr(n) \quad \cdots \text{(EQUATION 17)}$$

FABRICATION METHOD OF SEMICONDUCTOR DEVICE

CROSS-REFERENCE TO RELATED APPLICATION

The present application claims priority from Japanese patent application No. 2006-7667 filed on Jan. 16, 2006, the content of which is hereby incorporated by reference into this application. This application is a Continuation application of application Ser. No. 11/623,343, filed Jan. 16, 2007, now U.S. Pat. No. 7,439,190 the contents of which are incorporated herein by reference in their entirety.

BACKGROUND OF THE INVENTION

The present invention relates to a fabrication method of a semiconductor device, particularly to a technology effective when applied to a fabrication technology of a semiconductor device capable of equalizing the thickness distribution of a film formed over a semiconductor wafer.

In Japanese Unexamined Patent Publication No. 2004-335923, described is an etching method in which wet etching is carried out by grasping in advance the thickness profile of a film which has been formed on a wafer and is to be processed and discharging an etchant to a thick portion of the film. In this method, simultaneously with the discharge of the etchant, discharge of a dilute solution of the etchant to a thin portion of the film is performed.

In Japanese Unexamined Patent Publication No. 2002-134466, described is a technology of grasping in advance the thickness profile of a film which has been formed over a wafer and is to be processed and discharging an etchant only to a thick portion of the film while moving an etchant nozzle from the peripheral side to the central side of the wafer.

In Japanese Unexamined Patent Publication No. 2005-311012, described is a wet etching apparatus for jetting an etchant while reciprocating a nozzle in a radial direction of a substrate which turns horizontally at a predetermined rotation speed and thereby etching the substrate. This apparatus is equipped with a nozzle speed control means capable of adjusting the moving speed of the nozzle lower on the peripheral side of the substrate than that on the central side thereof.

In Japanese Unexamined Patent Publication No. 2000-212773, described is an apparatus for detecting the completion point of wet etching from a change of wavelength distribution spectrum to be output from a light detection element. In this apparatus, by giving trigger signals which are read integer times from a predetermined region of the light detection element synchronous with the rotation of a turntable integer times to a motor drive circuit and light detection element drive circuit, fluctuations of data to be finally obtained from the light detection element, which fluctuations are attributable to the flickering of the rotation of the turntable, are suppressed and a completion point of the wet etching is detected precisely.

SUMMARY OF THE INVENTION

As a result of the investigation, the present inventor has obtained the following findings:

For the fabrication of a semiconductor device having MISFET, a gate electrode is formed on the main surface of a semiconductor wafer via a gate insulating film, followed by the formation of an insulating film (insulating film for forming sidewall insulating films) on the main surface of the semiconductor wafer so as to cover the gate electrode with the film. Then, the insulating film is etched back to form the sidewall insulating films on the sidewalls of the gate insulating film. During deposition of the insulating film for forming the sidewall insulating films on the main surface of the semiconductor wafer, fluctuations of the deposition film thickness may occur within the main surface of the semiconductor wafer, leading to uneven film thickness distribution. As a result, there is a possibility of appearance of a thick region and a thin region in the film deposited for the formation of the sidewall insulating films.

When the thickness of the insulating film deposited for the formation of the sidewall insulating films becomes uneven within the main surface of the semiconductor wafer and a thick region and a thin region appear in the film, etching residues are generated in the thick region during the etchback step for the formation of the sidewall insulating films and these etching residues may have an influence on the subsequent steps. For example, the etching residues may function as an ion implantation blocking mask in the ion implantation step for the formation of drain and source or they may inhibit the formation of a metal silicide layer on the source and drain.

When during the etchback step for forming the sidewall insulating films, the insulating film is etched back so as to carry out adequate etching in the region where the deposition thickness of the insulating film for forming the sidewall insulating films is large and thereby avoid etching residues, overetching occurs in the region where the deposition film thickness is small. This gives damage to the exposed substrate region of the semiconductor wafer and may have an adverse effect on the gate characteristics of the MISFET to be fabricated.

These problems may cause a reduction in the production yield of a semiconductor device.

With the progress of downsizing or high integration of a semiconductor device, the distance between gate electrodes becomes narrower and the distance between sidewall insulating films formed on the sidewalls of gate electrodes adjacent to each other also becomes narrower. When a contact hole is formed on a source or drain between the gate electrodes adjacent to each other, it is therefore the common practice to have sidewall insulating films function as an etching stopper for preventing the misalignment of the contact hole. The area of the source or drain exposed from the bottom of the contact hole, which is formed on the source or drain between the two adjacent gate electrodes, is defined by the distance of the sidewall insulating films formed on the sidewalls of the two adjacent gate electrodes. The thickness of the sidewall insulating films formed on the sidewalls of the gate electrode is substantially proportional to the deposition thickness of the insulating film for the formation of the sidewall insulating films so that uneven deposition thickness distribution of the insulating film for the formation of the sidewall insulating films may lead to uneven thickness of the sidewall insulating films, depending on the position on the main surface of the semiconductor wafer. In a region where the deposition thickness of the insulating film for the formation of the sidewall insulating films is large, the sidewall insulating films become thicker than those in a region where the deposition film thickness is small so that the distance between the sidewall insulating films formed on the sidewalls of the two adjacent gate electrodes becomes narrower, the area of the source or drain exposed from the bottom surface of the contact hole formed between the two adjacent gate electrodes becomes smaller and connection resistance may increase or occurrence of connection failure may increase. This also reduces the production yield of the semiconductor device.

An object of the present invention is to provide a technology capable of improving the production yield of a semiconductor device.

The above-described and other objects and novel features of the present invention will be apparent by the description herein and accompanying drawings.

Outline of the inventions, typical of those disclosed by the present application, will hereinafter be described briefly.

In one aspect of the present invention, there is thus provided a fabrication method of a semiconductor device, which comprises the steps of: (a) preparing a semiconductor wafer, (b) forming a gate electrode on the main surface of the semiconductor wafer, (c) forming a first insulating film on the main surface of the semiconductor wafer so as to cover the gate electrode therewith, (d) after the step (c), correcting the thickness distribution of the first insulating film on the semiconductor wafer, and (e) after the step (d), etching back the first insulating film to form sidewall insulating films made of the first insulating film over the sidewalls of the gate electrode, wherein in the step (d), an etchant for etching the first insulating film is supplied to the main surface of the semiconductor wafer from an etchant supply means while rotating the semiconductor wafer and moving thereabove the etchant supply means from a peripheral side of the main surface of the semiconductor wafer to a central side thereof; and the moving speed of the etchant supply means is controlled, depending on the thickness distribution of the first insulating film on the semiconductor wafer.

In another aspect of the present invention, there is also provided a fabrication method of a semiconductor device, which comprises the steps of: (a) preparing a semiconductor wafer, (b) forming a gate electrode on the main surface of the semiconductor wafer, (c) forming a first insulating film on the main surface of the semiconductor wafer so as to cover the gate electrode therewith, (d) after the step (c), correcting the thickness distribution of the first insulating film on the semiconductor wafer, and (e) after the step (d), etching back the first insulating film to form sidewall insulating films made of the first insulating film on the sidewalls of the gate electrode, wherein in the step (d), after an etchant for etching the first insulating film is supplied to the main surface of the semiconductor wafer, a rinse solution for terminating the etching of the first insulating film is supplied from a rinse solution supply means to the main surface of the rotating semiconductor wafer while moving thereabove the rinse solution supply means from the peripheral side of the main surface of the semiconductor wafer to the central side thereof and the moving speed of the rinse solution supply means is controlled, depending on the thickness distribution of the first insulating film on the semiconductor wafer.

In a further aspect of the present invention, there is also provided a fabrication method of a semiconductor device, which comprises the steps of: (a) preparing a semiconductor wafer, (b) forming a first conductive film for a gate electrode on the main surface of the semiconductor wafer, (c) forming a second insulating film for the first conductive film, (d) patterning the second insulating film, (e) after the step (d), correcting the size of the pattern of the second insulating film over the semiconductor wafer, and (f) after the step (e), etching the first conductive film with the pattern of the second insulating film as an etching mask to form the gate electrode, wherein in the step (e), an etchant for etching the pattern of the second insulating film is supplied to the main surface of the semiconductor wafer from an etchant supply means while rotating the semiconductor wafer and moving thereabove the etchant supply means from the peripheral side of the semiconductor wafer to the central side thereof and the moving speed of the etchant supply means is changed between the peripheral side and central side of the semiconductor wafer.

Advantages available by the typical inventions, of those disclosed by the present application, will next be described briefly.

The present invention makes it possible to improve the production yield of a semiconductor device.

DETAILED DESCRIPTION OF THE PREFERRED EMBODIMENTS

Figure 1:
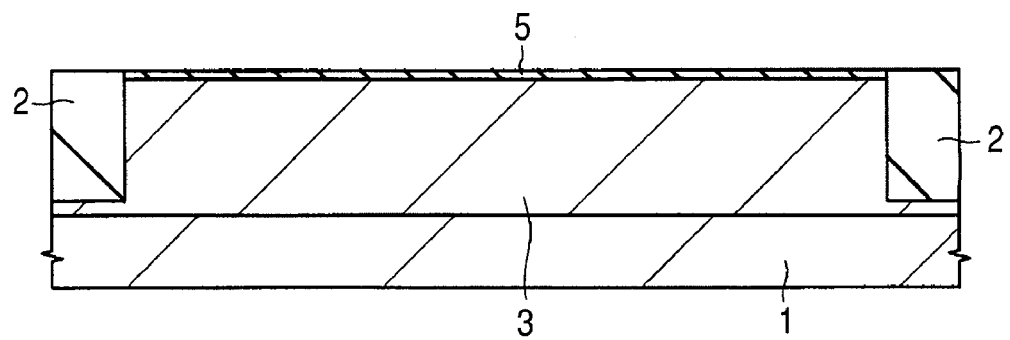
FIG. 1 is a fragmentary cross-sectional view of a semiconductor device according to one embodiment of the present invention during a fabrication step thereof.

Prior to the detailed description of the present invention, meanings of the terms used herein will be explained below.

1. When reference is made to the name of a substance such as silicon, it does not mean only the substance, but embraces compounds having the substance (element, atom group, molecule, polymer, copolymer, compound or the like) as a main component or constituent unless otherwise particularly noted.

Described specifically, when reference is made to a silicon region, it embraces a pure silicon region, a region having an impurity-doped silicon as a principal component, and a mixed crystal region containing silicon as a principal constituent such as GeSi unless otherwise noted. When reference is made to MIS, "M" is not limited to a pure metal, but embraces polysilicon (including amorphous) electrode, silicide layer, and other members exhibiting metal-like properties, unless otherwise particularly specified. Further, when reference is made to MIS, "I" is not limited to an oxide film such as silicon oxide film, but embraces a nitride film, oxynitride film, alumina film, other normal dielectric, high dielectric and ferroelectric films, unless otherwise particularly specified.

2. The term "wafer" embraces a silicon or another semiconductor single crystal substrate (usually, substantially diskshaped ones, semiconductor wafer, semiconductor chips or pellets obtained by dividing them into unit integrated circuit regions, as well as their base regions) used in the fabrication of a semiconductor integrated circuit, sapphire substrate, glass substrate, other insulating, semi-insulating or semiconductor substrates, and composite substrates thereof.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated. In the below-described embodiments, when a reference is made to the number of elements (including the number, value, amount and range), the number of elements is not limited to a specific number but can be greater than or less than the specific number unless otherwise specifically indicated or in the case it is principally apparent that the number is limited to the specific number. Moreover in the below-described embodiments, it is needless to say that the constituting elements (including element steps) are not always essential unless otherwise specifically indicated or in the case where it is principally apparent that they are essential. Similarly, in the below-described embodiments, when a reference is made to the shape or positional relationship of the constituting elements, that substantially analogous or similar to it is also embraced unless otherwise specifically indicated or in the case where it is utterly different in principle. This also applies to the above-described value and range.

Embodiments of the present invention will be described in detail with reference to the accompanying drawings. In all of the drawings for illustrating the embodiments, members having the same functions are identified by like reference numerals, and overlapping descriptions will be omitted.

In the drawings employed for Embodiments, hatching is sometimes omitted to facilitate understanding of the drawings even if they are cross-sectional views. On the contrary, hatching may be sometimes added to even plan views or perspective views in order to facilitate their understanding.

Embodiment 1

Fabrication steps of a semiconductor device according to this Embodiment will be described with reference to some drawings.

FIGS. 1 to 12 are fragmentary cross-sectional views of the semiconductor device according to Embodiment 1 of the present invention, for example, MISFET (Metal Insulator Semiconductor Field Effect Transistor) during its fabrication steps.

As illustrated in FIG. 1, a semiconductor wafer (wafer, semiconductor substrate) 1 made of, for example, p type single crystal silicon having a specific resistance of about from 1 to 10 Ωcm is prepared. Element isolation regions 2 are formed on the main surface of the semiconductor wafer 1. The element isolation regions 2 are each made of an insulator such as silicon oxide and can be formed, for example, by STI (Shallow Trench Isolation) or LOCOS (Local Oxidization of Silicon) method. By the element isolation regions 2 thus formed, an active region defined, at the circumference thereof, by the element isolation regions 2 is formed on the main surface of the semiconductor wafer 1.

A p well 3 is then formed with a predetermined depth from the main surface of the semiconductor wafer 1. The p well 3 can be formed by the ion implantation of a p type impurity such as boron (B).

After the surface of the p well 3 is cleaned, a gate insulating film 5 is formed on the surface of the p well 3. The gate insulating film 5 is made of, for example, a thin silicon oxide film and it can be formed, for example, by the thermal oxidation process. The gate insulating film 5 can be made of an oxynitride silicon film. The gate insulating film 5 can also be made of a so-called high-k insulating film (film with a high dielectric constant).

Figure 2:
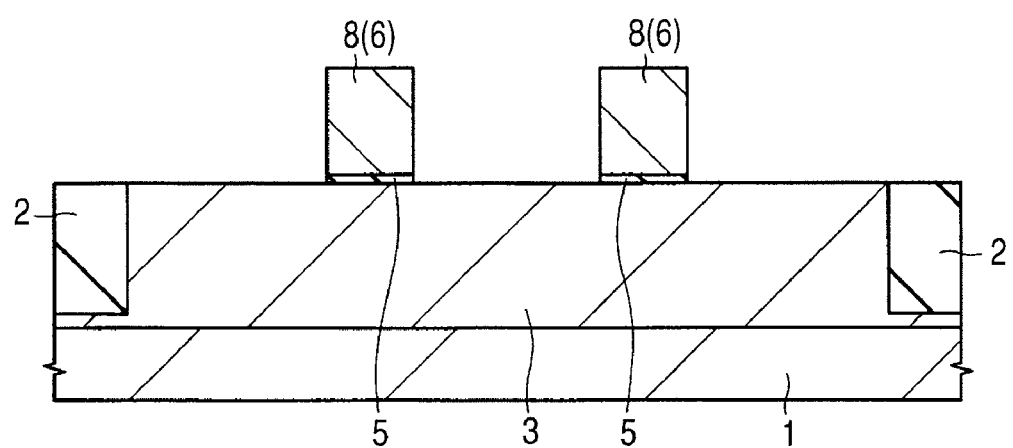
FIG. 2 is a fragmentary cross-sectional view of the semiconductor device during a fabrication step following that of FIG. 1.

A conductive film (conductor film, conducting film) 6 is then formed on the main surface (that is, on the gate insulating film 5) of the semiconductor wafer 1. The conductive film 6 is a film for forming a gate electrode. The conductive film 6 can be formed, for example, from a low resistance polycrystalline silicon film (polycrystalline silicon film having an impurity doped therein, doped polysilicon film). With a photoresist pattern (not illustrated) formed on the conductive film 6 as an etching mask, the conductive film 6 is patterned by etching (dry etching), whereby as illustrated in FIG. 2, a gate electrode 8 made of a patterned conductive film 6 is formed on the gate insulating film 5 on the p well 3.

In the next place, thermal oxidation treatment is performed to repair the gate insulating film 5 and at the same time, form a thin silicon oxide film (not illustrated) on the exposed surface (side surface) of the gate electrode 8. This thin silicon oxide film can be adjusted to, for example, a thickness of about 2 nm.

Figure 3:
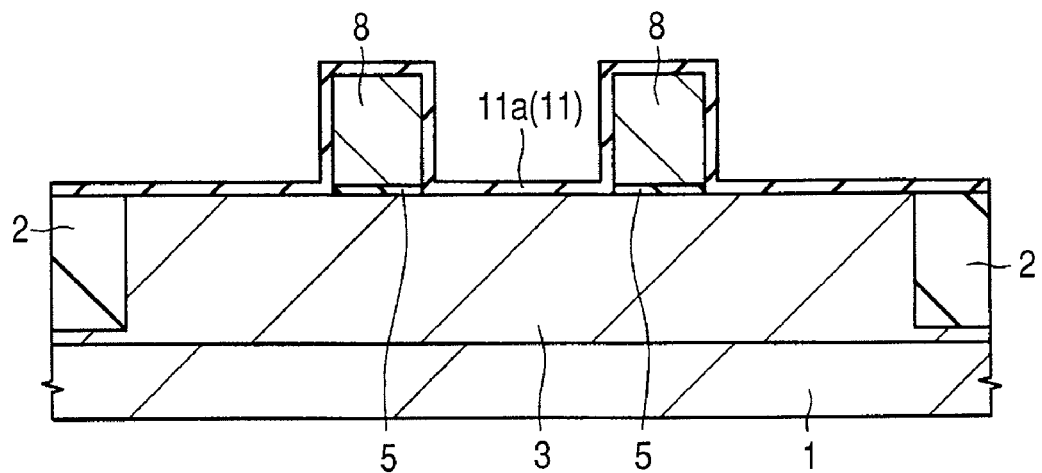
FIG. 3 is a fragmentary cross-sectional view of the semiconductor device during a fabrication step following that of FIG. 2.

As illustrated in FIG. 3, an insulating film 11a made of silicon oxide is deposited (formed) all over the main surface of the semiconductor wafer 1 by CVD so as to cover the gate electrode 8. The insulating film 11a is an insulating film for forming an offset spacer 12 which will be described later. The deposition thickness of the insulating film 11a can be adjusted to, for example, about 10 nm. After the deposition (formation) of the insulating film 11a, Step S1, which will be described more specifically later, for correcting (equalizing) the thickness distribution of the insulating film 11 (the insulating film 11a, here) deposited on the main surface of the semiconductor wafer 1 is carried out.

Figure 4:
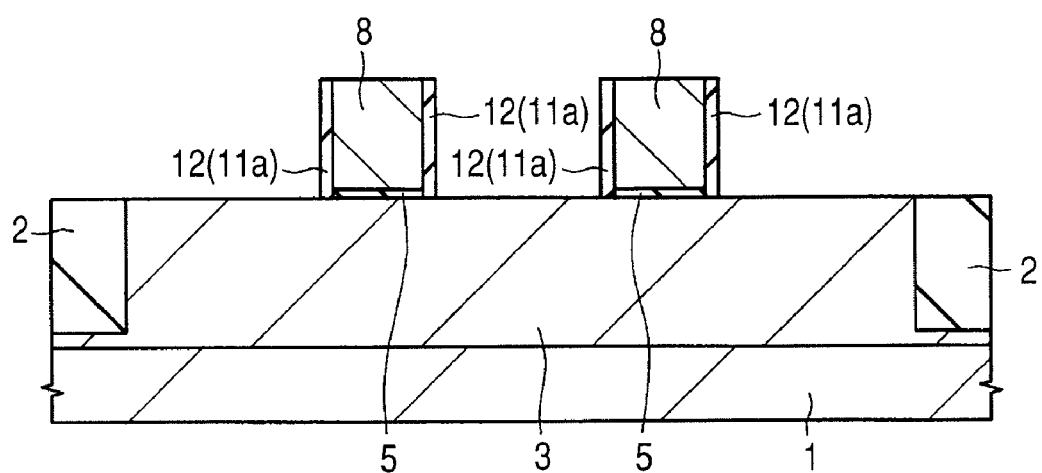
FIG. 4 is a fragmentary cross-sectional view of the semiconductor device during a fabrication step following that of FIG. 3.

As illustrated in FIG. 4, the insulating film 11a is left on the side walls of the gate insulating film 8 and the insulating film 11a of the other region is removed by etching back (anisotropic etching) of the insulating film 11a, whereby offset spacers (sidewall insulating films) 12 made of the remaining insulating film 11a can be formed on the sidewalls of the gate electrode 8. When the insulating film 11a is formed after the formation of the thin silicon oxide film (not illustrated) over the exposed surface of the gate electrode 8 as described above, the offset spacer 12 is composed of the thin silicon oxide film and the insulating film 11a thereover. The width (thickness in the gate length direction) of the offset spacer 12 can be adjusted to, for example, 12 nm.

Figure 5:
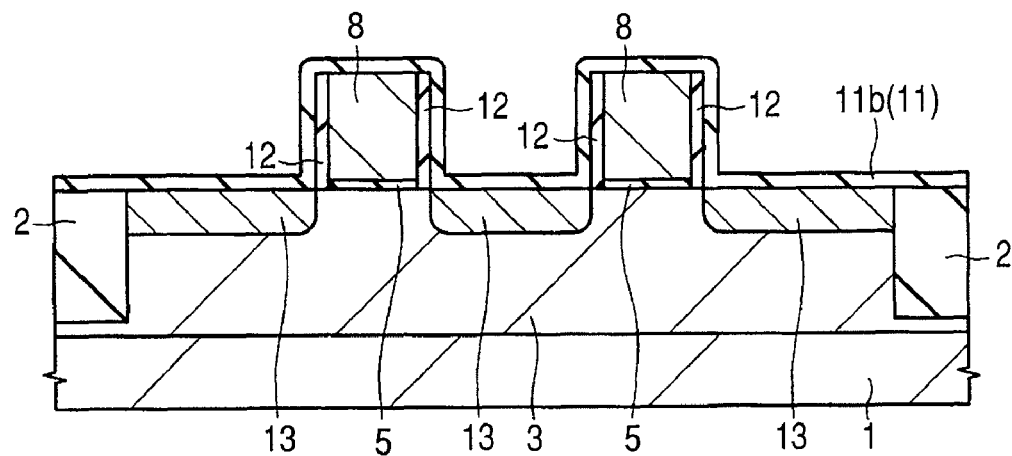
FIG. 5 is a fragmentary cross-sectional view of the semiconductor device during a fabrication step following that of FIG. 4.
Figure 6:
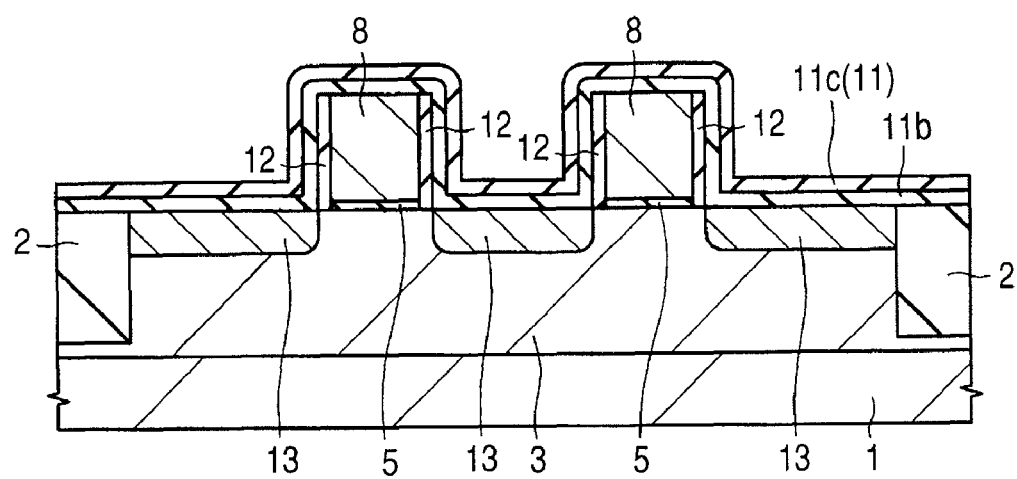
FIG. 6 is a fragmentary cross-sectional view of the semiconductor device during a fabrication step following that of FIG. 5.

As illustrated in FIG. 5, an n type impurity such as phosphorus (P) or arsenic (As) is implanted into regions of the p well 3 on both sides of the gate electrode 8 and offset spacers 12, whereby n⁻ semiconductor regions 12 are formed in the p well 3. The n⁻ semiconductor regions 13 are formed in self alignment with the offset spacers 12 on the sidewalls of the gate electrode 8, but the formation of the offset spacers 12 can be omitted. In this case, the n-type semiconductor regions 13 are formed in self alignment with the gate electrode 8.

An insulating film 11b is then deposited (formed) all over the main surface of the semiconductor wafer 1 to cover the gate electrode 8 therewith. The insulating film 11b is an insulating film for forming the sidewall spacers 15 which will be described later. The insulating film 11b is made of, for example, a silicon oxide film and can be deposited (formed) by CVD. The deposition thickness of the insulating film 11b can be adjusted to, for example, about 20 nm. After the deposition (formation) of the insulating film 11b, Step 1 for correcting (equalizing) the thickness distribution of the insulating film 11 (the insulating film 11b, here) deposited on the main surface of the semiconductor wafer 1 is carried out (details of this step will be described later).

Figure 7:
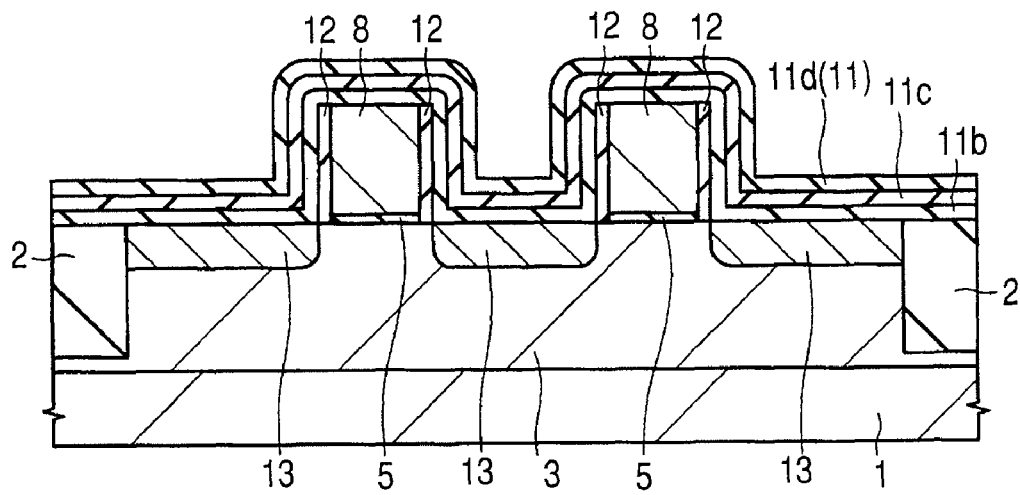
FIG. 7 is a fragmentary cross-sectional view of the semiconductor device during a fabrication step following that of FIG. 6.

As illustrated in FIG. 7, an insulating film 11d is deposited (formed) all over the main surface (on the insulating film 11c) of the semiconductor wafer 1. The insulating film 11d is formed to cover therewith the gate electrode 8. The insulating film 11d is an insulating film for forming sidewall spacers 15 which will be described later. The insulating film 11d is made of, for example, a silicon oxide film and can be deposited (formed) by CVD. The deposition thickness of the insulating film 11d can be adjusted to, for example, about 50 nm. After the deposition (formation) of the insulating film 11d, Step 1 for correcting (equalizing) the thickness distribution of the insulating film 11 (the insulating film 11d, here) deposited on the main surface of the semiconductor wafer 1 is carried out (details of this step will be described later).

Figure 8:
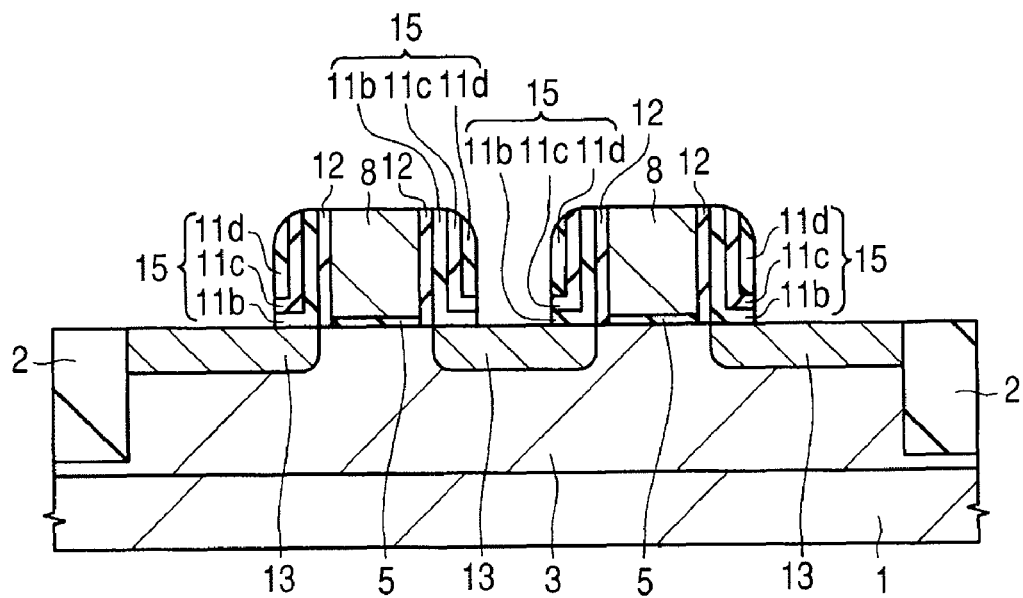
FIG. 8 is a fragmentary cross-sectional view of the semiconductor device during a fabrication step following that of FIG. 7.

As illustrated in FIG. 8, the insulating films 11b, 11c and 11d are etched back (by anisotropic etching), whereby a film stack of the insulating films 11b, 11c and 11d is left on the sidewalls of the gate electrode 8 as sidewall spacers (sidewall insulating films) 15 and the insulating films 11b, 11c and 11d of the other region are removed. This makes it possible to form, on the sidewalls of the gate electrode 8, sidewall spacers (sidewall insulating films) 15 made of the insulating films 11b, 11c and 11d via the offset spacers 12. In this Embodiment, the sidewall spacers 15 are made of the film stack of the insulating films 11b, 11c and 11d. As another embodiment, it is possible to form only one or two of the insulating films 11b, 11c and 11d and constitute the sidewall spacers from it (them).

Figure 9:
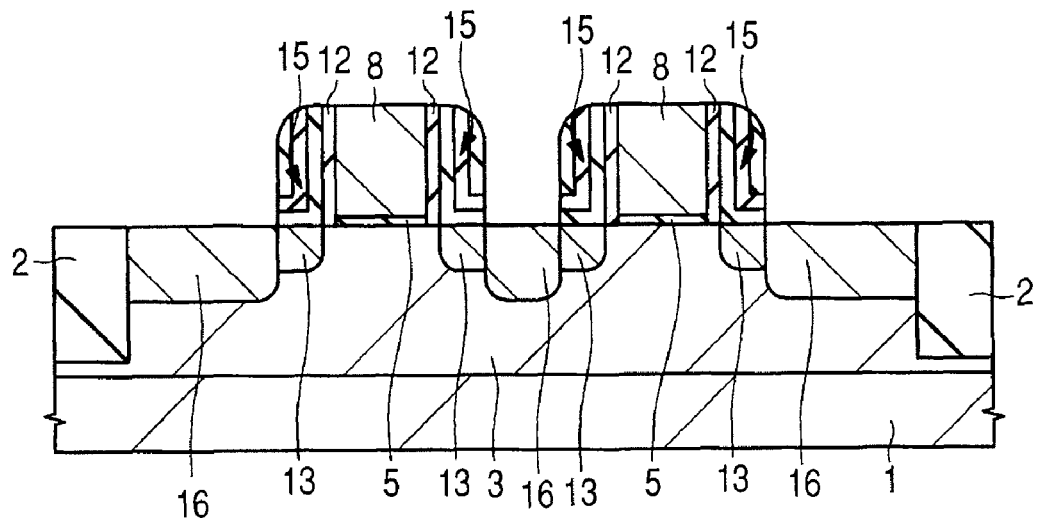
FIG. 9 is a fragmentary cross-sectional view of the semiconductor device during a fabrication step following that of FIG. 8.

As illustrated in FIG. 9, with the sidewall spacers as an ion implantation blocking mask, an n type impurity such as phosphorus (P) or arsenic (As) is implanted into regions of the p well 3 on both sides of the gate electrode 8 and sidewall spacers 15, whereby n+semiconductor regions (source and drain) are formed in the p well 3 in self alignment with the sidewall spacers 15. The n$^+$ type semiconductor regions 16 have a higher impurity concentration than the n$^-$ type semiconductor regions 13. After the ion implantation, annealing treatment (heat treatment) may be performed to activate the impurity thus implanted.

Figure 10:
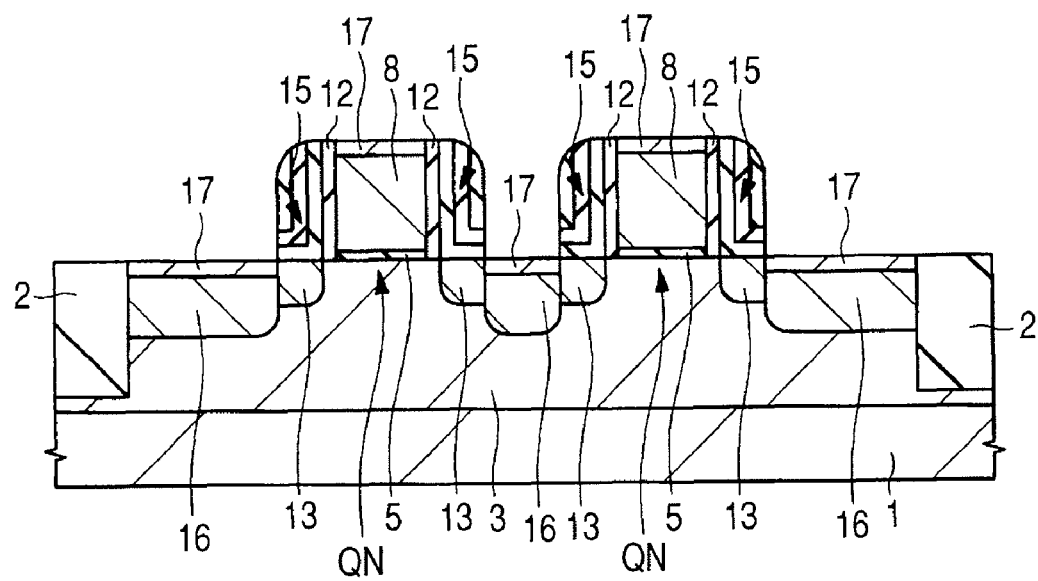
FIG. 10 is a fragmentary cross-sectional view of the semiconductor device during a fabrication step following that of FIG. 9.

As illustrated in FIG. 10, the surfaces of the gate electrode 8a and n$^+$ type semiconductor regions 16 are exposed. A metal film such as cobalt (Co) film is deposited, followed by heat treatment, whereby metal silicide layers 17 (for example, cobalt silicide layers) are formed on the surfaces of the gate electrode 8 and n$^+$ type semiconductor regions 16, respectively. This makes it possible to lower the diffusion resistance or contact resistance of the n$^+$ type semiconductor regions 16. An unreacted metal film (cobalt film) is then removed.

In such a manner, an n channel MISFET (Metal Insulator Semiconductor Field Effect Transistor) QN is formed over the p well 3.

In this Embodiment, a description was made of the formation of an n channel MISFET. It is also possible to form a p channel MISFET by reversing the conductivity type from n to p, or form CMISFET (Complementary Metal Insulator Semiconductor Field Effect Transistor) by forming both an n channel MISFET and p channel MISFET.

Figure 11:
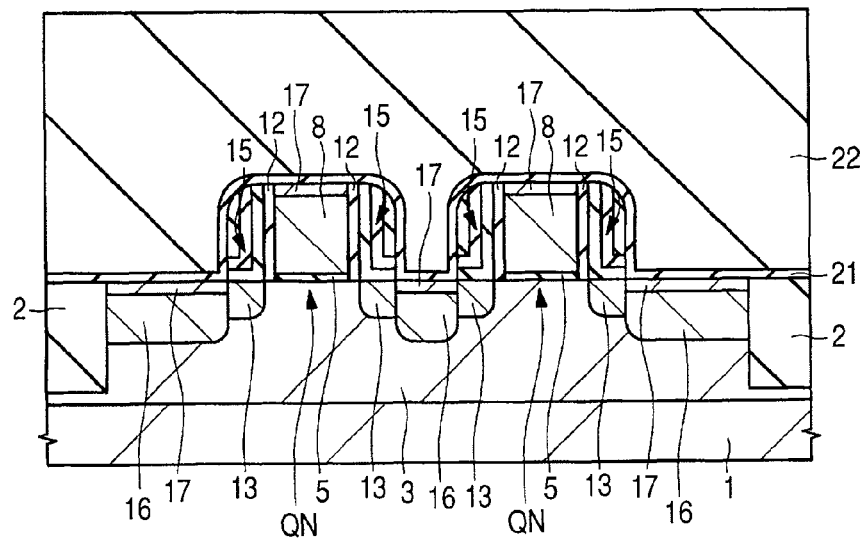
FIG. 11 is a fragmentary cross-sectional view of the semiconductor device during a fabrication step following that of FIG. 10.

As illustrated in FIG. 11, insulating films (interlayer insulating films) 21 and 22 are formed successively on the main surface of the semiconductor wafer 1 so as to cover the gate electrode 8 and sidewall spacers 15 with them. The insulating film 21 is thinner than the insulating film 22. The insulating film 21 is made of, for example, a silicon nitride film and the insulating film 22 over the insulating film 21 is made of, for example, a silicon oxide film and can be formed by CVD or the like. The insulating film 22 can be formed by a stack of a plurality of insulating films. After the formation of the insulating film 22, CMP may be performed, if necessary, to planarize the upper surface of the insulating film 22.

Figure 12:
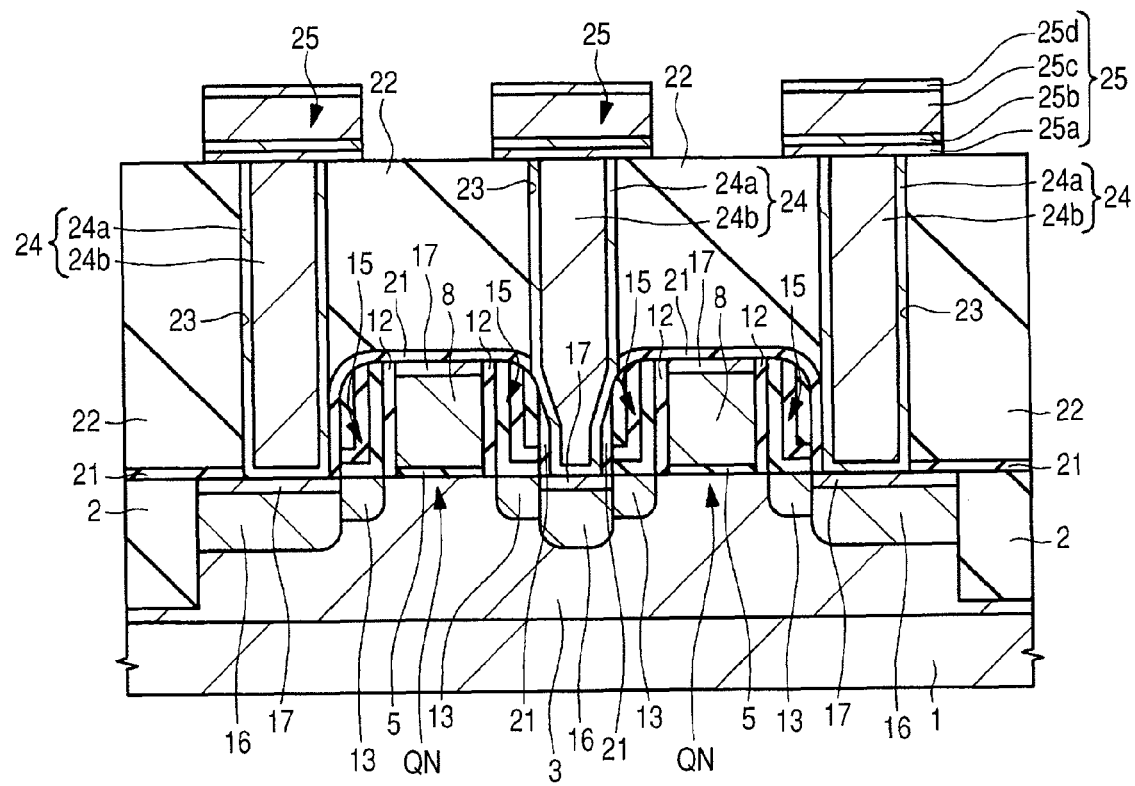
FIG. 12 is a fragmentary cross-sectional view of the semiconductor device during a fabrication step following that of FIG. 11.

As illustrated in FIG. 12, with a photoresist pattern (not illustrated) formed by photolithography on the insulating film 22 as an etching mask, the insulating films 22 and 21 are dry etched to form contact holes (opening portion, through-hole) 23 over the n$^+$ semiconductor regions 16 (source, drain) and gate electrode 8. The contact holes 23 which penetrate through the insulating films 21 and 22 can be formed by dry etching the insulating film 22 with the insulating film 21 as an etching stopper film to form the contact holes 23 and then dry etching the insulating film 21 at the bottom of the contact holes 23. This makes it possible to prevent substrate regions (n$^+$ semiconductor regions 16) from being damaged in the dry etching step for forming the contact holes 23. During the dry etching for forming the contact holes 23, the sidewall spacers 15 can be caused to serve as an etching stopper for preventing misalignment of the contact holes 23. At the bottom of the contact holes 23 formed in the insulating film 21, a portion of the main surface of the semiconductor wafer 1, for example, a portion of the n$^+$ semiconductor regions 16 (metal silicide layer 17 on the surface thereof) or a portion of the gate electrode 8 (the metal silicide layer 17 on the surface thereof) is exposed.

Plugs 24 are then formed in the contact holes 23. The plugs 24 are formed, for example, by forming a conductive barrier film (for example, a stack of a titanium film and a titanium nitride film) 24a on the insulating film 22 including the inside of the contact holes 23, and forming, on the conductive barrier film 24a, a tungsten film (main conductor film) 24b by CVD to fill the contact holes 23 therewith. The tungsten film 24b and conductive barrier film 24a are left only in the contact holes 23 by removing an unnecessary portion of the tungsten film 24b and conductive barrier film 24a on the insulating film 22 by CMP or etch back, whereby the plugs 24 made of the conductive barrier film 24a and tungsten film 24b left and filled in the contact holes 23 can be formed.

Interconnects 25 are formed on the insulating film 22 having the plugs 24 buried therein. Each interconnect 25 can be formed, for example, by forming a titanium film 25a, a titanium nitride film 25b, an aluminum film 25c and a titanium nitride film 25d successively by sputtering, followed by patterning by using photolithography and dry etching. Interlayer insulating films and upper-level interconnect layers are formed after that but the description of them will be omitted.

By etchback (anisotropic etching) of the insulating films 11a, 11b, 11c and 11d deposited on the main surface of the semiconductor wafer 1, the insulating films 11a, 11b, 11c and 11d (offset spacers 12 or sidewall spacers 15) are left on the sidewalls of the gate electrode 8 while the insulating films 11a, 11b, 11c and 11d of the other region are removed. When the insulating films 11a, 11b, 11c and 11d are deposited on the main surface of the semiconductor wafer 1, however, there is a possibility of appearance of a thick region (corresponding to region 1A which will be described later) and a thin region (corresponding to a region 1B which will be described later) relating to the deposition thickness of the insulating films 11a, 11b, 11c and 11d, because fluctuations occur in the thickness of the insulating films 11a, 11b 11c and 11d within the main surface of the semiconductor wafer 1 and a film thickness distribution becomes uneven.

Figure 13:
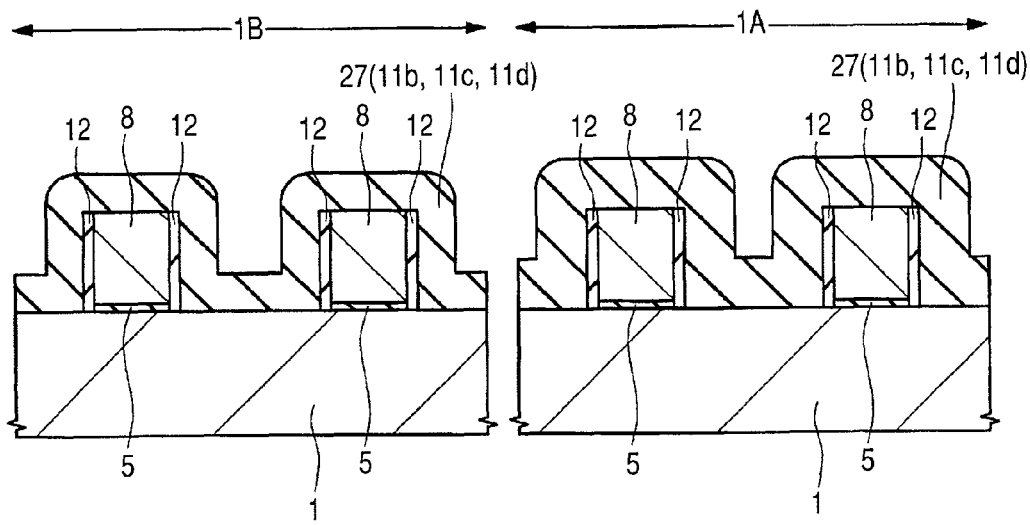
FIG. 13 is a fragmentary cross-sectional view of a semiconductor device according to First Comparative Example during a fabrication step thereof.
Figure 14:
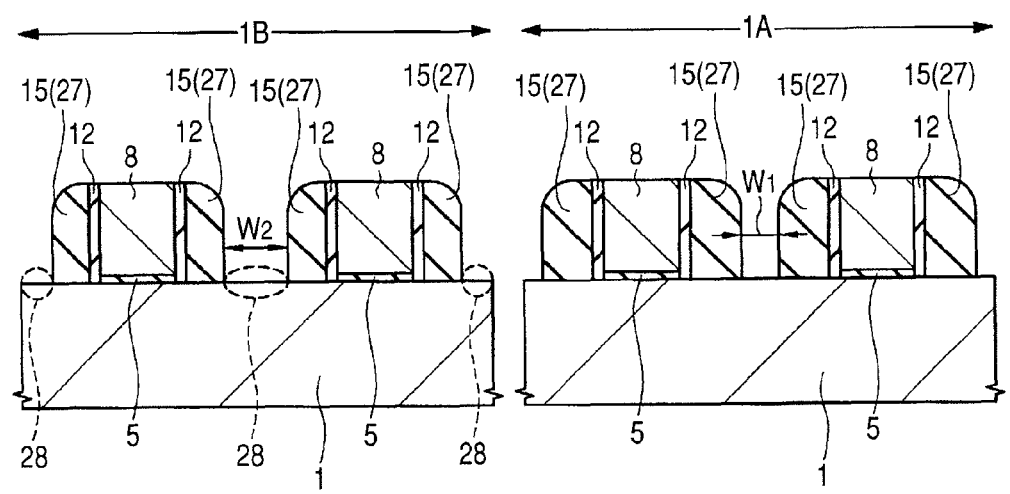
FIG. 14 is a fragmentary cross-sectional view of the semiconductor device of First Comparative Example during a fabrication step following that of FIG. 13.
Figure 15:
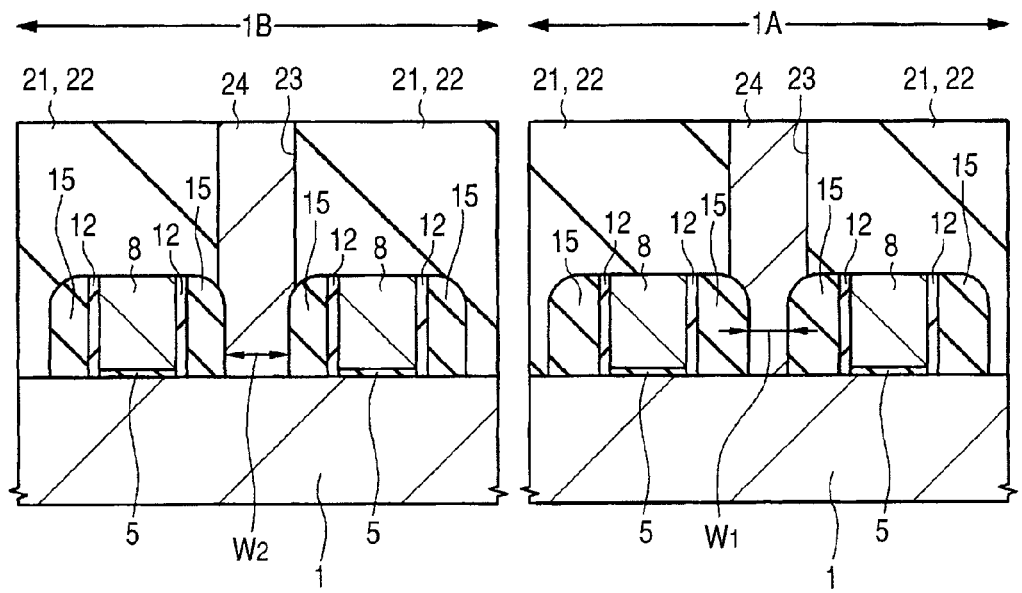
FIG. 15 is a fragmentary cross-sectional view of the semiconductor device of First Comparative Example during a fabrication step following that of FIG. 14.

FIGS. 13 to 15 are fragmentary cross-sectional views of a semiconductor device according to First Comparative Example during its fabrication step. This example does not include Step S1, different from Embodiment 1. These drawings substantially correspond to the steps of Embodiment 1 illustrated in FIGS. 7 and 8 and FIG. 12, respectively. An insulating film 27 illustrated in FIG. 13 is a film for forming sidewall insulating films (sidewall spacers 15) and it corresponds to the stack of the insulating films 11b, 11c and 11d. In FIGS. 13 to 15, fragmentary cross-sectional views of a region 1A in which the deposition thickness of the insulating film 27 on the main surface of the semiconductor wafer 1 is large and a region 1B in which the deposition thickness of the insulating film 27 is small are shown. In FIGS. 13 to 15, the p well 3, n⁻ semiconductor regions 13 and n⁺ semiconductor regions 16 are included in the semiconductor wafer 1.

When the treatment of Step 1, which is performed in Embodiment 1, is omitted, the deposition thickness of the insulating film 27 becomes uneven within the main surface of the semiconductor wafer 1. It leads to, as illustrated in FIG. 13, existence of both a region 1a in which the deposition thickness of the insulating film 27 is large and a region 1B in which it is small within the main surface of the semiconductor wafer 1. When during the etchback step of the insulating film 27 for the formation of the sidewall spacers 15 after deposition of the insulating film 27, the insulating film 27 is etched back in accordance with the film thickness of the region 1B in which the insulating film 27 is thin, an etching residue of the insulating film 27 appears in the region 1a in which the insulating film 27 is thick. This may have an adverse effect on the subsequent steps. For example, in the region 1a in which the deposition thickness of the insulating film 27 is large, the etching residue of the insulating film 27 may function as an ion implantation blocking mask during the ion implantation step for the formation of the n⁺ semiconductor regions 16, or may inhibit the formation of the metal silicide layer 17.

When there exist, on the main surface of the semiconductor wafer 1, both the region 1A in which the deposition thickness of the insulating film 27 is large and the region 1B in which it is small as illustrated in FIG. 13, the insulating film 27 must be etched back in consideration of the thickness of the region 1A in which the insulating film 27 is thick as illustrated in FIG. 14. In FIG. 14, etchback is performed so as to adequately etchback the insulating film 27 in the region 1A in which the deposition thickness of the insulating film 27 is large so that the appearance of the etching residue of the insulating film 27 except the sidewall spacers 15 can be prevented.

When etchback is performed so as to adequately etchback the insulating film 27 in the region 1A in which the deposition thickness of the insulating film 27 is large, however, overetching occurs in the region 1B in which the deposition thickness of the insulating film 27 is small, which may give damage to an exposed substrate region (regions of the p well 3 in which n⁺ semiconductor regions 16 are to be formed) of the semiconductor wafer 1 and may have an adverse effect on the gate characteristics of an MISFET QN to be formed. This reduces the production yield of the semiconductor device. In FIG. 14, a region 28 which may be damaged by overetching during the etchback of the insulating film 27 is schematically illustrated by a dotted line.

The thickness of the sidewall spacers 15 is almost equal to the deposition thickness of the insulating film 27 so that as illustrated in FIG. 14, in the region 1A in which the deposition thickness of the insulating film 27 is large, the sidewall spacers 15 are thick, while in the region 1B in which the deposition thickness of the insulating film 27 is small, the sidewall spacers 15 are thin. The distance between the sidewall spacers 15 formed over the sidewalls of two adjacent gate electrodes 8 is smaller (narrower) in the region 1A in which the deposition thickness of the insulating film 27 is large than in the region 1B in which the deposition thickness of the insulating film 27 is small. The distance W1 between the sidewall spacers 15 formed over the sidewalls of the two adjacent gate electrodes 8 in the region 1A in which the deposition thickness of the insulating film 27 is large is smaller (narrower) than the distance W2 between the sidewall spacers 15 formed over the sidewalls of the two adjacent gate electrodes 8 in the region 1B in which the deposition thickness of the insulating film 27 is small (W1<W2).

With the progress of downsizing and high integration of semiconductor devices, as the distance between two adjacent electrodes 8 becomes narrower, the distance between the sidewall spacers 15 formed over the sidewalls of the two adjacent gate electrodes 8 becomes narrower. As illustrated in FIG. 15, during the formation of the contact holes 23, the sidewall spacers 15 are therefore made to function as an etching stopper for preventing misalignment of the contact holes 23. In the contact holes 23 formed over the n⁺ type semiconductor regions 16, the area of the n⁺ type semiconductor regions 16 (the metal silicide layers 17 on the surface thereof) exposed at the bottom of the contact holes 23 is defined by the distance W1 or W2 between the sidewall spacers 15 formed over the sidewalls of the two adjacent gate electrodes 8.

In the region 1B in which the deposition thickness of the insulating film 27 is small, the distance W2 between the sidewall spacers 15 formed over the sidewalls of the two adjacent gate electrodes 8 is wide so that the area of the n⁺ semiconductor region (the metal silicide layer 17 on the surface thereof) exposed at the bottom of the contact hole 23 is large, while in the region 1A in which the deposition thickness of the insulating film 27 is large, the distance W1 between the sidewall spacers 15 formed over the sidewalls of the two adjacent gate electrodes 8 is narrow so that the area of the n⁺ semiconductor region 16 (the metal silicide layer 17 on the surface thereof) exposed at the bottom of the contact hole 23 is small. This leads to a higher connection resistance between the plug 24 in the contact hole 23 and the n⁺ semiconductor region 16 (the metal silicide layer 17 on the surface thereof) in the region 1A in which the deposition thickness of the insulating film 27 is large than in the region 1B in which the deposition thickness of the insulating film 27 is small. In addition, an incidence of connection failures between the plug 24 in the contact hole 23 and the n⁺ semiconductor region 16 (the metal silicide layer 17 on the surface thereof) may become higher in the region 1A in which the deposition thickness of the insulating film 27 is large than in the region 1B in which the deposition thickness of the insulating film 27 is small. This reduces the production yield of the semiconductor device.

In Embodiment 1, after the deposition (formation) of the insulating film 11 on the main surface 1a of the semiconductor wafer 1, Step S1 which is the treatment for correcting (equalizing) the thickness distribution of the insulating film 11 on the main surface of the semiconductor wafer 1 is performed to overcome the problems described above with reference to FIGS. 13 to 15. The insulating film 11 to be subjected to the treatment of Step S1 is an insulating film constituting the insulating film 27 and it corresponds to the insulating films 11b, 11c and 11d. The problems as described using FIGS. 13 to 15 occur not only during the formation of the sidewall spacers 15 but also during the formation of the offset spacers 12 so that insulating film 11 also corresponds to the insulating film 11a. In short, the insulating film 11 to be subjected to the treatment of Step S1 means the insulating films 11a, 11b, 11c and 11d for the formation of the sidewall insulating films (offset spacers 12 or sidewall spacers 15) on the sidewalls of the gate electrode 8.

Figure 16:
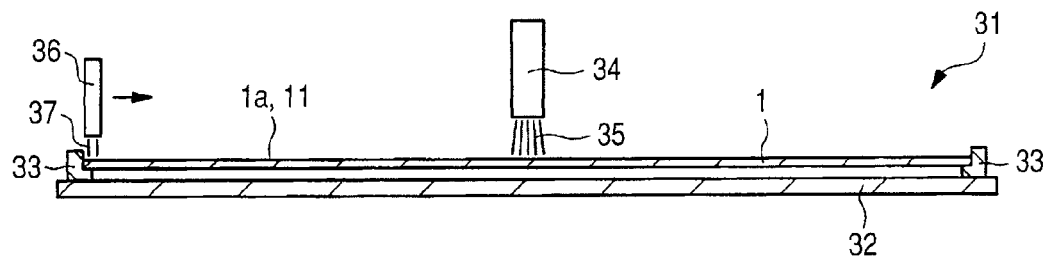
FIG. 16 is a schematic view illustrating a treatment for equalizing the thickness distribution of an insulating film deposited on the main surface of a semiconductor wafer.

FIG. 16 is a schematic view (cross-sectional view) of the treatment of Step S1 (treatment for equalizing the thickness distribution of the insulating film 11 deposited on the main surface of the semiconductor wafer 1) conducted in Embodiment 1.

As illustrated in FIG. 16, the treatment of Step S1 for correcting the thickness distribution of the insulating film 11 is performed by wet etching of a portion (upper layer portion)

of the insulating film 11 by using a single-wafer wet etching apparatus 31. In other words, in Step S1, in order to equalize the thickness distribution of the insulating film 11 on the main surface 1a of the semiconductor wafer 1, the insulating film 11 is wet etched so as to etch the insulating film 11 in a larger amount in a region where the deposition thickness is large than in a region where the deposition thickness is small, thereby correcting the thickness distribution of the insulating film 11 on the main surface 1a of the semiconductor wafer 1. This will also apply to Step S1a and S1b in Embodiments 2 and 3 which will be described later.

As illustrated in FIG. 16, the wet etching apparatus 31 is equipped with a spin stage (wafer spin stage, spin base) 32 and a wafer chuck 33 fixed and connected to the periphery of the spin stage 32. The spin stage 32 is a rotation plate which can be rotated at a high speed by an unillustrated rotation mechanism (for example, motor) and it has, for example, a larger diameter than that of the semiconductor wafer 1. The wafer chuck 33 holds the semiconductor wafer 1 and by it, the semiconductor wafer 1 is held with the main surface (surface, main surface on which a semiconductor element is formed), having the insulating film 11 formed thereon, up and the back surface, which is a surface opposite to the main surface 1a, down. By rotating the spin stage 32 by the unillustrated rotation mechanism, the wafer chuck 33 and the semiconductor wafer 1 held by the wafer chuck 33 can be rotated.

Above the spin stage 32 which means above the center of the main surface 1a of the semiconductor wafer 1 fixed to the spin stage 32 by the wafer chuck 33, a rinse solution nozzle (rinse nozzle, rinse supply means) 34 is disposed. From the rinse solution nozzle 34, a rinse solution (washing solution or rinsing solution) 35 is discharged (jetted) toward the main surface 1a of the semiconductor wafer 1 and thus the rinse solution 35 can be fed to the main surface 1a of the semiconductor wafer 1. As the rinse solution 35, pure water, for example, can be employed. The initiation or termination of the supply of the rinse solution 35 from the rinse solution nozzle 34 can be switched (or the supply (discharge) amount of the rinse solution 35 can be controlled) by a valve (not illustrated).

Above the spin stage 32, an etchant nozzle (etchant supply means) 36 is disposed. From the etchant nozzle 36, an etchant (washing solution, etchant solution, chemical solution) 37 is discharged (jetted, supplied) from the etchant nozzle 36 toward the main surface 1a of the semiconductor wafer 1, whereby the etchant 37 can be supplied to the main surface 1a of the semiconductor wafer 1. As the etchant 37, an etchant capable of etching the insulating film 11 formed on the main surface 1a of the semiconductor wafer 1 is used and an aqueous solution of hydrofluoric acid (HF), for example, can be employed. The concentration of hydrofluoric acid in the etchant 37 is not limited insofar as a desired etching amount can be secured in an etching time within a range not hindering the productivity when a single-wafer wet etching apparatus is employed. For example, when an etching amount of about 1.5 nm in terms of a thermal oxide film is desired in etching for 30 seconds, the etchant can be diluted to a 50% HF:$H_2O$ ratio of about 1:100, while when an etching amount of about 5 nm in terms of a thermal oxide film is desired in etching for 20 seconds, the etchant can be diluted to a 50% HF:$H_2O$ ratio of about 1:20.

The etching apparatus has a valve (not illustrated) by which the initiation or termination of the supply of the etchant 37 from the etchant nozzle 36 can be switched (or the supply (discharge) amount can be controlled). The temperature of the etchant 37 to be discharged from the etchant nozzle 36 can be adjusted to an ordinary temperature, that is, about 24° C. when hydrofluoric acid is employed. The flow rate of the etchant 37 to be discharged from the etchant nozzle 36 and supplied onto the main surface 1a of the semiconductor wafer 1 can be adjusted to, for example, about 0.2 L/min as a flow rate capable of inhibiting splash of water from the wafer chuck 33.

The rinse solution nozzle 34, etchant nozzle 36 and respective pipes (not illustrated) for supplying them with the rinse solution 35 and the etchant 37 are not fixed to the spin stage 32 so as to prevent rotation of the rinse solution nozzle 34 and etchant nozzle 36 even by the rotation of the spin stage 32.

The etchant nozzle 36 is movable, in a horizontal direction (a direction parallel to the spin stage 32 and the main surface 1a of the semiconductor wafer 1 held thereon) above the spin stage 32, from the position above the periphery of the main surface 1a of the semiconductor wafer 1 to the position above the center of the main surface 1a of the semiconductor wafer 1. The moving speed of the etchant nozzle 36 can be controlled to a desired rate.

Concrete procedures of Step S1 will next be described.

As illustrated in FIG. 16, the semiconductor wafer 1 having the insulating film 11 deposited on the main surface 1a thereof is held on the spin stage 32 of the etching apparatus 31 by the wafer chuck 33. By the rotation of the spin stage 32, the semiconductor wafer 1 held by the spin stage 32 is turned. The semiconductor wafer 1 can rotate with the center position of the main surface 1a as a rotation center by coinciding the rotation center of the spin stage 32 with the center position of the main surface 1a of the semiconductor wafer 1. The rotation speed of the semiconductor wafer 1 can be adjusted to, for example, 500 rpm (500 revolutions per minute).

The etchant 37 for etching the insulating film 11 is supplied from the etchant nozzle 36 to the main surface 1a of the semiconductor wafer while rotating the semiconductor wafer 1 and moving thereabove the etchant nozzle 36 from the peripheral side of the main surface 1a of the semiconductor wafer 1 to the central side thereof. Described specifically, the discharge of the etchant 37 from the etchant nozzle 36 is started while rotating the semiconductor wafer 1, and the etchant nozzle 36 which is discharging the etchant 37 is moved in a horizontal direction (a direction parallel to the spin stage 32 and the main surface 1a of the semiconductor wafer 1 held thereon) from the position above the periphery of the main surface 1a of the rotating semiconductor wafer 1 to the position above the center of the main surface 1a of the semiconductor wafer 1. By this movement, the etchant 37 is supplied from the etchant nozzle 36 to the main surface 1a of the semiconductor wafer 1 and by the etchant 37 supplied to the main surface 1a of the semiconductor wafer 1, the insulating film 11 formed on the main surface 1a of the semiconductor wafer 1 is etched. At this time, since the etchant nozzle 36 moves while supplying the etchant 37 to the main surface 1a of the semiconductor wafer 1, the position on the main surface 1a of the semiconductor wafer 1 to which the etchant 37 is supplied changes from the periphery of the main surface 1a of the semiconductor wafer 1 to the center of the main surface 1a of the semiconductor wafer 1.

The supply of the etchant 37 from the etchant nozzle 36 to the main surface 1a of the semiconductor wafer 1 is terminated after the etchant nozzle 36 is moved, above the semiconductor wafer, from the peripheral side to the central side of the main surface 1a of the semiconductor wafer 1, the etchant nozzle 36 reaches the position above the center of the main surface 1a of the rotating semiconductor wafer 1, and the position at which the etchant nozzle 36 supplies the etchant 37 to the main surface 1a of the semiconductor wafer 1 moves from the periphery to the center of the main surface 1a of the semiconductor wafer 1. Then, from the rinse solution nozzle 34 located above the center of the main surface 1a of the semiconductor wafer 1, the rinse solution 35 for terminating the etching of the insulating film 11 is supplied to the center of the main surface 1a of the rotating semiconductor wafer 1. The semiconductor wafer 1 is rotating so that the rinse solution 35 fed from the rinse solution nozzle 34 to the center of the main surface 1a of the semiconductor wafer 1 flows from the center of the main surface 1a of the semiconductor wafer 1 to the peripheral side, whereby the rinse solution 35 spreads all over the main surface 1a of the semiconductor wafer 1. The rinse treatment (rinsing treatment) of the main surface 1a of the semiconductor wafer 1 is thus carried out and the etchant 37, together with the rinse solution 35, is then removed from the main surface 1a of the semiconductor wafer 1, whereby the etching of the insulating film 11 on the main surface 1a of the semiconductor wafer 1 is terminated.

When the rinse solution 35 is fed from the rinse solution nozzle 34 to the main surface 1a of the semiconductor wafer 1, the etchant nozzle 36 located above the center of the main surface 1a of the rotating semiconductor wafer 1 may sometimes disturb the rinse solution nozzle. When the supply of the etchant 37 from the etchant nozzle 36 is terminated, it is therefore preferred to promptly move the etchant nozzle 36 from the position above the center of the main surface 1a of the rotating semiconductor wafer 1 to the peripheral side and then start the supply of the rinse solution 35 to the main surface 1a of the semiconductor wafer 1.

After rinse treatment, the discharge of the rinse solution 35 from the rinse solution nozzle 34 is stopped, whereby the supply of the rinse solution 35 to the main surface 1a of the semiconductor wafer 1 is stopped. By increasing the rotation speed of the spin stage 32, thereby increasing the rotation speed of the semiconductor wafer 1, the semiconductor wafer 1 is rotated at high speed. By making use of the centrifugal force caused by the high-speed rotation, the liquid or water (rinse solution 35) remaining on the main surface 1a of the semiconductor wafer 1 is dashed off, whereby the semiconductor wafer 1 is dried. After the semiconductor wafer 1 is dried by high speed rotation for a predetermined time, the rotation of the semiconductor wafer 1 is terminated (the rotation of the spin stage 32 is terminated).

The semiconductor wafer 1 thus treated is then sent to the subsequent step (step of forming sidewall spacers 15 by the etchback of the insulating film 11) or housed in a storage case prior thereto.

As described above, the etchant nozzle 36 is moved horizontally from the position above the periphery of the main surface 1a of the rotating semiconductor wafer 1 to the position above the center of the main surface 1a of the semiconductor wafer 1 while rotating the semiconductor wafer 1 and discharging the etchant 37 from the etchant nozzle 36. Since the semiconductor wafer 1 is rotating, the etchant 37 fed from the etchant nozzle 36 to the main surface 1a of the semiconductor wafer 1 flows toward the peripheral side on the main surface 1a of the semiconductor wafer 1. On the main surface 1a of the semiconductor wafer 1, the etchant 37 spreads (is present) outside (peripheral side) of the position to which the etchant 37 is fed from the etchant nozzle 36 and by this etchant 37, the insulating film 11 formed on the main surface 1a of the semiconductor wafer 1 is etched (wet etched). At each position on the main surface 1a of the semiconductor wafer 1, etching of the insulating film 11 continues from the contact (wetting) with the etchant 37 fed from the etchant nozzle 37 to the contact (wetting) with the rinse solution 35 fed from the rinse solution nozzle 34. It is only necessary to move the etchant nozzle 36 once from the peripheral side to the central side above the main surface 1a of the semiconductor wafer 1. This makes it possible to simplify the operation of Step S1 and decrease the time necessary for Step S1.

In Step S1, the etching time at each position on the main surface of the semiconductor wafer 1 corresponds to the time from the passage of the etchant nozzle 36 above each position to the initiation of the supply of the rinse solution 35 from the rinse solution nozzle 34. In this Embodiment, by controlling the moving speed of the etchant nozzle 36, depending on the deposition thickness distribution of the insulating film 11 on the main surface 1a of the semiconductor wafer 1, the etching time at each position on the main surface 1a of the semiconductor wafer 1 is caused to correspond to the amount of the insulating film 11 to be etched at each position on the main surface 1a in order to equalize the thickness distribution of the insulating film 11. The thickness distribution of the insulating film 11 on the main surface 1a of the semiconductor wafer 1 can therefore be equalized irrespective of position.

In this Embodiment, the etchant nozzle 36 is moved in a horizontal direction from the position above the periphery of the main surface 1a of the rotating semiconductor wafer 1 to the position above the center of the main surface 1a of the semiconductor wafer 1 while discharging the etchant 37 so that the contact time with the etchant 37 is longer and therefore etching time is longer on the peripheral side of the main surface 1a of the semiconductor wafer 1 than on the central side of the main surface 1a of the semiconductor wafer 1. On the peripheral side of the main surface 1a of the semiconductor wafer 1, the etching amount of the insulating film 11 by the etchant 37 becomes greater (larger) than that on the central side of the main surface 1a of the semiconductor wafer 1.

Step S1 of this Embodiment can therefore be applied to the case where the deposition thickness of the insulating film 11 is larger on the peripheral side of the main surface 1a of the semiconductor wafer 1 than on the central side of the main surface 1a of the semiconductor wafer 1. By carrying out Step S1, the thickness distribution of the insulating film 11 within the main surface 1a of the semiconductor wafer 1 can be equalized. In this case, the vicinity of the center of the main surface 1a of the semiconductor wafer 1 corresponds to Region 1B in which the deposition thickness of the insulating film 11 is small, while the vicinity of the periphery of the main surface 1a of the semiconductor wafer 1 corresponds to Region 1A in which the deposition thickness of the insulating film 11 is large.

When the deposition thickness distribution of the insulating film 11 on the main surface 1a of the semiconductor wafer 1 is simple and a change in the deposition thickness of the insulating film 11 is proportional to the distance from the center of the main surface 1a of the semiconductor wafer 1, it is only necessary to move the etchant nozzle 36 at a constant speed from the position above the periphery of the main surface 1a of the semiconductor wafer 1 to the position above the center of the main surface 1a of the semiconductor wafer 1. By this movement, the etching time of the insulating film 11 at each position of the main surface 1a of the semiconductor wafer 1 can be made proportional to the distance from the center of the main surface 1a of the semiconductor wafer 1, whereby the etching amount of the insulating film 11 at each position of the main surface 1a of the semiconductor wafer 1 can be made proportional to the distance from the center of the main surface 1a of the semiconductor wafer 1.

When the deposition thickness distribution of the insulating film 11 on the main surface 1a of the semiconductor wafer 1 is not simple and a change in the deposition thickness of the insulating film 11 is not proportional to the distance from the center of the main surface 1a of the semiconductor wafer 1, the thickness distribution of the insulating film 11 within the main surface 1a of the semiconductor wafer 1 cannot be equalized only by the movement of the etchant nozzle 36 at a constant speed from the position above the periphery of the main surface 1a of the rotating semiconductor wafer 1 to the position above the center of the main surface 1a of the semiconductor wafer 1.

When the etchant nozzle 36 is moved from the position above the periphery of the main surface 1a of the rotating semiconductor wafer 1 to the position above the center of the main surface 1a of the semiconductor wafer 1, the etchant nozzle 36 is moved not at a constant speed but at a speed controlled (changed), depending on the thickness distribution of the insulating film 11 within the main surface 1a of the semiconductor wafer 1 in this Embodiment.

The control of the moving speed of the etchant nozzle 36 will next be described more specifically.

Figure 17:
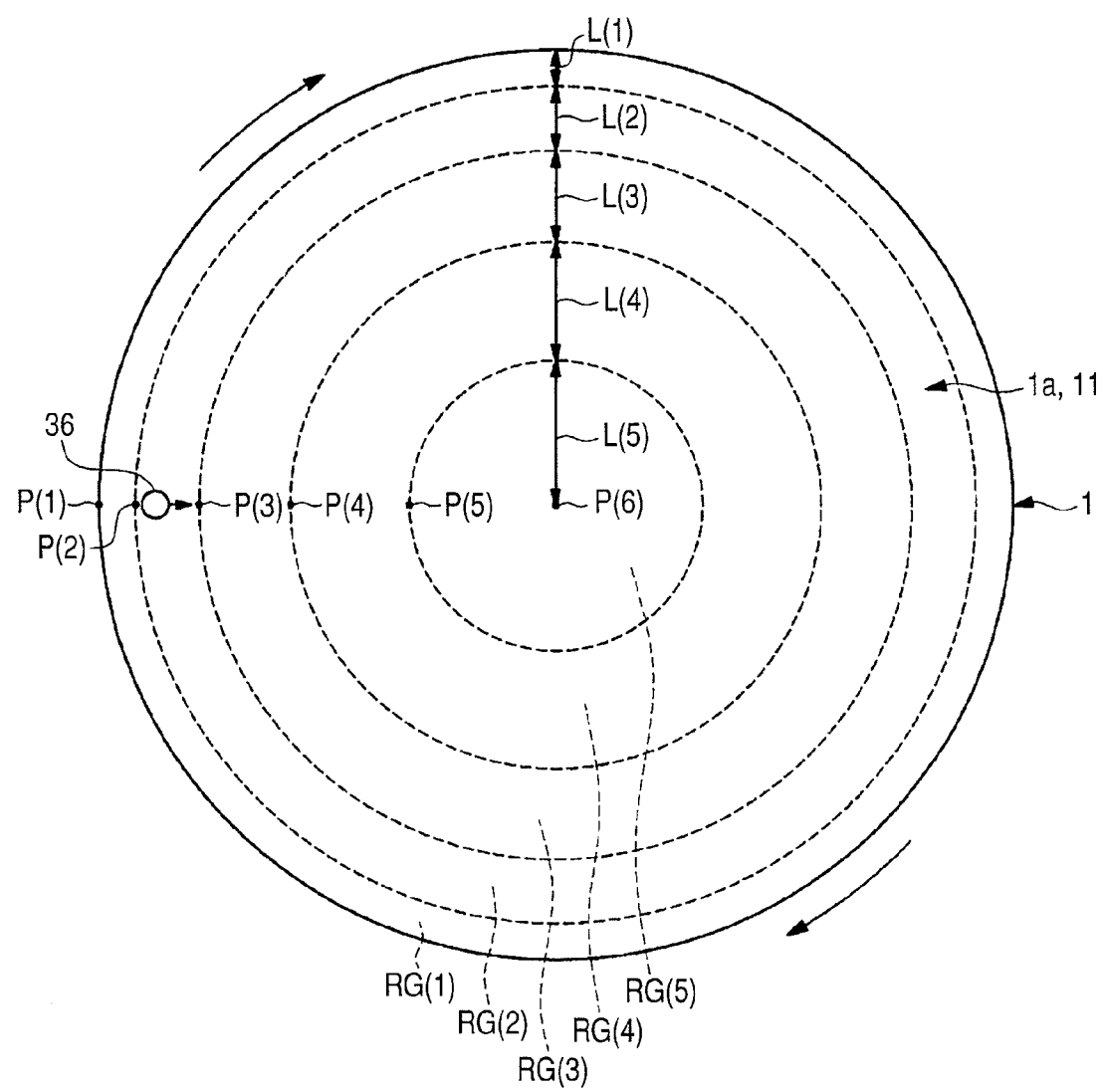
FIG. 17 is a schematic view of the control of the moving speed of an etchant nozzle which moves on a semiconductor wafer.
Figure 18:
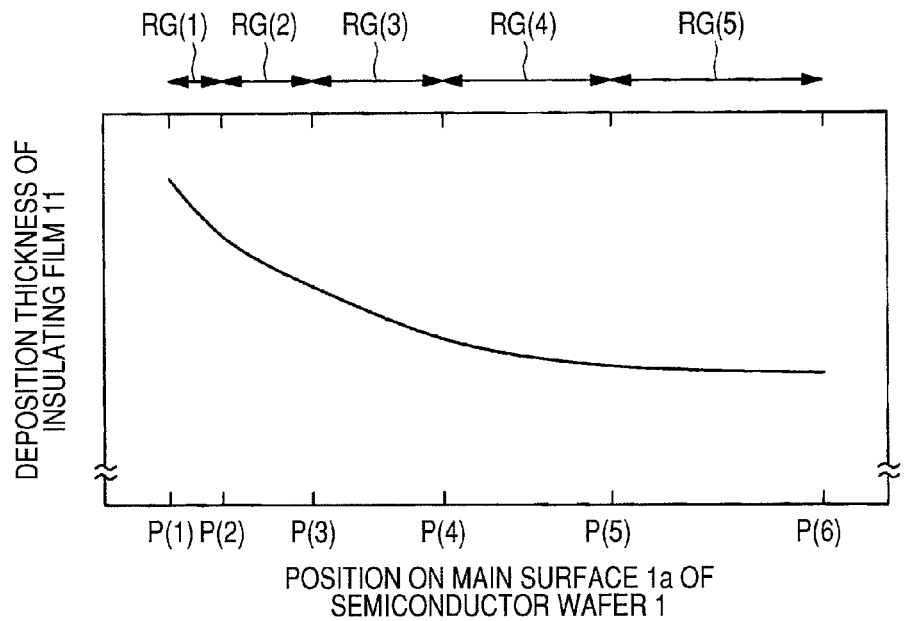
FIG. 18 is a graph showing the deposition thickness distribution of an insulating film when it is deposited on the main surface of a semiconductor wafer.
Figure 19:
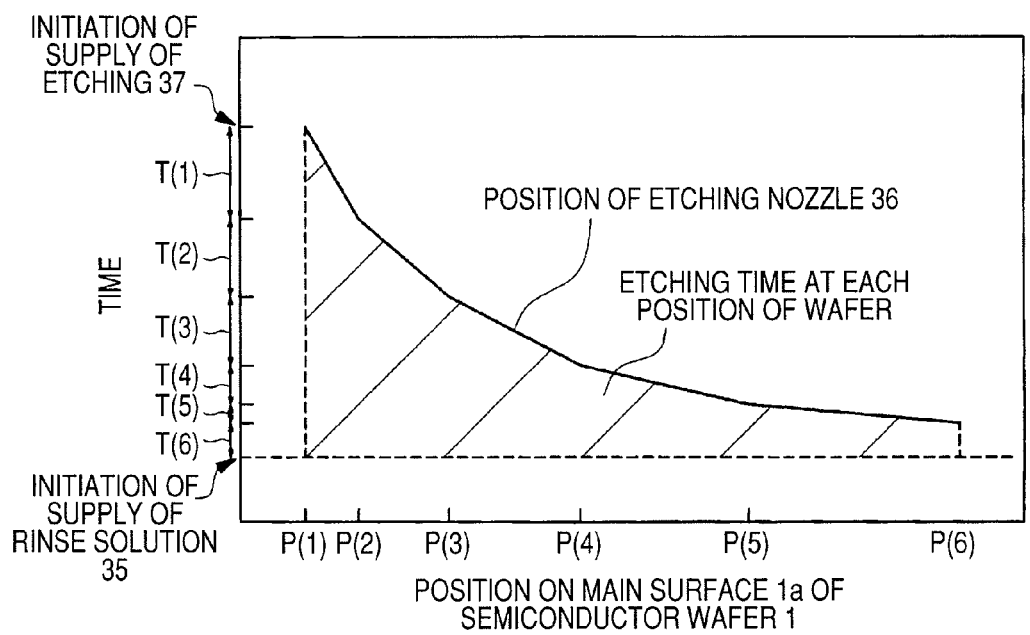
FIG. 19 is a graph showing the position of an etchant nozzle.
Figure 20:
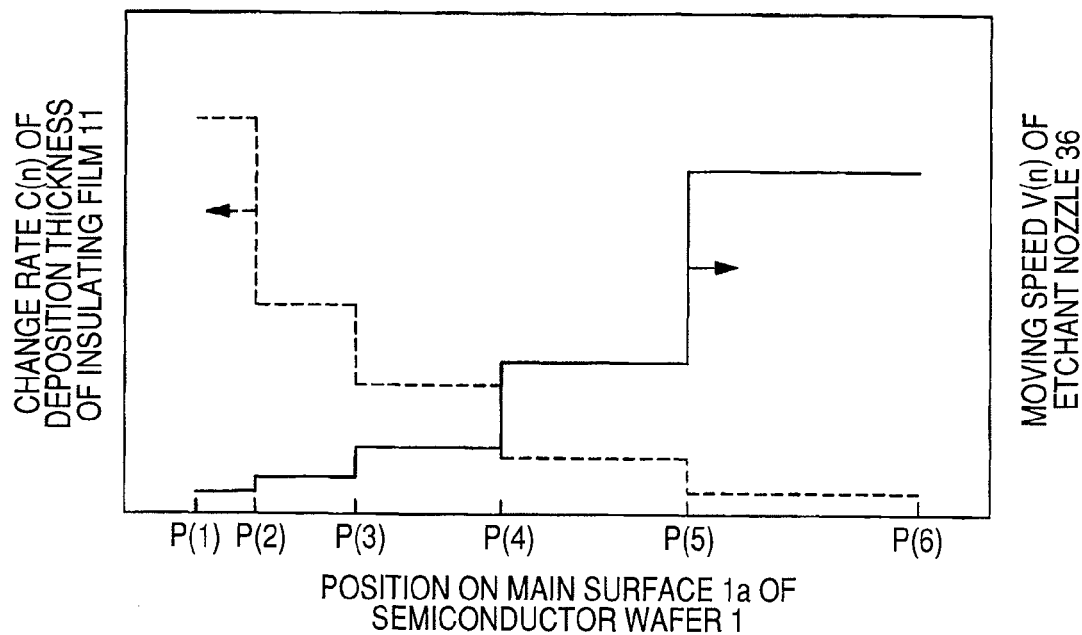
FIG. 20 is a graph showing a change rate of the deposition thickness of an insulating film in a radial direction of the main surface of a semiconductor wafer and a moving speed of an etchant nozzle.
Figure 21:
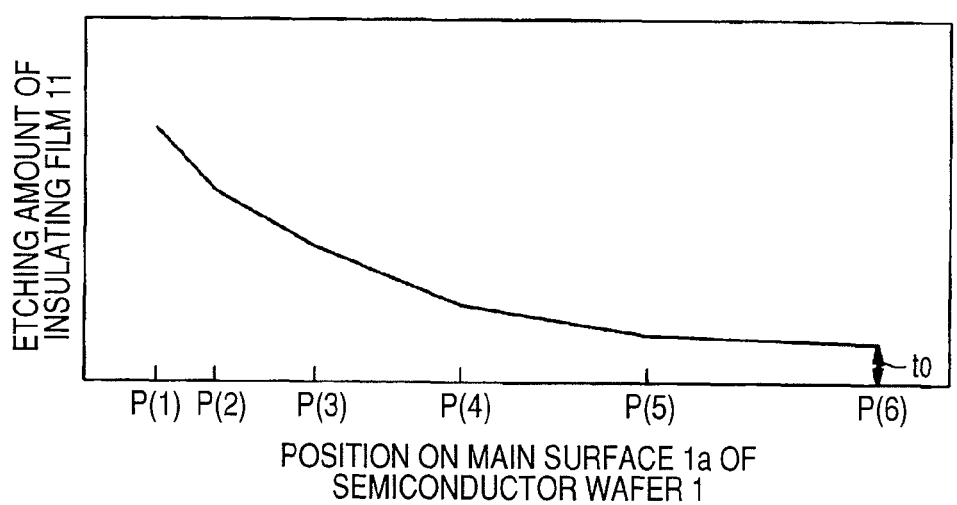
FIG. 21 is a graph showing an etching amount of an insulating film in the treatment for equalizing the thickness distribution of an insulating film deposited on the main surface of a semiconductor wafer.
Figures 22, 23:
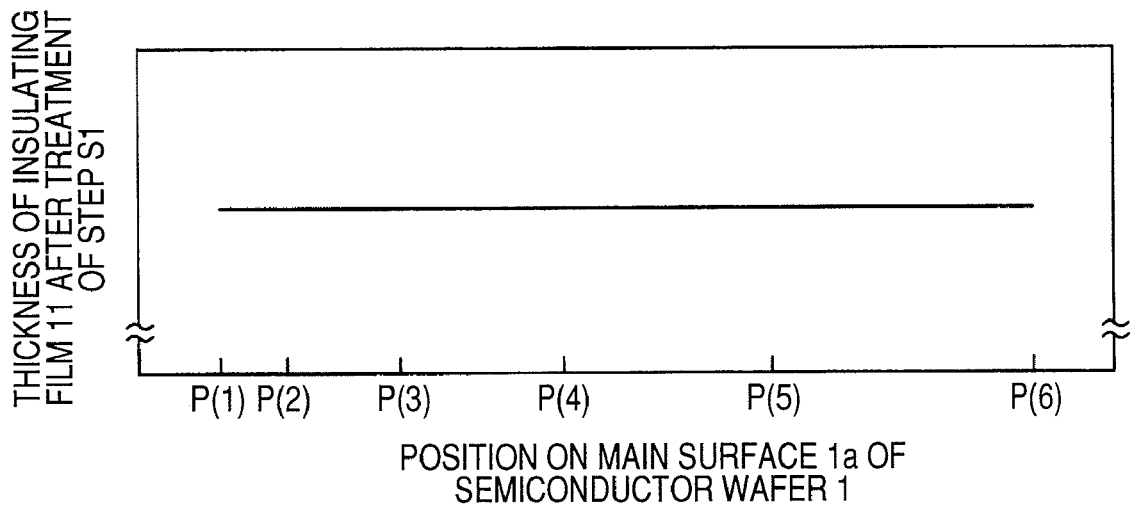
FIG. 22 is a graph showing the thickness distribution of an insulating film which has been deposited on the main surface of a semiconductor wafer and subjected to the treatment for equalizing the film thickness distribution.
FIG. 23 is a schematic view showing the equation representing an etching time of an insulating film.

FIG. 17 is a schematic (plan) view illustrating the control of the moving speed of the etchant nozzle 36 which moves above the semiconductor wafer 1. FIG. 18 is a graph showing the thickness (deposition thickness) distribution of the insulating film 11 at the time of deposition of the insulating film 11 (before the treatment of Step S1) on the main surface 1a of the semiconductor wafer 1. FIG. 19 is a graph showing the position of the etchant nozzle 36 in Step 1. FIG. 20 is a graph showing a change rate of the deposition thickness of the insulating film 11 in a radial direction of the main surface 1a of the semiconductor wafer 1 and the moving speed of the etchant nozzle 36 in Step S1. FIG. 21 is a graph showing the etching amount of the insulating film 11 in Step S1. FIG. 22 is a graph showing the thickness distribution of the insulating film 11 after Step S1. The ordinate and abscissa in each graph of FIGS. 18 to 22 are in an arbitrary unit.

In this Embodiment, the moving speed of the etchant nozzle 36 is controlled (adjusted), depending on the change rate (corresponding to C(n) which will be described later) of the deposition thickness of the insulating film 11 in a radial direction of the main surface 1a of the semiconductor wafer 1. Described specifically, in a region where a change rate (corresponding to C(n) which will be described later) of the deposition thickness of the insulating film 11 in a radial direction of the main surface 1a of the semiconductor wafer 1 is large, the moving speed of the etchant nozzle 36 is reduced, while in a region where a change rate (corresponding to C(n) which will be described later) of the deposition thickness of the insulating film 11 in a radial direction of the main surface 1a of the semiconductor wafer 1 is small, the moving speed of the etchant nozzle 36 is raised.

Described specifically, for example as illustrated in FIG. 17, six positions from P(1) to P(6) are arranged successively in a radial direction of the main surface 1a of the semiconductor wafer 1 from the position (P1) at the periphery of the main surface 1a of the semiconductor wafer 1 to the position P(6) at the center thereof and the main surface 1a of the semiconductor wafer 1 is divided into five sections (regions) from RG(1) to RG(5).

Position P(6) corresponds to the center of the main surface 1a of the semiconductor wafer 1, Position P(5) corresponds to the position having a distance of L(5) from the center of the main surface 1a of the semiconductor wafer 1, Position P(4) corresponds to the position having a distance of L(5)+L(4) from the center of the main surface 1a of the semiconductor wafer 1, Position P(3) corresponds to the position having a distance of L(5)+L(4)+L(3) from the center of the main surface 1a of the semiconductor wafer 1, Position (2) corresponds to the position having a distance of L(5)+L(4)+L(3)+L(2) from the center of the main surface 1a of the semiconductor wafer 1, and Position P(1) corresponds to the position having a distance of L(5)+L(4)+L(3)+L(2)+L(1) from the center of the main surface 1a of the semiconductor wafer 1, that is, corresponds to the radius of the semiconductor wafer 1. Accordingly, Section RG(5) corresponds to a region within the distance of L(5) from the center of the main surface 1a of the semiconductor wafer 1, Section RG(4) corresponds a region between the distance of L(5) and the distance of L(5)+L(4) from the center of the main surface 1a of the semiconductor wafer 1, Section RG(3) corresponds to a region between the distance of L(5)+L(4) and the distance of L(5)+L(4)+L(3) from the center of the main surface 1a of the semiconductor wafer 1, Section RG(2) corresponds to a region between the distance of L(5)+L(4)+(3) and the distance of L(5)+L(4)+L(3)+(2) from the center of the main surface 1a of the semiconductor wafer 1, and Section RG(1) corresponds to a region of the distance L(5)+L(4)+(3)+(2) or greater from the center of the main surface 1a of the semiconductor wafer 1. Plotted along the abscissa of the graph of FIGS. 18 to 22 is a position on the main surface 1a of the semiconductor wafer 1 but it also corresponds to the distance from the center of the main surface 1a of the semiconductor wafer 1. This will also apply to the graphs shown in Embodiments on and after Embodiment 2 which will be described later.

The distribution of the deposition thickness of the insulating film 11 on the main surface 1a of the semiconductor wafer 1 is illustrated in FIG. 18. It is assumed that the deposition thicknesses of the insulating film 11 at positions P(1) to (6) are t(1) to t(6), respectively and the etching rate (etching speed) of the insulating film 11 by the etchant 37 is Er (Er corresponds to the thickness of the insulating film 11 to be etched per hour when the insulating film 11 is exposed to the etchant 37).

The distribution (t(1) to t(6)) of the deposition thickness of the insulating film 11 can be determined directly by measuring it with a film thickness analyzer. Alternatively, it is also possible to indirectly determine it by studying the tendency of the deposition thickness distribution (t(1) to t(6)) of the insulating film 11 on the main surface 1a of the semiconductor wafer 1 when the formation of the insulating film 11 is repeated by the same film forming apparatus and using these data on the tendency of the deposition thickness distribution. This will equally apply to Embodiments 2 to 4.

In Step 1 of Embodiment 1 and Steps S1a and S1b of Embodiments 2 and 3 which will be described later, an etching amount (thickness) of the insulating film 11 is equal at the positions (regions) which have the same distance from the center of the main surface 1a of the semiconductor wafer 1. Step 1 of Embodiment 1 and Steps S1a and S1b of Embodiments 2 and 3 which will be described later are therefore preferred when applied to the case where the deposition thicknesses of the insulating film 11 are almost the same at positions which are equal in the distance from the center of the main surface 1a of the semiconductor wafer 1 (meaning that the deposition thicknesses of the insulating film 11 are almost the same in a circumferential direction of the main surface 1a of the semiconductor wafer 1) and the deposition thicknesses of the insulating film 11 vary in a radial direction of the main surface 1a of the semiconductor wafer 1.

In Step 1, the position of the etchant nozzle 36 is controlled so that it exists at the position as illustrated in FIG. 19 with the passage of time. The ordinate of the graph of FIG. 19 corresponds to time and time passes in the downward direction of the ordinate.

Described specifically, assuming that time required for the etchant nozzle 36 to pass through a section RG(n), that is, time required for it to pass through a distance from a position P(n) to a position P(n+1) is T(n), the moving speed of the etchant nozzle 36 is controlled so as to satisfy the following equation (1):

$$T(n)=(t(n)-t(n+1))/Er, \text{ with the proviso that n=from 1 to 5} \quad (1)$$

Assuming that time (waiting time) until, after the arrival of the etchant nozzle 36 above the position P(6) at the center of the main surface 1a of the semiconductor wafer 1, the rinse solution 35 is supplied from the rinse solution nozzle 34 to the position P(6) at the center of the main surface 1a of the semiconductor wafer 1 is T(6), the timing of the initiation of the supply of the rinse solution 35 from the rinse solution nozzle 34 is controlled so as to satisfy the following equation (2):

$$T(6)=t0/Er \quad (2).$$

In the equation (2), t0 corresponds to an etching amount (etching thickness) of the insulating film 11 at the position P(6) at the center.

The time from the initiation of the supply of the etchant 37 from the etchant nozzle 36 to the main surface 1a of the semiconductor wafer 1 until the supply of the rinse solution 35 from the rinse solution nozzle 34 to the position P(6) at the center of the main surface 1a of the semiconductor wafer 1, that is, T(1)+T(2)+T(3)+T(4)+T(5)+T(6) is 30 seconds when a desired etching amount, for example, at the hydrofluoric acid concentration of 50% HF:H$_2$O=1:100 is about 1.5 nm in terms of a thermal oxide film and about 20 seconds when a desired etching amount, for example, at the hydrofluoric acid concentration of 50% HF:H$_2$O=1:20 is about 5 nm in terms of a thermal oxide film.

Assuming that the distance from the position P(n) to the position P(n+1) is L(n), the moving speed V(n) of the etchant nozzle 36 in the section RG(n), that is, the distance between the position P(n) to the position P(n+1) is represented by the following equation (3):

$$V(n)=L(n)/T(n) \quad (3)$$

so that the equation (1) is substituted for the equation (3) as follows:

$$V(n)=Er \times L(n)/(t(n)-t(n+1)) \quad (4).$$

Assuming that a change rate of the deposition thickness of the insulating film 11 between the position P(n) and the position P(n+1) (that is, a difference in the deposition thickness of the insulating film 11 between both ends of the section RG(n)) is C(n), the C(n) is represented by the following equation (5):

$$C(n)=(t(n)-t(n+1))/L(n) \quad (5).$$

so that the equation (4) is represented by the following equation (6):

$$V(n)=Er/C(n) \quad (6).$$

As is apparent from Equation (5), a change rate C(n) of the deposition thickness of the insulating film 11 is regarded positive when the deposition thickness t(n) of the insulating film 11 becomes smaller from the position P(n) on the peripheral side toward the position P(n+1) on the central side on the main surface 1a of the semiconductor wafer 1. This embodiment is suited when applied to the case of t(n+1)≦t(n). In this case, C(n) satisfies the following equation: C(n)≧0.

Accordingly, in this Embodiment, as is apparent from the equation (5), a change rate C(n) of the deposition thickness of the insulating film 11 in a radial direction of the main surface 1a of the semiconductor wafer 1 corresponds to an increase rate (increase amount) of the deposition thickness of the insulating film 11 per unit length in a direction from the center of the main surface 1a of the semiconductor wafer 1 toward the periphery thereof.

In this Embodiment, the moving speed of the etchant nozzle 36 between any two adjacent positions of positions P(1) to P(6) is controlled to the moving speed V(n) which satisfies the equation (6). In the graph of FIG. 20, the change rate C(n) of the deposition thickness of the insulating film 11 in a radial direction of the main surface 1a of the semiconductor wafer 1 is indicated by a dotted line, while the moving speed V(n) of the etchant nozzle 36 in Step S1 is indicated by a solid line. As is apparent from the equation (6) or FIG. 20, the moving speed V(n) of the etchant nozzle 36 is decreased in a region where the change rate C(n) of the deposition thickness of the insulating film 11 in a radial direction of the main surface 1a of the semiconductor wafer 1 is large and the moving speed V(n) of the etchant nozzle 36 is increased in a region where the change rate C(n) of the deposition thickness of the insulating film 11 in a radial direction of the main surface 1a of the semiconductor wafer 1 is small. In such a manner, the moving speed V(n) of the etchant nozzle 36 is controlled, depending on the change rate C(n) of the insulating film 11 in a radial direction of the main surface 1a of the semiconductor wafer 1. In a region where the change rate C(n) of the deposition thickness of the insulating film 11 in a radial direction of the main surface 1a of the semiconductor wafer 1 is near zero (in a region where the deposition thickness of the insulating film 11 is substantially uniform), there is a possibility of the V(n) of the equation (6) exceeding the operating range of the etching apparatus 31. In such a region, the moving speed V(n) of the etchant nozzle 36 may be raised within an operating range of the etching apparatus 31. In a region (C(n)<0) where the change rate C(n) of the deposition thickness of the insulating film 11 in a radial direction of the main surface 1a of the semiconductor wafer 1 becomes negative, if any, the moving speed V(n) of the etchant nozzle 36 may be raised within an operating range of the etching apparatus 31.

The etchant 37 is brought into contact with the position P(n) for the first time when the etchant nozzle 36 which is discharging the etchant 37 comes over the position P(n). By this contact, etching of the insulating film 11 by the etchant 37 at the position P(n) is started. After the passage of the etchant nozzle 36 over the position P(n), the etchant 37 continues to stay at the position P(n) until the supply of the rinse solution 35 from the rinse solution nozzle 34 is started, whereby the etching of the insulating film 11 at the position P(n) is continued. Even if the etchant 37 is supplied from the etchant nozzle 36 to the position a little closer to the center P(6) than to the position P(n), the etchant 37 moves in an outward (circumferential) direction by the rotation of the semiconductor wafer 1 and this etchant 37 passes on the position P(n). Accordingly, the time during which the position P(n) is in contact with the etchant 37, that is, etching time ET(n) of the insulating film 11 at the position P(n) is represented by the equation (7) as shown in FIG. 23. A region indicated by the diagonal lines in the graph of FIG. 19 corresponds to the etching time at each position on the main surface 1a of the semiconductor wafer 1.

When the equations (1) and (2) are substituted for the equation (7) of FIG. 23, the etching time ET(n) of the insulating film 11 at each position P(n) is represented by the following equation:

$$ET(n)=(t(n)-t(6)+t0)/Er.$$

The etching amount (etching thickness) EW(n) of the insulating film 11 at the position P(n) is proportional to the etching time ET(n) and etching rate Er, and becomes the product of them, that is, ET(n)×Er, so that it is represented by the following equation:

$$EW(n)=t(n)-t(6)+t0.$$

The etching amount (EW(n)) of the insulating film 11 at each position on the main surface 1a of the semiconductor wafer 1 in Step S1 is graphed in FIG. 21.

Accordingly, the thickness ta(n) of the insulating film 11 at the position P(n) after Step S1 is represented by the following equation:

$$ta(n)=t(n)-EW(n)=t(6)-t0.$$

This means that the thickness (remaining thickness) of the insulating film 11 on the main surface 1a of the semiconductor wafer 1 after the treatment of Step S1 is fixed (t(6)−t0) irrespective of the position. The thickness ta(1) to ta(6) of the insulating film 11 at each position P(1) to P(6) after Step S1 becomes uniform as is shown by the following equation:

$$ta(1)=ta(2)=ta(3)=ta(4)=ta(5)=ta(6)=t(6)-t0$$

The thickness distribution of the insulating film 11 on the main surface 1a of the semiconductor wafer 1 after Step S1 is graphed into FIG. 22.

As is apparent from the equation (6), when the change rate C(n) of the deposition thickness of the insulating film 11 on the main surface 1a of the semiconductor wafer 1 is constant, it is only necessary to adjust the moving speed (V) of the etchant nozzle 36 at a constant speed. In practice, the change rate C(n) of the deposition thickness of the insulating film 11 on the main surface 1a of the semiconductor wafer 1 is not constant and as illustrated, for example, in the graph of FIG. 18 or FIG. 20, the change rate C(n) of the deposition thickness of the insulating film 11 becomes greater (C(1)>C(5)) in the vicinity of the periphery (for example, section RG(1)) than in the vicinity of the center (for example, section RG(5)) of the main surface 1a of the semiconductor wafer 1. The moving speed V(n) of the etchant nozzle 36 is decreased in the vicinity of the periphery (for example, section RG(1)) of the main surface 1a of the semiconductor wafer 1 and the moving speed V(n) of the etchant nozzle 36 is increased in the vicinity of the center (for example, section RG(5)) of the main surface 1a of the semiconductor wafer 1 (V(1)<V(5)). The moving speed of the etchant nozzle 36 therefore differs between the peripheral side and central side of the semiconductor wafer 1.

In this Embodiment, as described above, the moving speed of the etchant nozzle 36 is controlled, depending on the change rage C(n) of the deposition thickness of the insulating film 11 in a radial direction of the main surface 1a of the semiconductor wafer 1. In a region where the change rate C(n) of the deposition thickness of the insulating film 11 is great, the moving speed V(n) of the etchant nozzle 36 is decreased, while in a region where the change rate C(n) of the deposition thickness of the insulating film 11 is small, the moving speed V(n) of the etchant nozzle 36 is increased. This makes it possible to equalize the film thickness (ta(n)) of the insulating film 11 on the main surface 1a of the semiconductor wafer 1 after Step S1.

In this Embodiment, the moving speed V(n) of the etchant nozzle 36 is controlled, not depending on the deposition thickness t(n) of the insulating film 11 but depending on the change rate C(n) of the deposition thickness of the insulating film 11 in a radial direction of the main surface 1a of the semiconductor wafer 1. This means that the moving speed V(n) of the etchant nozzle 36 is not decreased in a region where the deposition thickness t(n) of the insulating film 11 is large and the moving speed V(n) of the etchant nozzle 36 is not increased in a region where the deposition thickness t(n) of the insulating film 11 is small. In this Embodiment, whether the deposition thickness t(n) of the insulating film 11 is large or small, the moving speed V(n) of the etchant nozzle 36 is increased when the change rate C(n) of the deposition thickness of the insulating film 11 in a radial direction of the main surface 1a of the semiconductor wafer 1 is small and the moving speed V(n) of the etchant nozzle 36 is decreased when the change rate C(n) of the deposition thickness of the insulating film 11 is large.

This Embodiment can be applied to the case where in the distribution of the deposition thickness t(n) of the insulating film 11 on the main surface 1a of the semiconductor wafer 1, the deposition thickness becomes the largest at the periphery (position P(1)) of the main surface 1a of the semiconductor wafer 1 and the deposition thickness (t(n)) of the insulating film 11 becomes smaller toward the center (position P(6)) of the main surface 1a of the semiconductor wafer 1 (the case of t(n+1)≦t(n)). Such a deposition thickness distribution of the insulating film 11 tends to occur when the insulating film 11 is deposited on the semiconductor wafer 1 by using a batch type film forming apparatus (batch type CVD apparatus). This Embodiment can therefore exhibit its effects fully when applied to the insulating film 11 deposited on the semiconductor wafer 1 by using a batch type film forming apparatus (batch type CVD apparatus).

The etchant nozzle 36 is then moved from the position above the periphery of the main surface 1a of the rotating semiconductor wafer 1 to the position above the center of the main surface 1a of the semiconductor wafer 1. The length of time in contact with the etchant 37, that is, etching time is increased at the periphery of the main surface 1a of the semiconductor wafer 1 and is decreased toward the center of the main surface 1a of the semiconductor wafer 1, whereby as illustrated in FIG. 21, the etching amount (etching thickness) of the insulating film 11 can be made greater (increased) at the periphery of the main surface 1a of the semiconductor wafer 1 and can be made smaller (decreased) toward the center of the main surface 1a of the semiconductor wafer 1. This makes it possible to equalize, to some extent, the deposition thickness distribution of the insulating film 11 in which the film thickness is the greatest at the periphery of the main surface 1a of the semiconductor wafer 1 and becomes smaller toward the center of the main surface 1a of the semiconductor wafer 1.

When the deposition thickness distribution of the insulating film 11 on the main surface 1a of the semiconductor wafer 1 is not simple and the change rate of the deposition thickness of the insulating film 11 is not proportional to the distance from the center of the main surface 1a of the semiconductor wafer 1, the thickness distribution of the insulating film 11 within the main surface 1a of the semiconductor wafer 1 cannot be equalized sufficiently only by constant movement of the etchant nozzle 36 from the position above the periphery of the main surface 1a of the semiconductor wafer 1 to the position above the center of the main surface 1a of the semiconductor wafer 1 and unevenness remains in the thickness distribution of the insulating film 11 on the main surface 1a of the semiconductor wafer 1. In this Embodiment, the etchant nozzle 36 is moved not at a constant speed but at a speed controlled (changed), depending on the thickness distribution of the insulating film 11 within the main surface 1a of the semiconductor wafer 1. Described specifically, the moving speed V(n) of the etchant nozzle 36 is controlled, not depending on the deposition thickness t(n) of the insulating film 11 but depending on the change rate C(n) of the deposition thickness of the insulating film 11 in a radial direction of the main surface 1a of the semiconductor wafer 1. In other words, the moving speed V(n) of the etchant nozzle 36 is made lower in a region where the change rate C(n) of the deposition thickness of the insulating film 11 in a radial direction of the main surface 1a of the semiconductor wafer 1 is large than that in a region where the change rate C(n) of the deposition thickness of the insulating film 11 is small. As illustrated in FIG. 18, in the distribution of the deposition thickness of the insulating film 11 on the main surface 1a of the semiconductor wafer 1, the change rate C(n) of the deposition thickness of the insulating film 11 in the vicinity of the center of the semiconductor wafer 1 tends to be small and the change rate C(n) of the deposition thickness of the insulating film 11 in the vicinity of the periphery of the semiconductor wafer 1 tends to be large. In this case, as illustrated in FIG. 20, the moving speed of the etchant nozzle 36 differs between the peripheral side and central side of the main surface 1a of the semiconductor wafer 1. This makes it possible to sufficiently equalize the thickness distribution of the insulating film 11 within the main surface 1a of the semiconductor wafer 1 and the unevenness of the thickness distribution of the insulating film 11 on the main surface 1a of the semiconductor wafer 1 can be eliminated fully even if the deposition thickness distribution of the insulating film 11 on the main surface 1a of the semiconductor wafer 1 is not simple and the change rate of the deposition thickness of the insulating film 11 is not proportional to the distance from the center of the main surface 1a of the semiconductor wafer 1.

Figure 24:
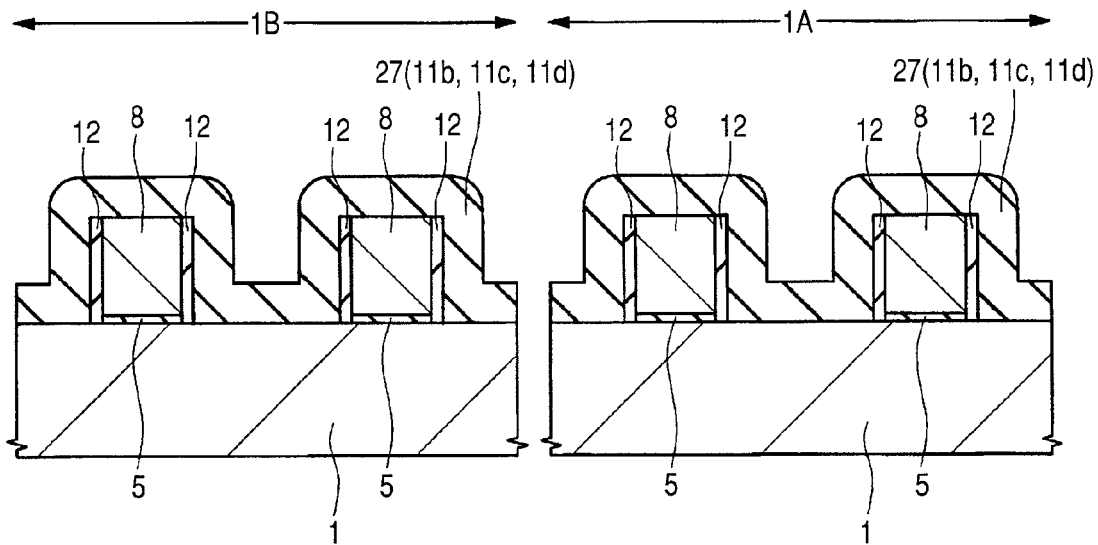
FIG. 24 is a fragmentary cross-sectional view of a semiconductor device according to the one embodiment of the present invention during a fabrication step thereof.
Figure 25:
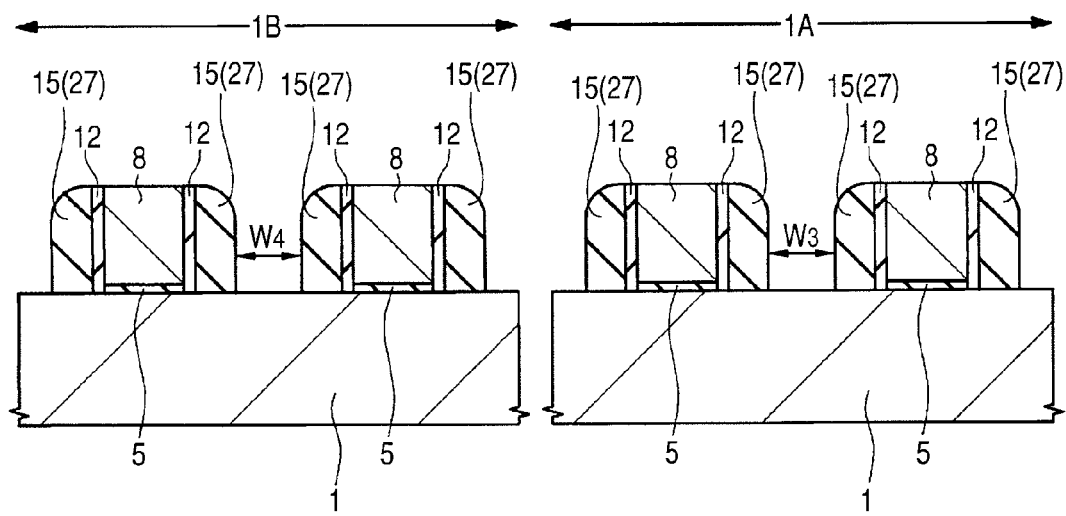
FIG. 25 is a fragmentary cross-sectional view of a semiconductor device during a fabrication step following that of FIG. 24.
Figure 26:
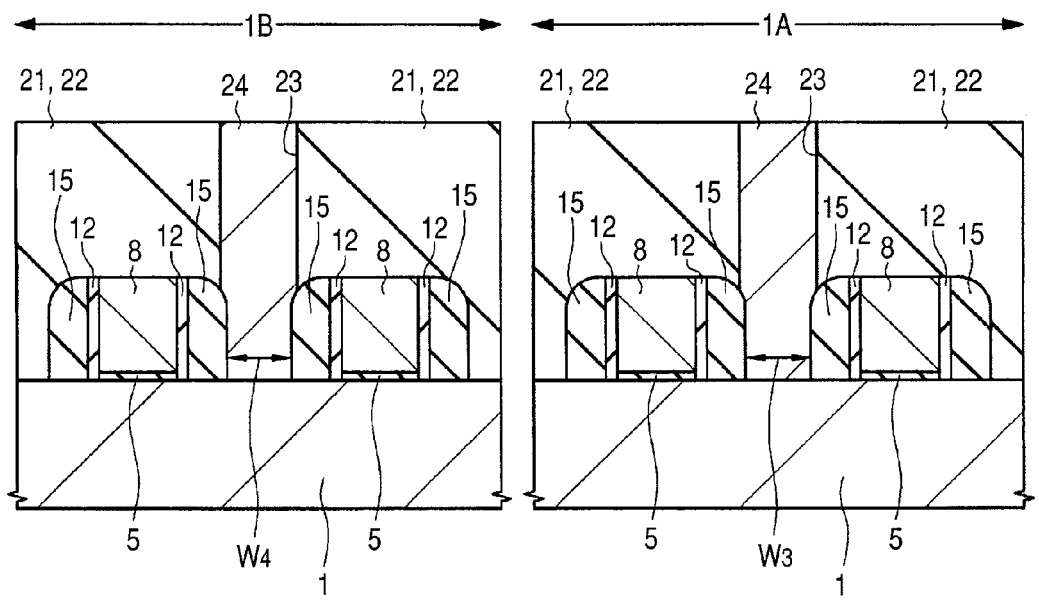
FIG. 26 is a fragmentary cross-sectional view of a semiconductor device during a fabrication step following that of FIG. 25.

FIGS. 24 to 26 are fragmentary cross-sectional views of the semiconductor device of this Embodiment during its fabrication steps and they substantially correspond to the steps of FIG. 7, FIG. 8 and FIG. 12, respectively. FIGS. 24 to 26 correspond to FIGS. 13 to 15 of First Comparative Example, respectively, but different from FIGS. 13 to 15 of First Comparative Example, treatment of Step S1 is performed in this Embodiment (FIGS. 24 to 26). The insulating film 27 illustrated in FIG. 24 is an insulating film for forming sidewall insulating films (sidewall spacers 15) and corresponds to the film stack of the insulating films 11b, 11c and 11d. In FIGS. 24 to 26, similar to FIGS. 13 to 15, fragmentary cross-sectional views of a region 1A in which the deposition thickness of the insulating film 27 (11) is large and a region 1B in which the deposition thickness of the insulating film 27(11) is small are illustrated. In FIGS. 24 to 26, p well 3, n⁻ semiconductor regions 13 and n⁺ semiconductor regions 16 are included in the illustration of the semiconductor wafer 1.

In this Embodiment, even if the thickness distribution of the insulating film 11 (11a, 11b, 11c and 11d) when it is deposited on the main surface 1a of the semiconductor wafer 1 is uneven, treatment of Step S1 enables sufficient equalization of the thickness distribution of the insulating film 11 within the main surface 1a of the semiconductor wafer 1 so that occurrence of such an inconvenience as described with reference to FIGS. 13 to 15 can be avoided.

Described specifically, even if the deposition thickness distribution of the insulating film 11 (11a, 11b, 11c and 11d) becomes uneven when the insulating film 11 are deposited, and there exists the region 1A in which the deposition thickness of the insulating film 11 is large and the region 1B in which it is small, the thickness distribution of the insulating film 11 within the main surface 1a of the semiconductor wafer 1 can be made uniform by carrying out Step S1 after the deposition of the insulating film 11. Since the insulating film 27 is made of the insulating film 11 (11b, 11c and 11d) having a uniform thickness distribution within the main surface 1a of the semiconductor wafer 1, the distribution of the insulating film 27 within the main surface 1a of the semiconductor wafer 1 becomes even and the thickness of the insulating film 27 can be made uniform (equal) between the region 1A in which the deposition thickness of the insulating film 11 is large and the region 1B in which it is small as illustrated in FIG. 24.

The thickness of the insulating film 11 becomes uniform (equal) between the region 1A in which the deposition thickness of the insulating film 11 is large and the region 1B in which it is small so that in the etchback step of the insulating film 27 for the formation of the sidewall spacers 15 as illustrated in FIG. 25, a change in the etching amount of the insulating film 27 between the region 1A in which the deposition thickness of the insulating film 11 is large and the region 1B in which it is small is not necessary, whereby appearance of the etching residue of the insulating film 27 other than the sidewall spacers 15 can be prevented. In addition, in the etchback step of the insulating film 27 for the formation of the sidewall spacers 15, a change in the etching amount of the insulating film 11 between the region 1A in which the deposition thickness of the insulating film 11 is large and the region 1B in which it is small is not necessary, so that overetching can be prevented, whereby the exposed substrate region (a region of the p well 3 in which n⁺ semiconductor regions 16 are to be formed) of the semiconductor wafer 1 is protected from damage. This leads to improvement in the reliability or performance of the semiconductor device. The production yield of the semiconductor device can also be improved.

Since the thickness of the insulating film 27 is uniform (equal) between the region 1A in which the deposition thickness of the insulating film 11 is large and the region 1B in which it is small, the thickness of the sidewalls pacers 15 is also uniform (equal) between the region 1A in which the deposition thickness of the insulating film 11 is large and the region 1B in which it is small, as illustrated in FIG. 25. As a result, the distance between the sidewall spacers 15 formed over the sidewalls of two gate electrodes 8 adjacent to each other is uniform (equal) between the region 1A in which the deposition thickness of the insulating film 11 is large and the region 1B in which it is small. Described specifically, a distance W3 between the sidewall spacers 15 formed over the sidewalls of two gate electrodes 8 adjacent to each other in the region 1A in which the deposition thickness of the insulating film 11 is large becomes uniform (equal) to a distance W4 between the sidewall spacers 15 formed over the sidewalls of two gate electrodes 8 adjacent to each other in the region 1B in which the deposition thickness of the insulating film 11 is small (W3=W4). Since the respective distances W3 and W4 between the sidewall spacers 15 formed over the sidewalls of two adjacent gate electrodes 8 in the region 1A in which the deposition thickness of the insulating film 11 is large and the region 1B in which it is small are equal (W3=W4), the areas of the n+semiconductor regions 16 (metal silicide layers 17 on the surface thereof) exposed at the bottom of contact holes 23, which are formed as illustrated in FIG. 26, become equal. This makes it possible to equalize, between the region 1A in which the deposition thickness of the insulating film 11 is large and the region 1B in which it is small, the connection resistance between the plug 24 in the contact hole 23 and n⁺ semiconductor region 16 (metal silicide layer 17 on the surface thereof). Moreover, in the region 1A in which the deposition thickness of the insulating film 11 is large and in the region 1B in which it is small, the plug 24 in the contact hole 23 can be connected reliably to the n⁺ semiconductor region 16 (metal silicide layer 17 on the surface thereof), whereby generation of connection failure can be prevented. Accordingly the semiconductor device having improved reliability and performance can be obtained. In addition, the production yield of the semiconductor device can be improved.

The problem as described in FIGS. 13 to 15 occurs not only during the formation of the sidewall spacers but also during the formation of the offset spacers 12. This problem can however be overcome by carrying out Step S1 after the deposition of the insulating film 11. The insulating film 11 to be subjected to Step S1 means insulating films 11a, 11b, 11c and 11d for the formation of the sidewall insulating films (offset spacers 12 or sidewall spacers 15) over the sidewalls of the gate electrode 8. Step S1 after the deposition of at least one of the insulating films 11a, 11b, 11c and 11d is effective for making the film thickness distribution more uniform compared with the case where any of these films is not subjected to Step S1. It is most preferred to carry out Step S1 whenever the insulating films 11a, 11b, 11c and 11d are deposited, because the thickness distribution of the insulating films for the formation of sidewall insulating films can be made most uniform. When not all of these insulating films 11a, 11b, 11c and 11d are subjected to Step S1 after their deposition, it is preferred to carry out Step S1 after deposition of a film which is highly uneven in the thickness distribution. When the sidewall spacers 15 are each made of not a film stack but a single film, Step S1 is performed after the deposition of the single film. This will equally apply to Embodiments on and after Embodiment 2.

The problem as described using FIGS. 13 to 15 tends to occur when even small unevenness in the thickness distribution of the insulating film 11 cannot be neglected and unevenness in the deposition film thickness still remains even if a fluctuation (difference between the maximum and minimum deposition thickness of the insulating film 11 within the main surface 1a of the semiconductor wafer 1) in the distribution of the deposition thickness of the insulating film 11 within the main surface 1a of the semiconductor wafer 1 is not so large. In order to lessen the problems which have been described using FIGS. 13 to 15, not simple movement of the etchant nozzle 36 but control of the moving speed of the etchant nozzle 36, depending on the thickness distribution of the insulating film 11 on the main surface 1a of the semiconductor wafer 1 as in this Embodiment is preferred. By this, it is possible to heighten the evenness of the thickness distribution of the insulating film 11 after the treatment of Step S1 and reliably prevent the occurrence of the problems described in FIGS. 13 to 15 even if the deposition thickness of the insulating film 11 has a complex distribution on the main surface 1a of the semiconductor wafer 1.

In this Embodiment, Step S1 is performed by setting six positions P(1) to P(6) from the periphery to the center of the main surface 1a of the semiconductor wafer 1, dividing the main surface 1a of the semiconductor wafer 1 to five sections RG(1) to RG(5) according to these positions and controlling the moving speed of the etchant nozzle 36 in each of these sections RG(1) to RG(5). The number of the sections of the semiconductor wafer 1 of the semiconductor wafer 1 for controlling the moving speed of the etchant nozzle 36 is not limited to this (five). This will also apply to Embodiments on and after Embodiment 2. It is effective to divide the main surface 1a of the semiconductor wafer 1 into at least two sections from the periphery to the center and control the moving speed of the etchant nozzle 36 in each of these sections. When the number of sections RG(n) on the main surface 1a of the semiconductor wafer 1 from the periphery to the center is small, however, the insulating film 11 on the main surface 1a of the semiconductor wafer 1 may be less uniform after Step S1. When the deposition thickness distribution of the insulating film 11 is complex, it is therefore preferred to divide the main surface 1a of the semiconductor wafer 1 from the periphery to the center into many sections (for example, at least five sections as in this Embodiment) and control the moving speed of the etchant nozzle 36 in each section. This makes it possible to bring about higher effects for improving the evenness of the thickness of the insulating film 11 after the treatment of S1 step.

Embodiment 2

Fabrication steps of a semiconductor device according to this Embodiment will next be described based on accompanying drawings.

The fabrication process of a semiconductor device according to this Embodiment is similar to that of Embodiment 1 except that Step S1a which will be described below is employed instead of Step S1. The description in this Embodiment is therefore limited only to Step S1a.

In this Embodiment, as described above, treatment (which will hereinafter be called Step S1a) for correcting (equalizing) the thickness distribution of the insulating film 11 is performed after deposition of the insulating film 11 on the main surface of the semiconductor wafer 1.

Figure 27:
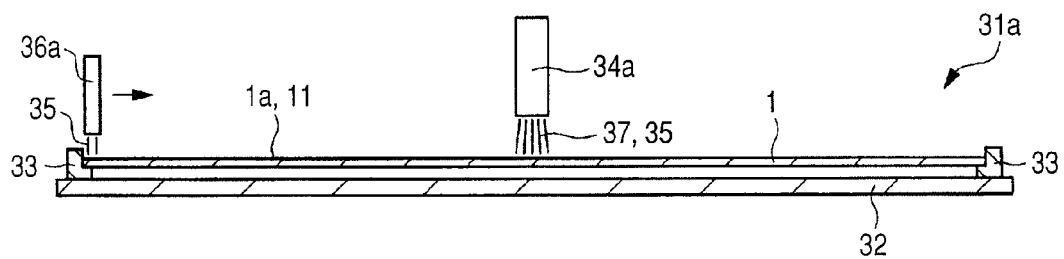
FIG. 27 is a schematic view illustrating the treatment for equalizing the thickness distribution of an insulating film deposited on the main surface of a semiconductor wafer.

FIG. 27 is a schematic view (cross-sectional view) of Step S1a (treatment for correcting the thickness distribution of the insulating film 11 deposited on the main surface of the semiconductor wafer 1) to be performed in Embodiment 2. This diagram corresponds to FIG. 16 of Embodiment 1.

In this Embodiment, as illustrated in FIG. 27, the treatment of Step S1a for correcting (equalizing the thickness distribution of the insulating film 11 is performed by wet etching a portion of the insulating film 11 by using a single-wafer wet etching apparatus 31a.

As illustrated in FIG. 27, the wet etching apparatus 31a employed in this Embodiment is equipped with a spin stage 32 and a wafer chuck 33. The constitution and function of each of the spin stage 32 and wafer chuck 33 are similar to those of the wet etching apparatus 31 of Embodiment 1 so that the description on them is omitted.

Above the spin stage 32 which means above the center of the main surface 1a of the semiconductor wafer 1 fixed to the spin stage 32 by the wafer chuck 33, a nozzle (etchant and rinse solution supply means) 34a for both an etchant and a rinse solution is disposed. From the nozzle 34a, an etchant 37 or a rinse solution 35 is discharged (jetted) toward the main surface 1a of the semiconductor wafer 1 and thus the etchant 37 or rinse solution 35 can be fed to the main surface 1a of the semiconductor wafer 1. As the etchant 37, an etchant similar to that employed in Embodiment 1 and capable of etching the insulating film 11 formed on the main surface 1a of the semiconductor wafer 1, for example, an aqueous solution of hydrofluoric acid (HF) can be used. The temperature of the etchant 37 discharged from the nozzle 34a may be, when it is hydrofluoric acid, about 24° C. as usual. The flow rate of the etchant 37 discharged from the nozzle 34a is about 2 L/min at which the etchant can be spread all over the wafer promptly. As the rinse solution 35 to be fed from the nozzle 34a is, for example, pure water. The initiation, termination or switchover of the supply of the etchant 37 or rinse solution 35 from the nozzle 34a can be switched (or the supply (discharge) amount can be adjusted) by a valve (not illustrated) or the like. The nozzle 34a and the rinse solution nozzle 34 in Embodiment 1 are located at the same position. In Embodiment 1, the rinse solution 35 is supplied from the rinse solution nozzle 34, while in Embodiment 2, the selected one of the etchant 37 and the rinse solution 35 can be supplied from the nozzle 34a.

Above the spin stage 32, a rinse solution nozzle (rinse solution supply means) 36a is disposed. From the rinse solution nozzle 36a, the rinse solution (washing solution, rinsing solution) 35 is discharged (jetted, supplied) toward the main surface 1a of the semiconductor wafer 1, whereby the rinse solution 35 can be supplied to the main surface 1a of the semiconductor wafer 1. As the rinse solution 35 to be discharged from the rinse solution nozzle 36a, pure water or the like can be employed. The flow rate of the rinse solution 35 to be discharged from the rinse solution nozzle 36a and supplied onto the main surface 1a of the semiconductor wafer 1 can be adjusted to, for example, about 0.2 L/min as a flow rate capable of inhibiting splash of water from the wafer chuck 33. In addition, the apparatus is equipped with a valve (not illustrated) so as to switch between initiation or termination of the supply of the rinse solution 35 from the rinse solution nozzle 36a (so as to adjust the supply (discharge) amount of the rinse solution 35).

The nozzle 34a, rinse solution nozzle 36a, and pipes (not illustrated) for supplying the etchant 36 and the rinse solution 35 are not fixed to the spin stage 32 so as to prevent rotation of the nozzle 34 and rinse solution nozzle 36a which will otherwise occur by the rotation of the spin stage 32.

The rinse solution nozzle 36a is movable, above the spin stage 32, in a horizontal direction (a direction parallel to the spin stage 32 and the main surface 1a of the semiconductor wafer 1 held thereon) from the position above the periphery of the main surface 1a of the semiconductor wafer 1 to the position above the center of the main surface 1a of the semiconductor wafer 1. The moving speed of the rinse solution nozzle 36a can be controlled to a desired speed. Described specifically, the rinse solution nozzle 36a is movable similar to the etchant nozzle 36 of Embodiment 1. Although the etchant 37 is supplied from the etchant nozzle 36 in Embodiment 1, the rinse solution 35 is supplied from the rinse solution nozzle 36a in this Embodiment.

The concrete procedures of Step S1a will next be described.

As illustrated in FIG. 27, the semiconductor wafer 1 having the insulating film 11 deposited on the main surface 1a thereof is placed and supported on the spin stage 32 of the etching apparatus 31a by the wafer chuck 33. By the rotation of the spin stage 32, the semiconductor wafer 1 supported on the spin stage 32 is turned. The semiconductor wafer 1 can rotate with the center position of the main surface 1a as a rotation center by coinciding the rotation center of the spin stage 32 with the center position of the main surface 1a of the semiconductor wafer 1. The rotation speed of the semiconductor wafer 1 can be adjusted to, for example, 200 rpm (200 revolutions per minute).

The etchant 37 for etching the insulating film 11 is fed from the nozzle 34a to the main surface 1a of the semiconductor wafer 1 while rotating the semiconductor wafer 1. Then, the rinse solution 35 for terminating the etching of the insulating film 11 is supplied from the rinse solution nozzle 36a to the main surface 1a of the semiconductor wafer 1, while moving thereabove the rinse solution nozzle 36a from the peripheral side to the central side of the main surface 1a of the semiconductor wafer 1.

Described specifically, the etchant 37 is supplied from the nozzle 34a existing above the center of the main surface 1a of the semiconductor wafer 1 to the center of the main surface 1a of the semiconductor wafer 1 while rotating the semiconductor wafer 1. The semiconductor wafer 1 is rotating so that the etchant 37 fed from the nozzle 34a to the center of the main surface 1a of the semiconductor wafer 1 flows from the center to the peripheral side on the main surface 1a of the semiconductor wafer 1, whereby the etchant 37 spreads all over the main surface 1a of the semiconductor wafer 1. The etching of the insulating film 11 by the etchant 37 is thus started all over the main surface 1a of the semiconductor wafer 1.

After the etchant 37 is supplied from the nozzle 34a to the center of the main surface 1a of the rotating semiconductor wafer 1 for a predetermined time, the supply of the etchant 37 to the main surface 1a of the semiconductor wafer 1 from the nozzle 34a is terminated. Then, the discharge of the rinse solution 35 from the rinse solution nozzle 36a is started while rotating the semiconductor wafer 1 and the rinse solution nozzle 36a which is discharging the rinse solution 35 is moved in a horizontal direction (a direction parallel to the spin stage 32 and the main surface 1a of the semiconductor wafer 1 which is supported thereon) from the position above the periphery of the main surface 1a of the rotating semiconductor wafer 1 to the position above the center of the main surface 1a of the semiconductor wafer 1. By this movement, the rinse solution 35 is supplied from the rinse solution nozzle 36a to the main surface 1a of the semiconductor wafer 1 and by the rinse solution 35 supplied to the main surface 1a of the semiconductor wafer 1, rinse treatment (rinsing treatment) on the main surface 1a of the semiconductor wafer 1 is performed and the etchant 37 is removed, together with the rinse solution 35, from the main surface 1a of the semiconductor wafer 1, whereby the etching of the insulating film 11 on the main surface 1a of the semiconductor wafer 1 is terminated. The position, on the main surface 1a of the semiconductor wafer 1, to which the rinse solution 35 is supplied moves from the periphery of the main surface 1a of the semiconductor wafer 1 to the center of the main surface 1a of the semiconductor wafer 1 by the movement of the rinse solution nozzle 36a while supplying the rinse solution 35 to the main surface 1a of the semiconductor wafer 1.

After the rinse solution nozzle 36a reaches the position above the center of the main surface 1a of the rotating semiconductor wafer 1 and the position of the main surface 1a of the semiconductor wafer 1 to which the rinse solution 35 is supplied from the rinse solution nozzle 36a moves from the periphery of the main surface 1a of the semiconductor wafer 1 to the central portion of the main surface 1a of the semiconductor wafer 1, the supply of the rinse solution 35 to the main surface 1a of the semiconductor wafer 1 from the rinse solution nozzle 36a is terminated. Then, the rinse solution 35 is supplied from the nozzle 34a existing above the center of the main surface 1a of the semiconductor wafer 1 to the center of the main surface 1a of the rotating semiconductor wafer 1.

At the time of supplying the rinse solution 35 from the nozzle 34a to the main surface 1a of the semiconductor wafer 1, the rinse solution nozzle 36a located above the center of the main surface 1a of the rotating semiconductor wafer 1 may disturb it. It is therefore preferred to promptly move the rinse solution nozzle 36a from the position above the center of the main surface 1a of the rotating semiconductor wafer 1 to the peripheral side after the termination of the supply of the rinse solution 35 from the rinse solution nozzle 36a, and then start the supply of the rinse solution 35 from the nozzle 34a to the main surface 1a of the semiconductor wafer 1.

After the rinse treatment, the discharge of the rinse solution 35 from the nozzle 34a is stopped, whereby the supply of the rinse solution 35 to the main surface 1a of the semiconductor wafer 1 is completed. By increasing the rotation speed of the spin stage 32 and thereby increasing the rotation speed of the semiconductor wafer 1, the semiconductor wafer 1 is rotated at high speed. By making use of the centrifugal force caused by the high-speed rotation, the liquid or water (rinse solution) remaining on the main surface 1a of the semiconductor wafer 1 is dashed off, whereby the semiconductor wafer 1 is dried. After the semiconductor wafer 1 is dried by high speed rotation for a predetermined time, the rotation of the semiconductor wafer 1 is terminated (the rotation of the spin stage 32 is terminated).

The semiconductor wafer 1 thus treated is then sent to the subsequent step (step of forming sidewall spacers 15 by the etchback of the insulating film 11) or housed in a storage case prior to the subsequent step.

As described above, the etchant 37 is spread all over the main surface 1a of the semiconductor wafer 1 by supplying the etchant 37 to the center of the main surface 1a of the semiconductor wafer 1 from the nozzle 34a existing above the central portion of the main surface 1a of the semiconductor wafer 1 while rotating the semiconductor wafer 1. By this etchant 37, etching of the insulating film 11 formed on the main surface 1a of the semiconductor wafer 1 can be started. Since the semiconductor wafer 1 is rotating, the etchant 37 fed to the center of the main surface 1a of the semiconductor wafer 1 promptly spreads all over the main surface 1a of the semiconductor wafer 1 so that etching of the insulating film 11 by the etchant 37 is started at each position on the main surface 1a of the semiconductor wafer 1 almost simultaneously.

When the semiconductor wafer 1 rotates at an excessively high speed, the etchant 37 is dashed off and removed from the main surface 1a of the semiconductor wafer 1 owing to the centrifugal force caused by high-speed rotation. The rotation speed of the semiconductor wafer 1 is controlled so that the etchant 37 is not removed completely from the main surface 1a of the semiconductor wafer 1 and a predetermined amount of the etchant 37 remains all over the main surface 1a of the semiconductor wafer 1. For example, the rotation speed of the semiconductor wafer 1 is adjusted to about 200 rpm. At this speed, even after the supply of the etchant 37 from the nozzle 34a to the main surface 1a of the semiconductor wafer 1 is terminated, the etching of the insulating film 11 formed on the main surface 1a of the semiconductor wafer 1 is continued by the etchant 37 remaining on the main surface 1a of the semiconductor wafer 1.

After the termination of the supply of the etchant 37 from the nozzle 34a to the main surface 1a of the semiconductor wafer 1, the rinse solution nozzle 36a is moved horizontally from the position above the periphery of the main surface 1a of the rotating semiconductor wafer 1 to the position above the center of the main surface 1a of the semiconductor wafer 1 while rotating the semiconductor wafer 1 and discharging the rinse solution 35 from the rinse solution nozzle 36a. Since the semiconductor wafer 1 is rotating, the rinse solution 35 fed from the rinse solution nozzle 36a to the main surface 1a of the semiconductor wafer 1 flows toward the peripheral side on the main surface 1a of the semiconductor wafer 1. On the main surface 1a of the semiconductor wafer 1, the rinse solution 35 therefore spreads (is present) outside of (peripheral side from) the position to which the rinse solution 35 is fed from the rinse solution nozzle 36a and by this rinse solution 35, rinse treatment (rinsing treatment) is performed, whereby the etchant 37 is removed together with the rinse solution 35 and etching (wet etching) of the insulating film 11 is terminated.

At each position on the main surface 1a of the semiconductor wafer 1, etching of the insulating film 11 is started almost simultaneously by the etchant 37 fed from the nozzle 34a. Since the rinse solution nozzle 36a which is discharging the rinse solution 35 moves horizontally from the position above the periphery of the main surface 1a of the semiconductor wafer 1 to the position above the center of the main surface 1a of the semiconductor wafer 1, the starting time of the rinse treatment by the rinse solution 35 differs, depending on the position on the main surface 1a of the semiconductor wafer 1. At each position on the main surface 1a of the semiconductor wafer 1, etching of the insulating film 11 continues from the contact (wetting) with the etchant 37 fed from the nozzle 34a to the contact (wetting) with the rinse solution 35 fed from the rinse solution nozzle 36a. This makes it possible to simplify the operation of Step S1a and reduce the time necessary for Step S1a because it is only necessary to move the rinse solution nozzle 36a once from the peripheral side to the central side on the main surface 1a of the semiconductor wafer 1.

The etching time at each position on the main surface of the semiconductor wafer 1 in Step S1a corresponds to the time from the starting of the supply of the etchant 37 from the nozzle 34a to the passage of the rinse solution nozzle 36a above each position. In this Embodiment, by controlling the moving speed of the rinse solution nozzle 36a in accordance with the deposition thickness distribution of the insulating film 11 on the main surface 1a of the semiconductor wafer 1 and thereby making the etching time at each position on the main surface 1a of the semiconductor wafer 1 correspond to the amount of the insulating film 11 to be etched at each position on the main surface 1a for equalizing the thickness distribution of the insulating film 11, the thickness distribution of the insulating film 11 on the main surface 1a of the semiconductor wafer 1 can be made uniform at any position.

In this Embodiment, on the central side of the main surface 1a of the semiconductor wafer 1, time until the supply of the rinse solution 35 is started becomes longer than that on the peripheral side of the main surface 1a of the semiconductor wafer 1 so that the time (that is, etching time) during which etching by the etchant 37 is continued becomes longer. The etching amount of the insulating film 11 by the etchant 37 therefore becomes greater on the central side of the main surface 1a of the semiconductor wafer 1 compared with that on the peripheral side of the main surface 1a of the semiconductor wafer 1. Step S1a of Embodiment 2 can therefore be applied to the case where the deposition thickness of the insulating film 11 is thicker on the central side of the main surface 1a of the semiconductor wafer 1 than on the peripheral side of the main surface 1a of the semiconductor wafer 1. Treatment of Step S1a therefore enables uniform thickness distribution of the insulating film 11 within the main surface 1a of the semiconductor wafer 1. In this case, the vicinity at the periphery of the main surface 1a of the semiconductor wafer 1 corresponds to the region 1B in which the deposition thickness of the insulating film 11 is small, while the vicinity at the center of the main surface 1a of the semiconductor wafer 1 corresponds to the region 1A in which the deposition thickness of the insulating film 11 is large.

When the deposition thickness distribution of the insulating film 11 on the main surface 1a of the semiconductor wafer 1 is simple and a change in the deposition thickness of the insulating film 11 is proportional to the distance from the periphery of the main surface 1a of the semiconductor wafer 1, it is only necessary to move the rinse solution nozzle 36a at a constant speed from the position above the periphery of the main surface 1a of the rotating semiconductor wafer 1 to the position above the center of the main surface 1a of the semiconductor wafer 1. By this movement, the etching time of the insulating film 11 at each position on the main surface 1a of the semiconductor wafer 1 can be made proportional to the distance from the periphery of the main surface 1a of the semiconductor wafer 1, whereby the etching amount of the insulating film 11 at each position on the main surface 1a of the semiconductor wafer 1 can be made proportional to the distance from the periphery of the main surface 1a of the semiconductor wafer 1.

When the deposition thickness distribution of the insulating film 11 on the main surface 1a of the semiconductor wafer 1 is not simple and a change in the deposition thickness of the insulating film 11 is not proportional to the distance from the periphery of the main surface 1a of the semiconductor wafer 1, the thickness distribution of the insulating film 11 within the main surface 1a of the semiconductor wafer 1 cannot be made uniform sufficiently only by the movement of the rinse solution nozzle 36a at a constant speed from the position above the periphery of the main surface 1a of the rotating semiconductor wafer 1 to the position above the center of the main surface 1a of the semiconductor wafer 1.

In this Embodiment, therefore, the rinse solution nozzle 36 is moved from the position above the periphery of the main surface 1a of the rotating semiconductor wafer 1 to the position above the center of the main surface 1a of the semiconductor wafer 1 not at a constant speed but at a speed controlled (changed), depending on the thickness distribution of the insulating film 11 within the main surface 1a of the semiconductor wafer 1.

The control of the moving speed of the rinse solution nozzle 36a will next be described more specifically.

Figure 28:
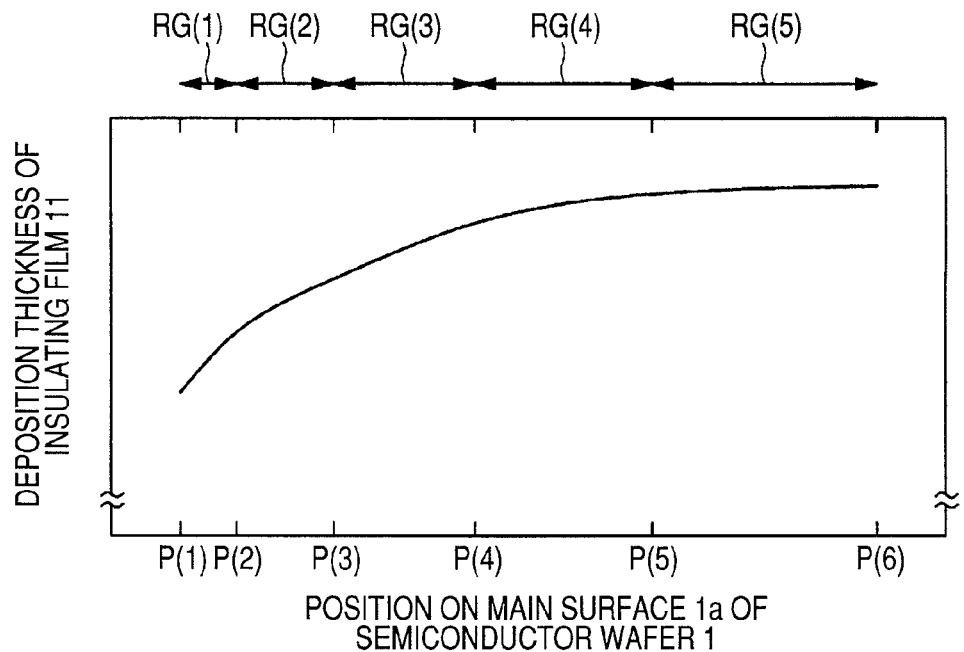
FIG. 28 is a graph showing the deposition thickness distribution of an insulating film when it is deposited on the main surface of a semiconductor wafer.
Figure 29:
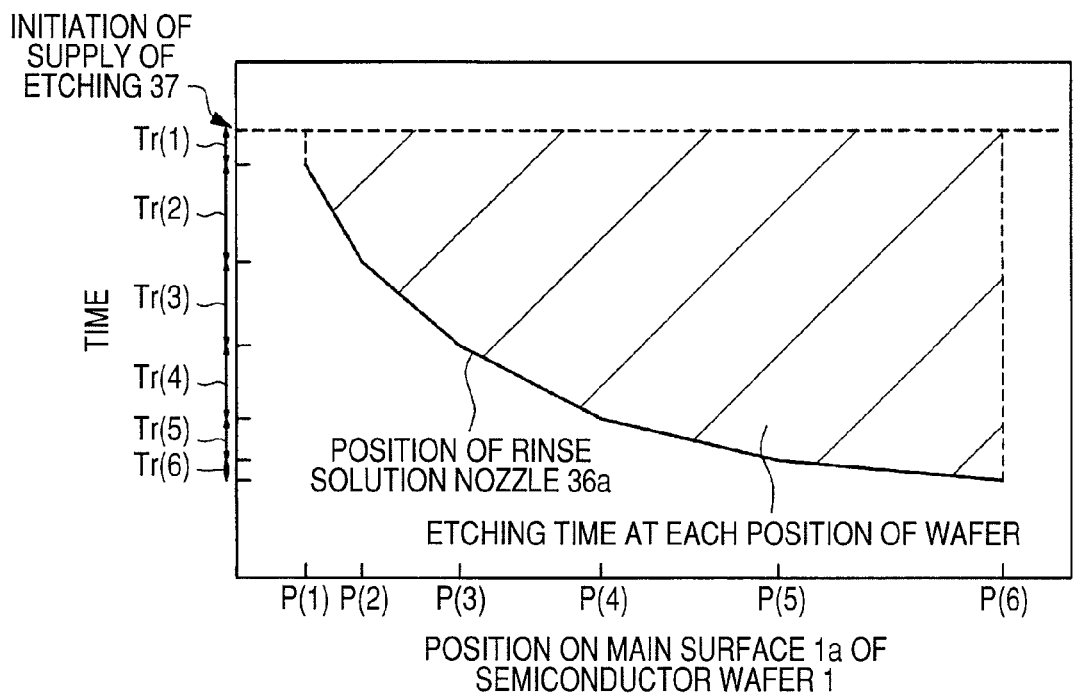
FIG. 29 is a graph showing the position of a rinse solution nozzle.
Figure 30:
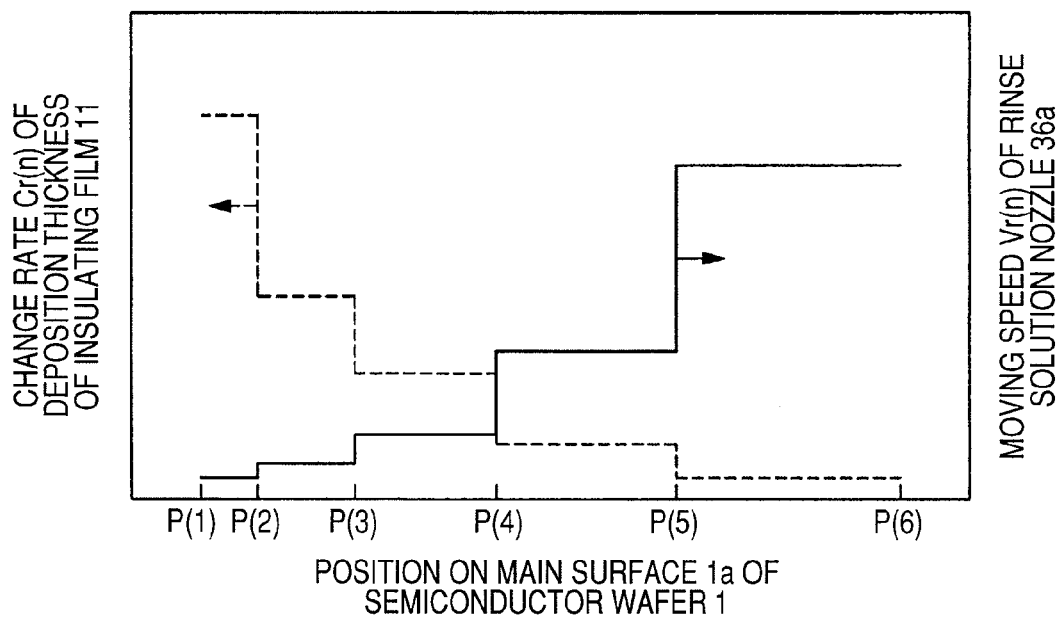
FIG. 30 is a graph showing a change rate of the deposition thickness of an insulating film in a radial direction of the main surface of a semiconductor wafer and a moving speed of a rinse solution nozzle.
Figure 31:
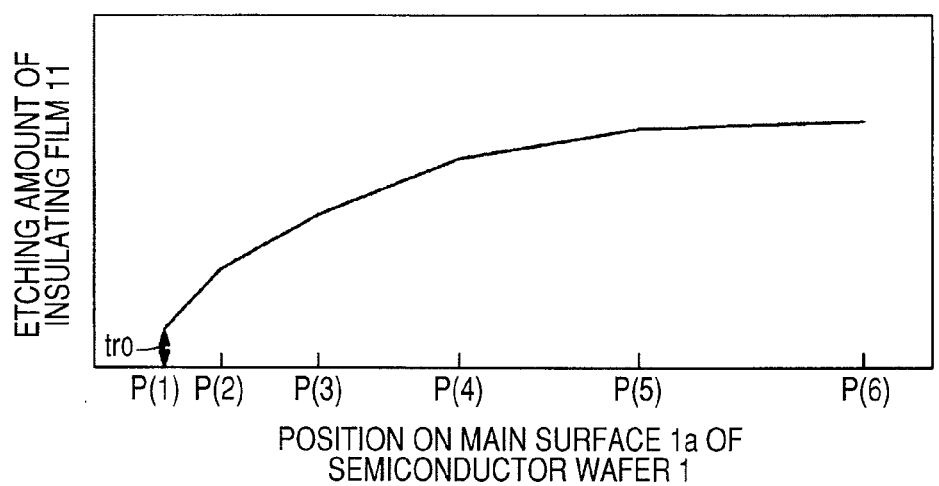
FIG. 31 is a graph showing an etching amount of an insulating film deposited on the main surface of a semiconductor wafer in the treatment for equalizing the thickness distribution of the insulating film.
Figures 32, 33:
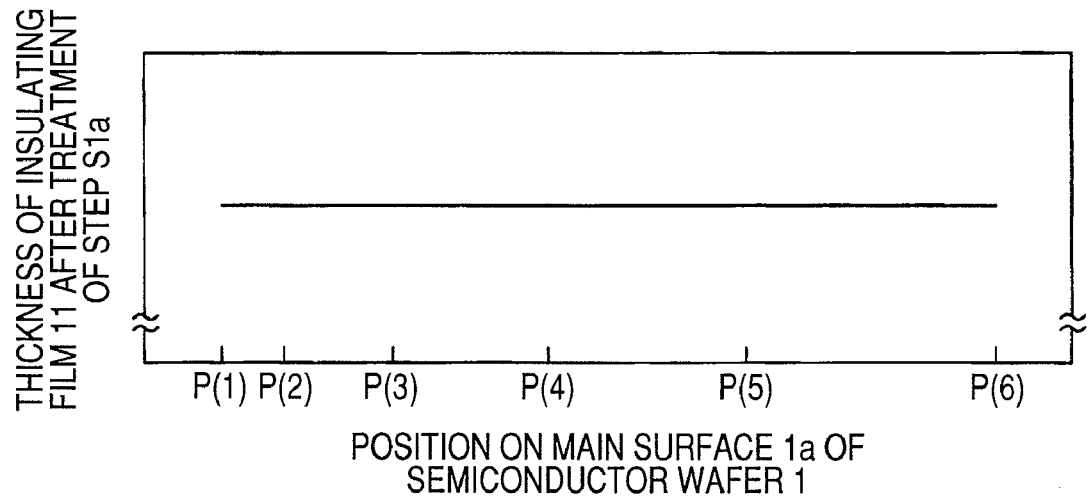
FIG. 32 is a graph showing the thickness distribution of an insulating film deposited on the main surface of a semiconductor wafer after the treatment for equalizing the film thickness distribution.
FIG. 33 is a schematic view showing the equation representing the etching time of an insulating film.

FIG. 28 is a graph showing the thickness (deposition thickness) distribution of the insulating film 11 at the time when it is deposited on the main surface 1a of the semiconductor wafer 1 (before Step S1a). FIG. 29 is a graph showing the position to which the rise solution nozzle 36a is moved in Step 1a. FIG. 30 is a graph showing a change rate of the deposition thickness of the insulating film 11 in a radial direction of the main surface 1a of the semiconductor wafer 1 and the moving speed of the rinse solution nozzle 36a in Step S1a. FIG. 31 is a graph showing the etching amount of the insulating film 11 in Step S1a. FIG. 32 is a graph showing the thickness distribution of the insulating film 11 after Step S1. FIGS. 28 to 32 correspond to the graphs of FIGS. 18 to 22 in Embodiment 1, respectively. The unit of each of the ordinate and abscissa in these graphs is an arbitrary unit.

In this Embodiment, the moving speed (corresponding to Vr(n) which will be described later) of the rinse solution nozzle 36a is controlled (adjusted), depending on the change rate (corresponding to Cr(n) which will be described later) of the deposition thickness of the insulating film 11 in a radial direction of the main surface 1a of the semiconductor wafer 1. Described specifically, in a region where the change rate (corresponding to Cr(n) which will be described later) of the deposition thickness of the insulating film 11 in a radial direction of the main surface 1a of the semiconductor wafer 1 is large, the moving speed Vr(n) of the rinse solution nozzle 36a is reduced, while in a region where the change rate (corresponding to Cr(n) which will be described later) of the deposition thickness of the insulating film 11 in a radial direction of the main surface 1a of the semiconductor wafer 1 is small, the moving speed Vr(n) of the etchant nozzle 36 is raised.

Described specifically, as in Embodiment 1, six positions from P(1) to P(6) are arranged successively in a radial direction of the main surface 1a of the semiconductor wafer 1 from the position (P1) at the periphery of the main surface 1a of the semiconductor wafer 1 to the position P(6) at the center thereof.

The deposition thickness distribution of the insulating film 11 on the main surface 1a of the semiconductor wafer 1 is illustrated in FIG. 28. It is assumed that the deposition thickness of the insulating film 11 at the positions P(1) to P(6) are t(1) to t(6), respectively, with the proviso that their relationship satisfies $t(n+1) \leq t(n)$ in Embodiment 1, but in this Embodiment, the relationship satisfies $t(n+1) \geq t(n)$; and that the etching rate of the insulating film 11 by the etchant 37 is Er.

In Step S1a, the rinse solution nozzle 36a is controlled so that it moves to the position as illustrated in FIG. 29 with the passage of time. In the graph of FIG. 29, the ordinate corresponds to time and time passes in the downward direction of the ordinate.

Described specifically, assuming that time required for the rinse solution nozzle 36 to pass through the section RG(n), that is, time required for it to pass through a distance from the position P(n) to the position P(n+1) is Tr(n+1), the moving speed of the rinse solution nozzle 36 is controlled so as to satisfy the following equation (11):

$$Tr(n+1) = (t(n+1) - t(n))/Er, \text{ with the proviso that } n = \text{from 1 to 5} \quad (11).$$

Assuming that time from the supply of the etchant 37 from the nozzle 34a to the position P(6) at the center of the main surface 1a of the semiconductor wafer 1 until the initiation of the supply of the rinse solution 35 from the rinse solution nozzle 36a to the position P(1) at the periphery on the main surface 1a of the semiconductor wafer 1 is Tr(1), the timing from the initiation of the supply of the etchant 37 from the nozzle 34a to the initiation of the supply of the rinse solution 35 from the rinse solution nozzle 36a is controlled so as to satisfy the following equation (12):

$$Tr(1) = tr0/Er \quad (12).$$

In the equation (12), tr0 corresponds to the etching amount (etching thickness) of the insulating film 11 at the position P(1) at the periphery.

The time from the initiation of the supply of the etchant 37 from the etchant nozzle 34a to the position P(6) at the center of the semiconductor wafer 1 until the movement of the rinse solution nozzle 36a above the position P(6) at the center of the main surface 1a of the semiconductor wafer 1 to start supply of the rinse solution 35 to the position P(6), that is, $T(1) + T(2) + T(3) + T(4) + T(5) + T(6)$ is about 30 seconds when a desired etching amount, for example, at the hydrofluoric acid concentration of 50% $HF:H_2O = 1:100$ is about 1.5 nm in terms of a thermal oxide film and about 20 seconds when a desired etching amount, for example, at the hydrofluoric acid concentration of 50% $HF:H_2O = 1:20$ is about 5 nm in terms of a thermal oxide film.

Assuming that the distance from the position P(n) to the position P(n+1) is L(n), the moving speed Vr(n) of the rinse solution nozzle 36a in the distance of section RG(n), that is, the distance between the position P(n) to the position P(n+1) is represented by the following equation (13):

$$Vr(n) = L(n)/Tr(n+1) \quad (13).$$

The equation (11) is substituted for the equation (13), leading to the following equation (14):

$$Vr(n) = Er \times L(n)/(t(n+1) - t(n)) \quad (14)$$

Assuming that a change rate of the deposition thickness of the insulating film 11 between the position P(n) and the position P(n+1) (that is, difference in the deposition thickness of the insulating film 11 between both ends of the section RG(n)) is Cr(n), the Cr(n) is represented by the following equation (15):

$$Cr(n) = (t(n+1) - t(n))/L(n) \quad (15).$$

This means that the equation (14) is represented by the following equation (16):

$$Vr(n) = Er/Cr(n) \quad (16)$$

As is apparent from the equation (15), a change rate Cr(n) of the deposition thickness of the insulating film 11 is positive when the deposition thickness t(n) of the insulating film 11 becomes larger from the position P(n) on the peripheral side toward the position P(n+1) on the central side, on the main surface 1a of the semiconductor wafer 1. This embodiment is suitably applied to the case of t(n+1)≧t(n). In this case, Cr(n) satisfies the following equation: C(n)≧0. Accordingly, the change rate Cr(n) in Embodiment 2 and the change rate C(n) in Embodiment 1 are equal in absolute number but one is positive and the other is negative (C(n)=−Cr(n)).

In this Embodiment, as is apparent from the equation (15), the change rate Cr(n) of the deposition thickness of the insulating film 11 in a radial direction of the main surface 1a of the semiconductor wafer 1 therefore corresponds to an increasing rate (increasing amount) of the deposition thickness of the insulating film 11 per unit length in a direction from the periphery toward the center of the main surface 1a of the semiconductor wafer 1.

In this Embodiment, the moving speed of the rinse solution nozzle 36a in each section of P(1) to P(6) is controlled to the moving speed V(n) so as to satisfies the equation (16). In the graph of FIG. 30, the change rate Cr(n) of the deposition thickness of the insulating film 11 in a radial direction of the main surface 1a of the semiconductor wafer 1 is indicated by a dotted line, while the moving speed Vr(n) of the rinse solution nozzle 36a in Step S1a is indicated by a solid line. As is apparent from the equation (16) or FIG. 30, the moving speed Vr(n) of the rinse solution nozzle 36a is retarded (decreased) in a region where the change rate Cr(n) of the deposition thickness of the insulating film 11 in a radial direction of the main surface 1a of the semiconductor wafer 1 is large and the moving speed Vr(n) of the rinse solution nozzle 36a is accelerated (increased) in a region where the change rate Cr(n) of the deposition thickness of the insulating film 11 in a radial direction of the main surface 1a of the semiconductor wafer 1 is small. In such a manner, the moving speed Vr(n) of the rinse solution nozzle 36a is controlled (adjusted), depending on the change rate Cr(n) of the deposition thickness of the insulating film 11 in a radial direction of the main surface 1a of the semiconductor wafer 1. In a region where the change rate Cr(n) of the deposition thickness of the insulating film 11 in a radial direction of the main surface 1a of the semiconductor wafer 1 is near zero (in a region where the deposition thickness of the insulating film 11 is substantially uniform), there is a possibility of the Vr(n) of the equation (16) exceeding the operating range of the etching apparatus 31a. In such a region, the moving speed Vr(n) of the rinse solution nozzle 36a may be raised within an operating range of the etching apparatus 31a. In a region (Cr(n)<0) where the change rate Cr(n) of the deposition thickness of the insulating film 11 in a radial direction of the main surface 1a of the semiconductor wafer 1 becomes negative, if any, the moving speed Vr(n) of the rinse solution nozzle 36a may be raised within an operating range of the etching apparatus 31a.

The etchant 37 is brought into contact with the positions P(1) to P(6) for the first time when the nozzle 34a starts supply of the etchant 37 to the main surface 1a of the semiconductor wafer 1. By this contact, etching of the insulating film 11 by the etchant 37 is started at the positions P(1) to P(6). After starting of etching, the rinse solution 35 is brought into contact with the position P(n) for the first time when the rinse solution nozzle 36a which is discharging the rinse solution 35 comes over the position P(n). By this, the rinsing with the rinse solution 35 is started and etching with the etchant 37 is terminated at the position P(n). After the passage of the rinse solution nozzle 36a over the position P(n), the rinse solution 35 fed from the rinse solution nozzle 36a passes over the position P(n) so that rinsing at the position P(n) is continued. Accordingly, the time during which the position P(n) is in contact with the etchant 37, that is, the etching time ETr(n) of the insulating film 11 at the position P(n) is represented by the equation (17) as shown in FIG. 33. A region indicated by the diagonal lines in the graph of FIG. 29 corresponds to the etching time at each position on the main surface 1a of the semiconductor wafer 1.

When the equations (11) and (12) are substituted for the equation (17) of FIG. 33, the etching time ET(n) of the insulating film 11 at each position P(n) is represented by the following equation:

$$ET(n) = (t(n) - t(1) + tr0)/Er$$

The etching amount (etching thickness) EWr(n) of the insulating film 11 at the position P(n) is proportional to the etching time ET(n) and etching rate Er and becomes the product of them (ETr(n)×Er), leading to the following equation:

$$EWr(n) = t(n) - t(1) + tr0$$

The etching amount (EWr(n)) of the insulating film 11 at each position on the main surface 1a of the semiconductor wafer 1 during Step S1 is graphed in FIG. 31.

The thickness ta(n) of the insulating film 11 at the position P(n) after Step S1a is represented by the following equation:

$$ta(n) = t(n) - EWr(n) = t(6) - tr0$$

This means that the thickness (remaining thickness) of the insulating film 11 on the main surface 1a of the semiconductor wafer 1 after Step S1a is fixed (t(6)−t0) at any position. In short, the respective thicknesses ta(1) to ta(6) of the insulating film 11 at positions P(1) to P(6) after Step S1a become uniform as is shown by the following equation:

$$ta(1) = ta(2) = ta(3) = ta(4) = ta(5) = ta(6) = t(6) - t0$$

The thickness distribution of the insulating film 11 on the main surface 1a of the semiconductor wafer 1 after Step S1a is graphed into FIG. 32.

As is apparent from the equation (16), when the change rate Cr(n) of the deposition thickness of the insulating film 11 on the main surface 1a of the semiconductor wafer 1 is constant, it is only necessary to adjust the moving speed Vr(n) of the rinse solution nozzle 36a at a constant speed. In practice, the change rate Cr(n) of the deposition thickness of the insulating film 11 on the main surface 1a of the semiconductor wafer 1 is not constant and as illustrated, for example, in the graph of FIG. 28 or FIG. 30, the change rate Cr(n) of the deposition thickness of the insulating film 11 becomes greater (Cr(1)>Cr(5)) in the vicinity of the periphery (for example, section RG(1)) than in the vicinity of the center (for example, section RG(5)) on the main surface 1a of the semiconductor wafer 1. The moving speed Vr(n) of the rinse solution nozzle 36a is decreased in the vicinity of the periphery (for example, section RG(1)) on the main surface 1a of the semiconductor wafer 1 and the moving speed Vr(n) of the rinse solution nozzle 36a is increased in the vicinity of the center (for example, section RG(5)) on the main surface 1a of the semiconductor wafer 1 (Vr(1)<Vr(5)). The moving speed of the rinse solution nozzle 36a therefore differs between the peripheral side and central side of the semiconductor wafer 1.

In this Embodiment, the moving speed of the rinse solution nozzle 36a is controlled, depending on the change rage Cr(n) of the deposition thickness of the insulating film 11 in a radial direction of the main surface 1a of the semiconductor wafer 1. In a region where the change rate Cr(n) of the deposition thickness of the insulating film 11 is large, the moving speed Vr(n) of the rinse solution nozzle 36a is decreased, while in a region where the change rate Cr(n) of the deposition thickness of the insulating film 11 is small, the moving speed Vr(n) of the rinse solution nozzle 36a is increased. This makes it possible to make uniform the film thickness (ta(n)) of the insulating film 11 on the main surface 1a of the semiconductor wafer 1 after Step S1.

In this Embodiment, the moving speed Vr(n) of the rinse solution nozzle 36a is controlled, not depending on the deposition thickness t(n) of the insulating film 11 but depending on the change rate Cr(n) of the deposition thickness of the insulating film 11 in a radial direction of the main surface 1a of the semiconductor wafer 1. This means neither a decrease in the moving speed Vr(n) of the rinse solution nozzle 36a in a region where the deposition thickness t(n) of the insulating film 11 is small nor an increase in the moving speed Vr(n) of the rinse solution nozzle 36a in a region where the deposition thickness t(n) of the insulating film 11 is large. In this Embodiment, whether the deposition thickness t(n) of the insulating film 11 is large or small, the moving speed Vr(n) of the rinse solution nozzle 36a is increased when the change rate Cr(n) of the deposition thickness of the insulating film 11 in a radial direction of the main surface 1a of the semiconductor wafer 1 is small and the moving speed Vr(n) of the rinse solution nozzle 36a is decreased when the change rate Cr(n) of the deposition thickness of the insulating film 11 is large.

This Embodiment can be applied to the case where the deposition thickness t(n) of the insulating film 11 on the main surface 1a of the semiconductor wafer 1 has a distribution as shown in the graph of FIG. 28, more specifically, in the case where the deposition thickness becomes the smallest at the periphery (position P(1)) of the main surface 1a of the semiconductor wafer 1 and the deposition thickness (t(n)) of the insulating film 11 becomes larger toward the center (position P(6)) of the main surface 1a of the semiconductor wafer 1 (the case of t(n+1)≧t(n)). Such a deposition thickness distribution of the insulating film 11 tends to occur when the insulating film 11 is deposited over the semiconductor wafer 1 by using a single-wafer film forming apparatus (single-wafer CVD apparatus). This Embodiment can therefore exhibit its effects fully when applied to the insulating film 11 deposited over the semiconductor wafer 1 by using a single-wafer film forming apparatus (single-wafer CVD apparatus).

In this Embodiment, after the initiation of the etching of the insulating film 11 by the etchant 37, the rinse solution nozzle 36a is moved from the position above the periphery of the main surface 1a of the rotating semiconductor wafer 1 to the position above the center of the main surface 1a of the semiconductor wafer 1, and etching of the insulating film 11 is terminated by the rinse solution 35 supplied from the rinse solution nozzle 36a. This makes it possible to decrease the etching time at the periphery of the main surface 1a of the semiconductor wafer 1 and increase the time toward the center of the main surface 1a of the semiconductor wafer 1, whereby the etching amount (etching thickness) of the insulating film 11 can be decreased (made smaller) at the periphery of the main surface 1a of the semiconductor wafer 1 and can be increased (made greater) toward the central side of the main surface 1a of the semiconductor wafer 1. This makes it possible to equalize the thickness of the insulating film 11 having a deposition thickness distribution in which the film becomes thinnest at the periphery of the main surface 1a of the semiconductor wafer 1 and becomes thicker toward the center of the main surface 1a of the semiconductor wafer 1.

When the deposition thickness distribution of the insulating film 11 on the main surface 1a of the semiconductor wafer 1 is not simple and a change in the deposition thickness of the insulating film 11 is not proportional to the distance from the periphery of the main surface 1a of the semiconductor wafer 1, the thickness distribution of the insulating film 11 within the main surface 1a of the semiconductor wafer 1 cannot be made uniform sufficiently only by constant movement of the rinse solution nozzle 36a from the position above the periphery of the main surface 1a of the semiconductor wafer 1 to the position above the center of the main surface 1a of the semiconductor wafer 1 and the thickness distribution of the insulating film 11 on the main surface 1a of the semiconductor wafer 1 is still uneven.

In this Embodiment, the rinse solution nozzle 36a is moved not at a constant speed but a speed controlled (changed), depending on the thickness distribution of the insulating film 11 within the main surface 1a of the semiconductor wafer 1. Described specifically, the moving speed Vr(n) of the rinse solution nozzle 36a is controlled, not depending on the deposition thickness t(n) of the insulating film 11 but depending on the change rate Cr(n) of the deposition thickness of the insulating film 11 in a radial direction of the main surface 1a of the semiconductor wafer 1. In other words, the moving speed Vr(n) of the rinse solution nozzle 36a is increased when the change rate Cr(n) of the deposition thickness of the insulating film 11 in a radial direction of the main surface 1a of the semiconductor wafer 1 is small, while the moving speed Vr(n) of the rinse solution nozzle 36 a is decreased when the change rate Cr(n) of the deposition thickness of the insulating film 11 is large. This makes it possible to sufficiently equalize the thickness distribution of the insulating film 11 within the main surface 1a of the semiconductor wafer 1 and the unevenness of the thickness distribution of the insulating film 11 on the main surface 1a of the semiconductor wafer 1 can be eliminated fully even if the deposition thickness distribution of the insulating film 11 on the main surface 1a of the semiconductor wafer 1 is not simple and a change in the deposition thickness of the insulating film 11 is not proportional to the distance from the periphery of the main surface 1a of the semiconductor wafer 1.

In this Embodiment, even if the deposition thickness distribution of the insulating film 11 on the main surface 1a of the semiconductor wafer 1 is not uniform, treatment of Step S1a makes it possible to equalize the thickness distribution of the insulating film 11 within the main surface 1a of the semiconductor wafer 1 so that effects similar to those available by Embodiment 1 can also be obtained. Step S1a makes it possible, for example, to prevent appearance of the etching residue of the insulating film 27 other than sidewall spacers 15, which will otherwise occur in the etchback step of the insulating film 27 for the formation of the sidewall spacers 15, and also prevent the overetching, thereby protecting the exposed substrate region (a region of the p well 3 in which $n^+$ semiconductor regions 16 are to be formed) of the semiconductor wafer 1 from damage. Moreover, in the region 1A in which the deposition thickness of the insulating film 11 is large and in the region 1B in which it is small, the sidewall spacers can be formed with equal thickness so that connection resistance between the plug 24 in the contact hole 23 and the $n^+$ semiconductor region 16 (metal silicide layer 17 on the surface thereof) can be made uniform (equal) in these regions and generation of connection failure between the plug 24 in the contact hole 23 and the n+ semiconductor region 16 (metal silicide layer 17 on the surface thereof) can be prevented. Accordingly, the semiconductor device having improved reliability and performance can be obtained. In addition, the production yield of the semiconductor device can be improved.

The problems as described referring to FIGS. 13 to 15 tend to occur when the small unevenness of the thickness distribution of the insulating film 11 cannot be neglected and the unevenness still remains in the deposition film thickness even if a fluctuation in the distribution of the deposition thickness of the insulating film 11 on the main surface 1a of the semiconductor wafer 1 is not so large. In order to lessen the problems which have been described using FIGS. 13 to 15, not simple movement of the rinse solution nozzle 36a but control of the moving speed of the rinse solution nozzle 36a, depending on the thickness distribution of the insulating film 11 on the main surface 1a of the semiconductor wafer 1 as in this Embodiment is preferred. This makes it possible to heighten the evenness of the thickness distribution of the insulating film 11 after the treatment of Step S1 and reliably prevent the occurrence of the problems described in FIGS. 13 to 15 even if the deposition thickness of the insulating film 11 has a complex distribution on the main surface 1a of the semiconductor wafer 1.

Embodiment 3

The fabrication steps of a semiconductor device according to this Embodiment will next be described with reference to accompanying drawings.

The fabrication process of the semiconductor device according to this Embodiment is substantially similar to that described in Embodiment 1 except for the employment of Step S1b, which will be described later, instead of Step S1. The description hereinafter will be limited to that of Step S1b.

In this Embodiment, the thickness distribution of the insulating film 11 deposited on the main surface 1a of the semiconductor wafer 1 is corrected (made uniform) after deposition of the insulating film 11 on the main surface 1a of the semiconductor wafer 1 as described above (this step will hereinafter be called Step S1b).

Figure 34:
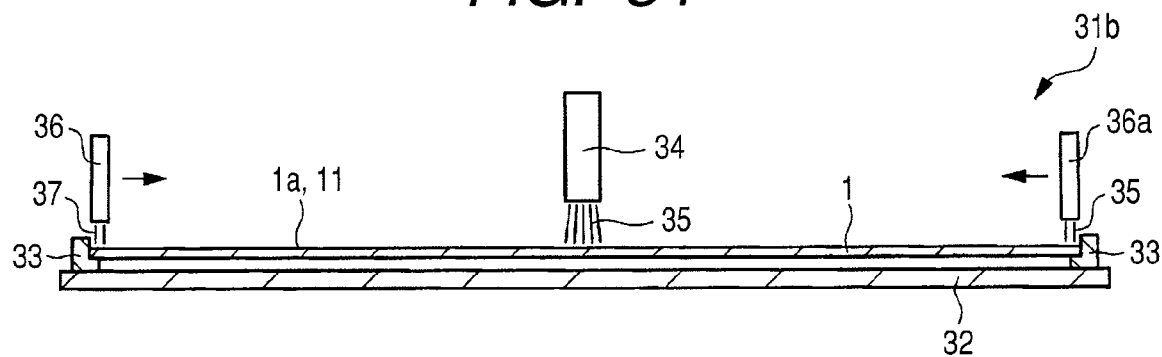
FIG. 34 is a schematic view illustrating the treatment for equalizing the deposition distribution of an insulating film deposited on the main surface of a semiconductor wafer.
Figure 35:
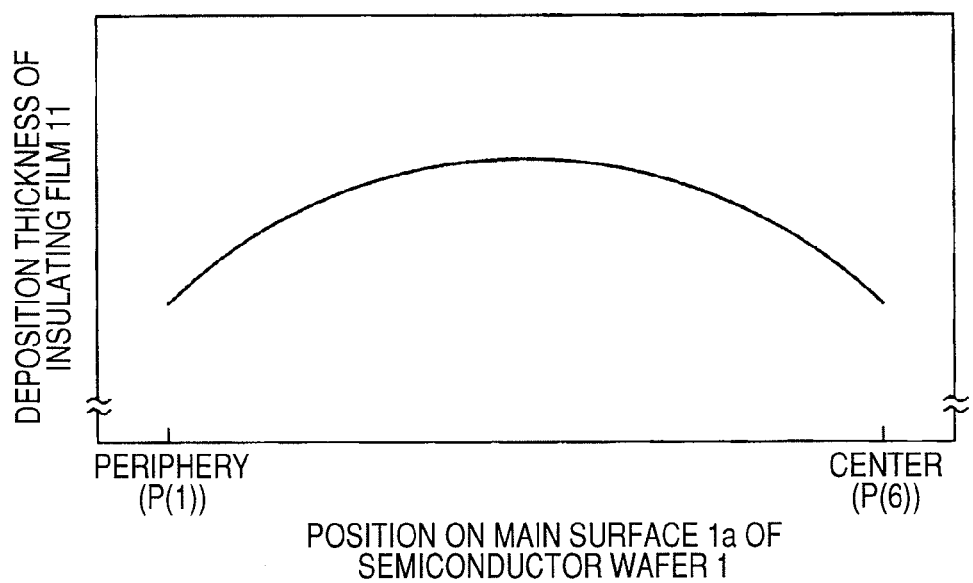
FIG. 35 is a graph showing the deposition thickness distribution of an insulating film when it is deposited on the main surface of a semiconductor wafer.
Figure 36:
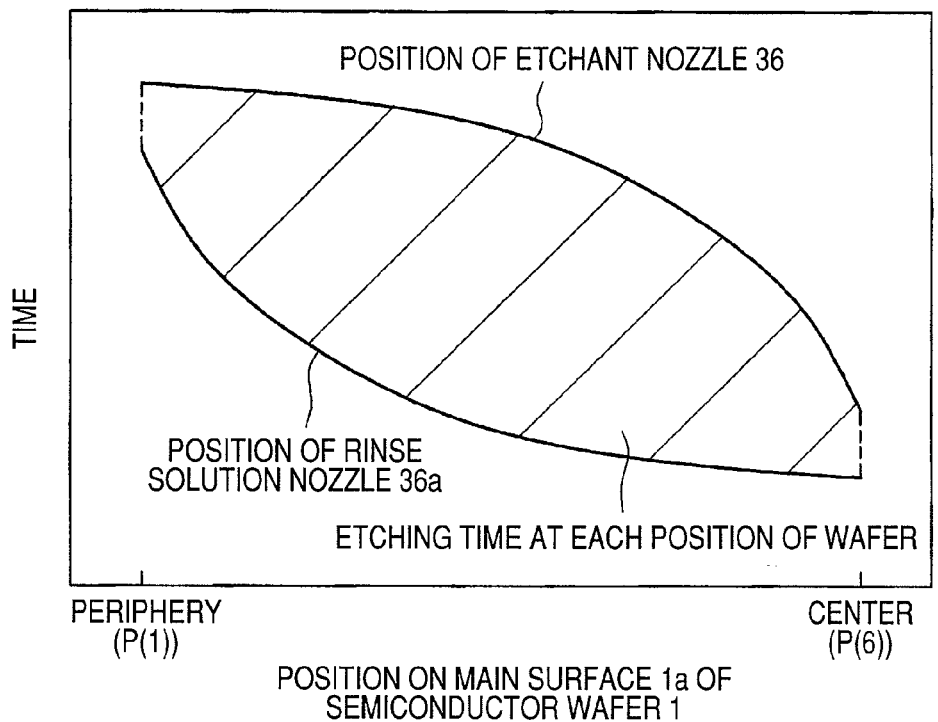
FIG. 36 is a graph showing the positions of an etchant nozzle and rinse solution nozzle.
Figure 37:
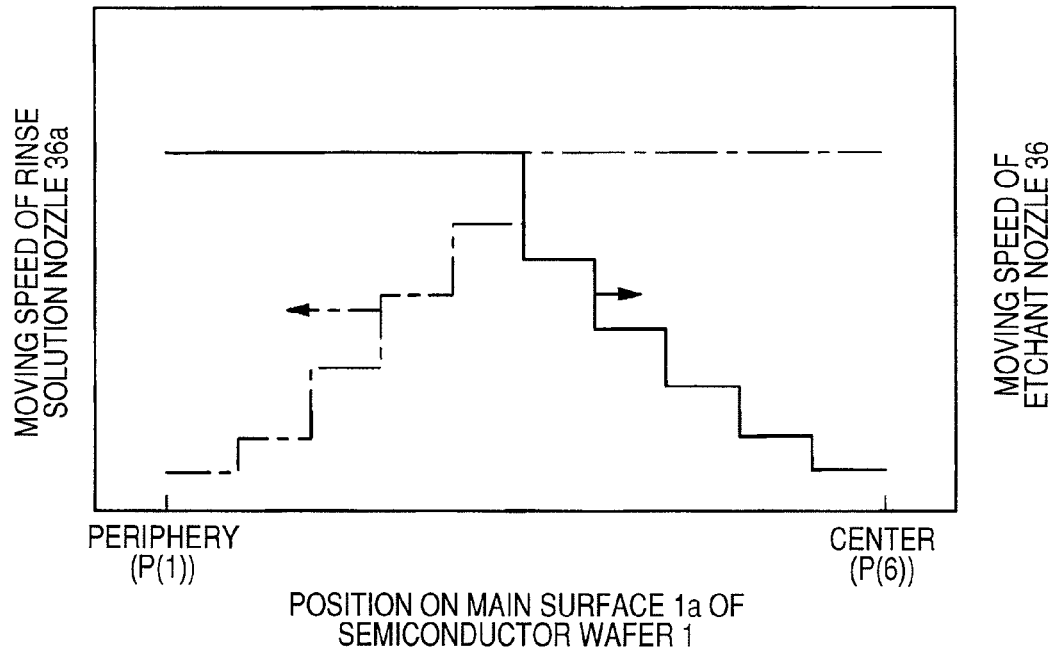
FIG. 37 is a graph showing the moving speed of each of an etchant nozzle and rinse solution nozzle.
Figure 38:
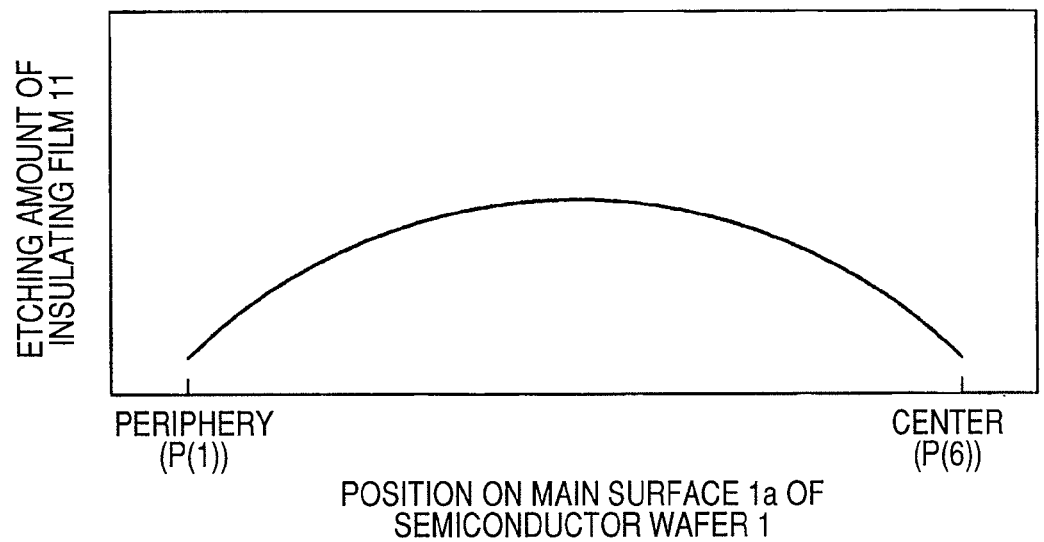
FIG. 38 is a graph showing the etching amount of an insulating film deposited on the main surface of a semiconductor wafer in the treatment for equalizing the thickness distribution of the insulating film.
Figure 39:
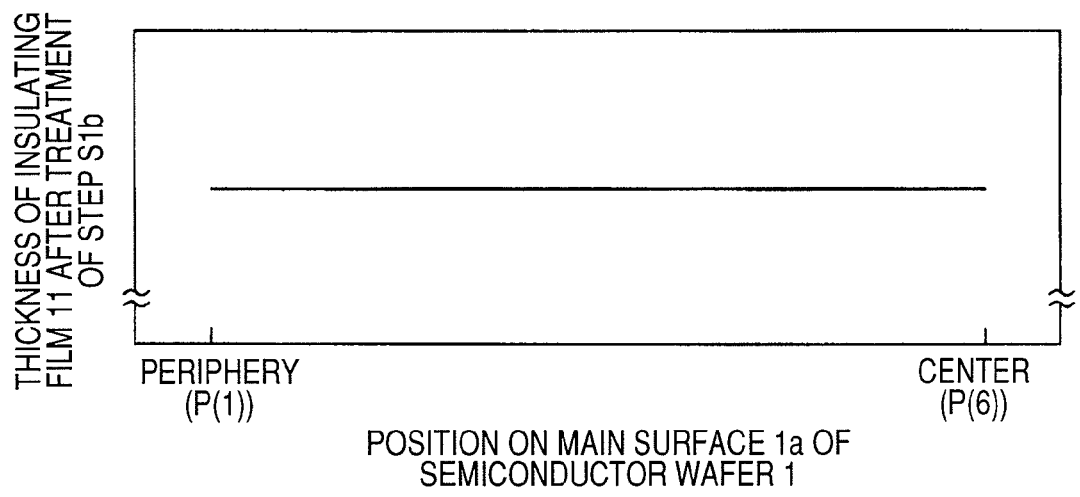
FIG. 39 is a graph showing the thickness distribution of an insulating film deposited on the main surface of a semiconductor wafer after the treatment for equalizing the thickness distribution of the insulating film.

FIG. 34 is a schematic view (cross-sectional view) of the treatment of Step S1b (treatment for correcting the thickness distribution of the insulating film 11 deposited on the main surface of the semiconductor wafer 1) performed in this Embodiment. This diagram corresponds to FIGS. 16 and 27 of Embodiments 1 and 2, respectively. FIG. 35 is a graph showing the thickness (deposition thickness) distribution of the insulating film 11 when the insulating film 11 is deposited on the main surface 1a of the semiconductor wafer 1 (before the treatment of Step S1b). FIG. 36 is a graph showing the position of an etchant nozzle 36 and a rinse solution nozzle 36a in Step S1b. FIG. 37 is a graph showing the moving speed of the etchant nozzle 36 and moving speed of the rinse solution nozzle 36a in Step S1b. FIG. 38 is a graph showing the etching amount of the insulating film 11 in Step S1b. FIG. 39 is a graph showing the thickness distribution of the insulating film 11 after Step S1b. FIGS. 35 to 39 substantially correspond to the graphs of FIGS. 18 to 22 of Embodiment 1, respectively. The unit of the ordinate and abscissa in each graph is an arbitrary unit. In FIG. 37, however, the moving speed of the etchant nozzle 36 in Step S1b is indicated by a solid line, while the moving speed of the rinse solution nozzle 36a in Step S1b is indicated by a dashed-dotted line.

In this Embodiment, as illustrated in FIG. 34, the correction (equalization) of the thickness distribution of the insulating film 11 in Step S1a is performed by wet etching of a portion (upper-layer portion) of the insulating film 11 by using a single-wafer wet etching apparatus 31b.

As illustrated in FIG. 34, the wet etching apparatus 31b used in this Embodiment is equipped with a spin stage 32 and a wafer chuck 33. The constitution and function of the spin stage 32 and wet chuck 33 are similar to those of the wet etching apparatus 31 used in Embodiment 1 so that description on them will be omitted here.

Also in the wet etching apparatus 31b to be used in this Embodiment, similar to that of Embodiment 1, above the spin stage 32 which means above the center of the main surface 1a of the semiconductor wafer 1 fixed to the spin stage 32 by the wafer chuck 33, a rinse solution nozzle 34 is disposed. From the rinse solution nozzle 34, a rinse solution 35 is discharged toward the main surface 1a of the semiconductor wafer 1 and thus the rinse solution 35 can be fed to the main surface 1a of the semiconductor wafer 1. Also in the wet etching apparatus 31b to be used in this Embodiment, above the spin stage 32, an etchant nozzle 36 is disposed. From the etchant nozzle 36, an etchant 37 is discharged toward the main surface 1a of the semiconductor wafer 1, whereby the etchant 37 can be supplied to the main surface 1a of the semiconductor wafer 1.

In the wet etching apparatus 31b to be used in this Embodiment, a rinse solution nozzle 36a similar to that employed in Embodiment 2 is disposed above the spin stage 32. The rinse solution 35 is discharged from the rinse solution nozzle 36a toward the main surface 1a of the semiconductor wafer and can be supplied to the main surface 1a of the semiconductor wafer 1. The constitution of each of the rinse solution nozzle 34, rinse solution 35, etchant nozzle 36 and etchant 37 is substantially similar to that of Embodiment 1. The constitution of the rinse solution nozzle 36a is substantially similar to that in Embodiment 2. Accordingly, the etchant nozzle 36 and rinse solution nozzle 36a are, above the spin stage 32, independently movable in a horizontal direction (a direction parallel to the spin stage 32 and the main surface 1a of the semiconductor wafer 1 held thereon) from the position above the periphery of the main surface 1a of the semiconductor wafer 1 to the position above the center of the main surface 1a of the semiconductor wafer 1. The moving speed of each of the etchant nozzle 36 and rinse solution nozzle 36a can be controlled to a desired speed. The etchant nozzle 36 and rinse solution nozzle 36a move from the periphery to the center on the main surface 1a of the semiconductor wafer 1, but as illustrated in FIG. 34, they preferably move from the periphery to the center in different directions, respectively.

Concrete procedures of Step S1b will next be described.

As illustrated in FIG. 34, the semiconductor wafer 1 having the insulating film 11 deposited on the main surface 1a thereof is supported on the spin stage 32 of the etching apparatus 31b by the wafer chuck 33. By the rotation of the spin stage 32, the semiconductor wafer 1 supported on the spin stage 32 is turned. The semiconductor wafer 1 can rotate with the center position of the main surface 1a as a rotation center by coinciding the rotation center of the spin stage 32 with the center position of the main surface 1a of the semiconductor wafer 1. The rotation speed of the semiconductor wafer 1 can be adjusted to, for example, 200 rpm (200 revolutions per minute).

While the semiconductor wafer 1 is rotated, the discharge of the etchant 37 from the etchant nozzle 36 is started. The etchant nozzle 36 which is discharging the etchant 37 is moved in a horizontal direction (a direction parallel to the spin stage 32 and the main surface 1a of the semiconductor wafer 1 held thereon) from the position above the periphery of the main surface 1a of the semiconductor wafer 1 to the position above the center of the main surface 1a of the semiconductor wafer 1. The etchant 37 is thus fed from the etchant nozzle 36 to the main surface 1a of the semiconductor wafer and by the etchant 37 supplied to the main surface 1a of the semiconductor wafer 1, the insulating film 11 formed on the main surface 1a of the semiconductor wafer 1 is etched. At this time, the etchant nozzle 36 moves while supplying the etchant 37 to the main surface 1a of the semiconductor wafer 1 so that the position, on the main surface 1a of the semiconductor wafer 1, which is supplied with the etchant 37 moves from the periphery of the main surface 1a of the semiconductor wafer 1 to the center of the main surface 1a of the semiconductor wafer 1.

The etchant nozzle 36 starts its movement while supplying the etchant 37 to the main surface 1a of the semiconductor wafer 1. After a predetermined time, the discharge of the rinse solution 35 from the rinse solution nozzle 36a is started while rotating the semiconductor wafer 1 and the rinse solution nozzle 36a which is discharging the rinse solution 35 is moved horizontally from the position above the periphery of the main surface 1a of the rotating semiconductor wafer 1 to the position above the central portion of the main surface 1a of the semiconductor wafer 1. By this movement, the rinse solution 35 is supplied from the rinse solution nozzle 36a to the main surface 1a of the semiconductor wafer 1. By the rinse solution 35 supplied to the main surface 1a of the semiconductor wafer 1, rinse treatment (rinsing treatment) is performed on the main surface 1a of the semiconductor wafer 1 and the etchant 37 is removed, together with the rinse solution 35, from the main surface 1a of the semiconductor wafer 1, whereby the etching of the insulating film 11 on the main surface 1a of the semiconductor wafer 1 is terminated. The position, on the main surface 1a of the semiconductor wafer 1, to which the rinse solution 35 is supplied moves from the periphery of the main surface 1a of the semiconductor wafer 1 to the center of the main surface 1a of the semiconductor wafer 1 by the movement of the rinse solution nozzle 36a while supplying the rinse solution 35 to the main surface 1a of the semiconductor wafer 1.

After the etchant nozzle 36 reaches the position above the center of the main surface 1a 1 of the rotating semiconductor wafer 1 and the position, on the main surface 1a of the semiconductor wafer 1, to which the etchant 37 is supplied from the etchant nozzle 36 moves from the periphery of the main surface 1a of the semiconductor wafer 1 to the center of the main surface 1a of the semiconductor wafer 1, the supply of the etchant 37 to the main surface 1a of the semiconductor wafer 1 from the etchant nozzle 36 is terminated. Then, after the rinse solution nozzle 36a reaches the position above the center of the main surface 1a of the rotating semiconductor wafer 1 and the position, on the main surface 1a of the semiconductor wafer 1, to which the rinse solution 35 is supplied from the rinse solution nozzle 36a moves from the periphery of the main surface 1a of the semiconductor wafer 1 to the center of the main surface 1a of the semiconductor wafer 1, the supply of the rinse solution 35 from the rinse solution nozzle 36 to the main surface 1a of the semiconductor wafer 1 is terminated. Then, the rinse solution 35 is supplied from the rinse solution nozzle 34 located above the center of the main surface 1a of the semiconductor wafer 1 to the center of the main surface 1a of the semiconductor wafer 1.

When the etchant nozzle 36 and rinse solution nozzle 36a are located above the center of the main surface 1a of the rotating semiconductor wafer 1, the rinse solution nozzle 36a may disturb the supply of the rinse solution 35 from the rinse solution nozzle 34 to the main surface 1a of the semiconductor wafer 1. After the supply of the etchant 37 from the etchant nozzle 36 is terminated, therefore, the etchant nozzle 36 is moved promptly from the position above the center of the main surface 1a of the rotating semiconductor wafer 1 to the peripheral side thereof. After the supply of the rinse solution 35 from the rinse solution nozzle 36a is terminated, the rinse solution nozzle 36a is promptly moved from the position above the center of the main surface 1a of the rotating semiconductor wafer 1 to the peripheral side thereof. Then, the rinse solution 35 may be supplied from the rinse solution nozzle 34 to the main surface 1a of the semiconductor wafer 1.

After rinse treatment, the discharge of the rinse solution 35 from the rinse solution nozzle 34 is terminated, whereby the supply of the rinse solution 35 to the main surface 1a of the semiconductor wafer 1 is completed. Then, the rotation speed of the spin stage 32 is increased, whereby the rotation speed of the semiconductor wafer 1 is raised. By utilizing the centrifugal force caused by the high speed rotation of the semiconductor wafer 1, the liquid or water (rinse solution 35) remaining on the main surface 1a of the semiconductor wafer 1 is dashed off to dry the semiconductor wafer 1. After the semiconductor wafer 1 is dried for a predetermined time by the high speed rotation, the rotation of the semiconductor wafer 1 is terminated (the rotation of the spin stage 32 is terminated).

The semiconductor wafer 1 thus treated is then sent to the subsequent step (step of forming sidewall spacers 15 by the etchback of the insulating film 11) or housed in a storage case prior to the subsequent step.

As described above, while the semiconductor wafer 1 is rotated and the etchant 37 is discharged from the etchant nozzle 36, the etchant nozzle 36 is moved in a horizontal direction from the position above the periphery of the main surface 1a of the rotating semiconductor wafer 1 to the position above the center of the main surface 1a of the semiconductor wafer 1. Since the semiconductor wafer 1 is rotating, the etchant 37 fed from the etchant nozzle 36.to the main surface 1a of the semiconductor wafer 1 flows toward the peripheral side on the main surface 1a of the semiconductor wafer 1. On the main surface 1a of the semiconductor wafer 1, the etchant 37 therefore spreads (is present) outside (on the peripheral side) of the position to which the etchant 37 is fed from the etchant nozzle 36 and by this etchant 37, the insulating film 11 formed on the main surface 1a of the semiconductor wafer 1 is etched (wet etched).

After etching of the insulating film 11 by the etchant 37 fed from the etchant nozzle 36 is started, the rinse solution nozzle 36a is moved horizontally from the position above the periphery of the main surface 1a of the rotating semiconductor wafer 1 to the position above the center of the main surface 1a of the semiconductor wafer 1 while rotating the semiconductor wafer 1 and discharging the rinse solution 35 from the rinse solution nozzle 36a. Since the semiconductor wafer 1 is rotating, the rinse solution 35 fed from the rinse solution nozzle 36a to the main surface 1a of the semiconductor wafer 1 flows toward the peripheral side on the main surface 1a of the semiconductor wafer 1. On the main surface 1a of the semiconductor wafer 1, the rinse solution 35 spreads (is present) outside (on the peripheral side) of the position to which the rinse solution 35 is fed from the rinse solution nozzle 36a and by this rinse solution 35, rinse treatment (rinsing treatment) is performed. The etchant 37 is removed, together with the rinse solution 35, and etching (wet etching) of the insulating film 11 is terminated.

In this Embodiment, as in Embodiment 1, since the etchant nozzle 36 which is discharging the etchant 37 is moved horizontally from the position above the periphery of the main surface 1a of the rotating semiconductor wafer 1 to the position above the center of the main surface 1a of the semiconductor wafer 1, the starting time of etching by the etchant 37 differs, depending on the position on the main surface 1a of the semiconductor wafer 1. Described specifically, the etching of the insulating film 11 with the etchant 37 fed from the etchant nozzle 36 is started successively at each position on the main surface 1a of the semiconductor wafer 1. The starting time of the etching of the insulating film 11 at each position on the main surface 1a of the semiconductor wafer 1 is the moment when the etchant nozzle 36 which is discharging the etchant 37 passes above the position and the etchant 37 fed from the etchant nozzle 36 is brought into contact with the position. In this Embodiment, as in Embodiment 2, the rinse solution nozzle 36 which is discharging the rinse solution 35 is moved horizontally from the position above the periphery of the main surface 1a of the rotating semiconductor wafer 1 to the position above the center of the main surface 1a of the semiconductor wafer 1, so that the starting time of the rinse treatment with the rinse solution 35 differs, depending on the position on the main surface 1a of the semiconductor wafer 1. In other words, at each position on the main surface 1a of the semiconductor wafer 1, etching of the insulating film 11 is terminated successively by the rinse solution 35 fed from the rinse solution nozzle 36a. The termination time of the etching of the insulating film 11 at each position on the main surface 1a of the semiconductor wafer 1 is the moment when the rinse solution nozzle 36a which is discharging the rinse solution 35 passes above the position and the rinse solution 35 fed from the rinse solution nozzle 36a is brought into contact with the position.

At each position on the main surface 1a of the semiconductor wafer 1, etching of the insulating film 11 continues from the contact (wetting) with the etchant 37 fed from the etchant nozzle 36 to the contact (wetting) with the rinse solution 35 fed from the rinse solution nozzle 36a. It is therefore only necessary to move the etchant nozzle 36 and rinse solution nozzle 36a once from the peripheral side to the central side on the main surface 1a of the semiconductor wafer 1 so that the operation of Step S1b can be simplified and time necessary for Step S1b can be reduced.

In Step S1b, the etching time at each position on the main surface of the semiconductor wafer 1 corresponds to the time from the passage of the etchant nozzle 36 over each position until the passage of the rinse solution nozzle 36a over the position. In this Embodiment, by controlling the moving speeds of the etchant nozzle 36 and the rinse solution nozzle 36a, depending on the deposition thickness distribution of the insulating film 11 on the main surface 1a of the semiconductor wafer 1, the etching time at each position on the main surface 1a of the semiconductor wafer 1 is corresponded to the amount of the insulating film 11 to be etched at each position on the main surface 1a in order to equalize the thickness distribution of the insulating film 11. The thickness distribution of the insulating film 11 on the main surface 1a of the semiconductor wafer 1 can therefore be made uniform at any position.

In this Embodiment, as illustrated in FIG. 36 or 37, the moving speed of each of the etchant nozzle 36 and rinse solution nozzle 36a is controlled to not a constant speed but a speed controlled (changed), depending on the thickness distribution of the insulating film 11 within the main surface 1a of the semiconductor wafer 1. The etching time of the insulating film 11 can therefore be changed, depending on the position on the main surface 1a of the semiconductor wafer 1.

When different from this Embodiment, the moving speed of each of the etchant nozzle 36 and the rinse solution nozzle 36a is controlled to a constant speed, at each position on the main surface 1a of the semiconductor wafer 1, the time (which corresponds to etching time) from the passage of the etchant nozzle 36 over the position until the passage of the rinse solution nozzle 36 over the position is the same, which means that the etching time of the insulating film 11 is the same at any position on the main surface 1a of the semiconductor wafer 1.

In this Embodiment, on the other hand, the moving speed of the etchant nozzle 36 and moving speed of the rinse solution nozzle 36a are controlled (changed), depending on the thickness distribution (deposition thickness distribution) of the insulating film 11 within the main surface 1a of the semiconductor wafer 1. At each position on the main surface 1a of the semiconductor wafer 1, therefore, the time (corresponding to etching time) from the passage of the etchant nozzle 36 over the position to the passage of the rinse solution nozzle 36a over the position can be changed. In other words, the etching time of the insulating film 11 can be changed at any position on the main surface 1a of the semiconductor wafer 1.

For example, as in Embodiment 1, in a region where the change rate $C(n)$ of the deposition thickness of the insulating film 11 in a radial direction of the main surface 1a of the semiconductor wafer 1 is large, the moving speed $V(n)$ of the etchant nozzle 36 may be decreased, while in a region where the change rate $C(n)$ of the deposition thickness of the insulating film 11 in a radial direction of the main surface 1a of the semiconductor wafer 1 is small, the moving speed $V(n)$ of the etchant nozzle 36 may be increased, as illustrated in FIG. 37. As in Embodiment 2, in a region where the change rate $Cr(n)$ of the deposition thickness of the insulating film 11 in a radial direction of the main surface 1a of the semiconductor wafer 1 is large, the moving speed $Vr(n)$ of the rinse solution nozzle 36a may be decreased, while in a region where the change rate $Cr(n)$ of the deposition thickness of the insulating film 11 in a radial direction of the main surface 1a of the semiconductor wafer 1 is small, the moving speed $Vr(n)$ of the rinse solution nozzle 36a may be increased, as illustrated in FIG. 37. In addition, in a region where the change rate $C(n)$ of the deposition thickness of the insulating film 11 is negative (which means a region where the change rate $Cr(n)$ is positive), the moving speed $V(n)$ of the etchant nozzle 36 may be increased within an operating range of the etching apparatus 31b, while in a region where the change rate $Cr(n)$ of the deposition thickness of the insulating film 11 is negative (which means a region where the change rate $C(n)$ is positive), the moving speed $Vr(n)$ of the rinse solution nozzle 36a may be increased within an operating range of the etching apparatus 31b.

By controlling the moving speed $V(n)$ of the etchant nozzle 36 and moving speed $Vr(n)$ of the etchant nozzle 36, depending on the change rates-$C(n)$ and $Cr(n)$ of the deposition thickness of the insulating film 11 in a radial direction of the main surface 1a of the semiconductor wafer 1 in such a manner, the etching amount of the insulating film 11 can be changed at each position on the main surface 1a of the semiconductor wafer 1, depending on the deposition thickness distribution of the insulating film 11 as illustrated in FIG. 38, even if the deposition thickness distribution of the insulating film 11 on the main surface 1a of the semiconductor wafer 1 is complex as shown in the graph of FIG. 35. The thickness ($ta(n)$) of the insulating film 11 on the main surface 1a of the semiconductor wafer 1 can therefore be equalized after Step S1b as illustrated in FIG. 39.

In this Embodiment, by controlling (changing) the moving speed of each of the etchant nozzle 36 and rinse solution nozzle 36a, depending on the thickness distribution of the insulating film 11 within the main surface 1a of the semiconductor wafer 1, the etching time (etching amount) of the insulating film 11 can be changed at each position on the main surface 1a of the semiconductor wafer 1 as illustrated in FIG. 38. This Embodiment can therefore be applied to the case where the deposition thickness distribution of the insulating film 11 on the main surface 1a of the semiconductor wafer 1 is more complex than the cases as described in Embodiments 1 and 2. For example, this Embodiment can also be applied to the case where the thickness distribution (t(n)) of the insulating film 11 on the main surface 1a of the semiconductor wafer 1 is small both at the periphery and center of the main surface 1a of the semiconductor wafer 1 and large therebetween as shown in the graph of FIG. 35. Such a deposition thickness distribution of the insulating film 11 tends to occur when the insulating film 11 is deposited on the semiconductor wafer 1 by using a single-wafer film forming apparatus (such as single-wafer CVD apparatus). Accordingly, application of this Embodiment to the case where the insulating film 11 is deposited on the semiconductor wafer 1 by using a single-wafer film forming apparatus (for example, a single-wafer CVD apparatus) brings about higher effects.

Also in this Embodiment, even if the deposition thickness distribution of the insulating film 11 on the main surface 1a of the semiconductor wafer 1 is uneven, treatment of Step S1b enables sufficient equalization of the thickness distribution of the insulating film 11 within the main surface 1a of the semiconductor wafer 1. It is therefore possible to attain substantially similar effects to those obtained by Embodiments 1 and 2. For example, appearance of etching residues of the insulating film 27 other than sidewall spacers 15, which will otherwise occur in the etchback step of the insulating film 27 for the formation of the sidewall spacers 15, can be prevented. In addition, it is possible to prevent overetching and thereby protect an exposed substrate region (a region of the p well 3 in which the n+ semiconductor regions 16 are to be formed) of the semiconductor wafer 1 from damage. In the region 1A in which the deposition thickness of the insulating film 11 is large and in the region 1B in which it is small, the sidewall spacers 15 can be formed with equal (same) thickness so that connection resistance between the plug 24 in the contact hole 23 and the n+ semiconductor region 16 (metal silicide layer 17 on the surface thereof) can be made uniform (equal) and generation of connection failure between the plug 24 in the contact hole 23 and the n+ semiconductor region 16 (metal silicide layer 17 on the surface thereof) can be prevented. Accordingly the semiconductor device having improved reliability and performance can be obtained. In addition, the production yield of the semiconductor device can be improved.

Embodiment 4

Figure 40:
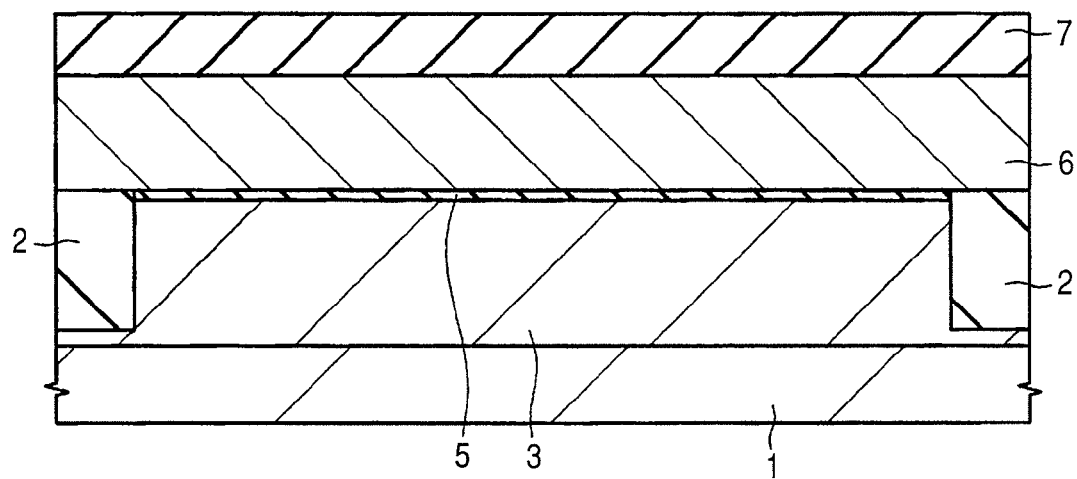
FIG. 40 is a fragmentary cross-sectional view of a semiconductor device according to another embodiment of the present invention during a fabrication step thereof.
Figure 41:
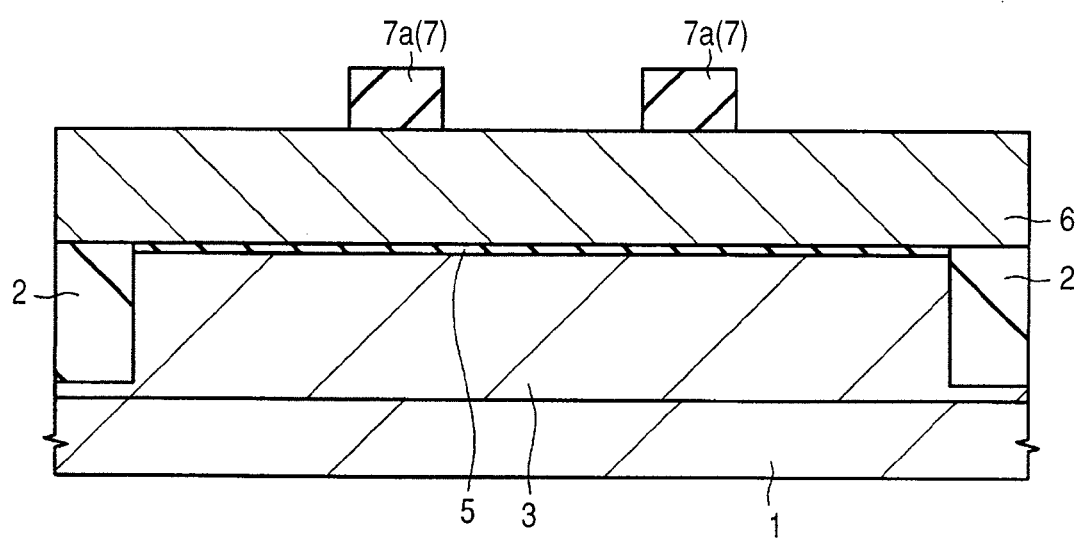
FIG. 41 is a fragmentary cross-sectional view of the semiconductor device during a fabrication step following that of FIG. 40.
Figure 42:
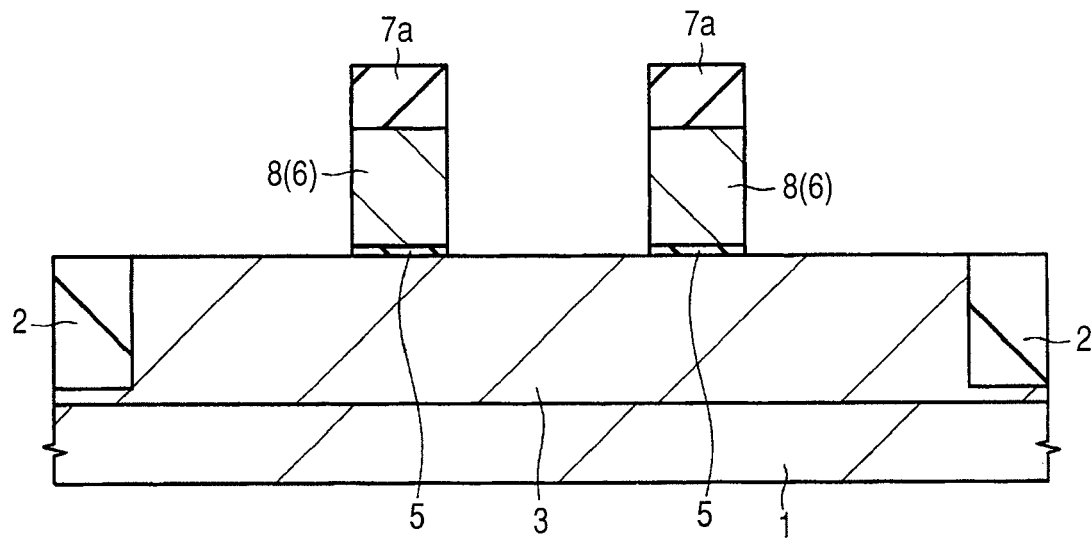
FIG. 42 is a fragmentary cross-sectional view of the semiconductor device during a fabrication step following that of FIG. 41.

Fabrication steps of a semiconductor device in this Embodiment will next be described with reference to accompanying drawings. FIGS. 40 to 42 are fragmentary cross-sectional view of the semiconductor device of this Embodiment during its fabrication steps. Steps until that described in FIG. 1 are similar to those of Embodiment 1 so that description on them is omitted and only steps subsequent thereto will be described here.

After the structure as illustrated in FIG. 1 is formed in a similar manner to Embodiment 1, a conductive film 6 is formed over the main surface (that is, on a gate insulating film 5) of a semiconductor wafer 1 in a similar manner to Embodiment 1, followed by the formation of an insulating film 7 on the conductive film 6 as illustrated in FIG. 40. The insulating film 7 serves as a hard mask insulating film to be used for the processing of a gate electrode and can be made of, for example, a silicon oxide film or a silicon nitride film.

With a photoresist pattern (not illustrated) formed on the insulating film 7 as an etching mask, the insulating film 7 is patterned by etching (dry etching) as illustrated in FIG. 41, whereby an insulating film pattern 7a (that is, a pattern of the insulating film 7) made of patterned insulating film 7 is formed.

After removal of the photoresist pattern, treatment similar to Step S1 of Embodiment 1, which will be described in detail later, is performed to correct the size of the insulating film pattern 7a. As illustrated in FIG. 42, with the insulating film pattern 7a as an etching mask (hard mask), the conductive film 6 is patterned by etching (dry etching), whereby a gate electrode 8 made of the patterned conductive film 6 is formed on the gate insulating film 5 over the p well 3.

Steps subsequent thereto are substantially similar to the steps as illustrated in FIGS. 3 to 12 in Embodiment 1 so that description on them is omitted. The insulating film 7 can be removed in an optional step after the formation of the gate electrode 8.

Figure 43:
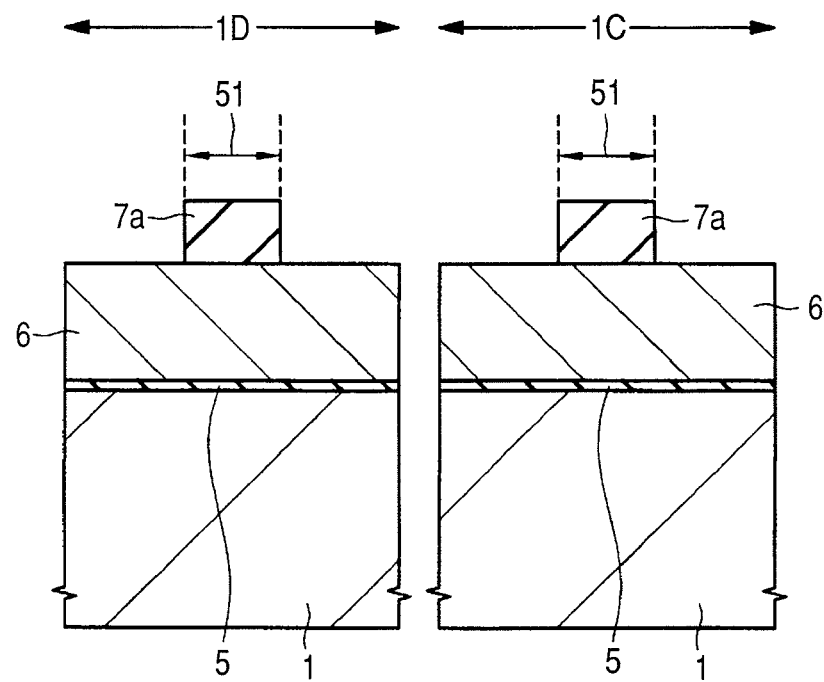
FIG. 43 is a fragmentary cross-sectional view of a semiconductor device according to Second comparative example during a fabrication step thereof.
Figure 44:
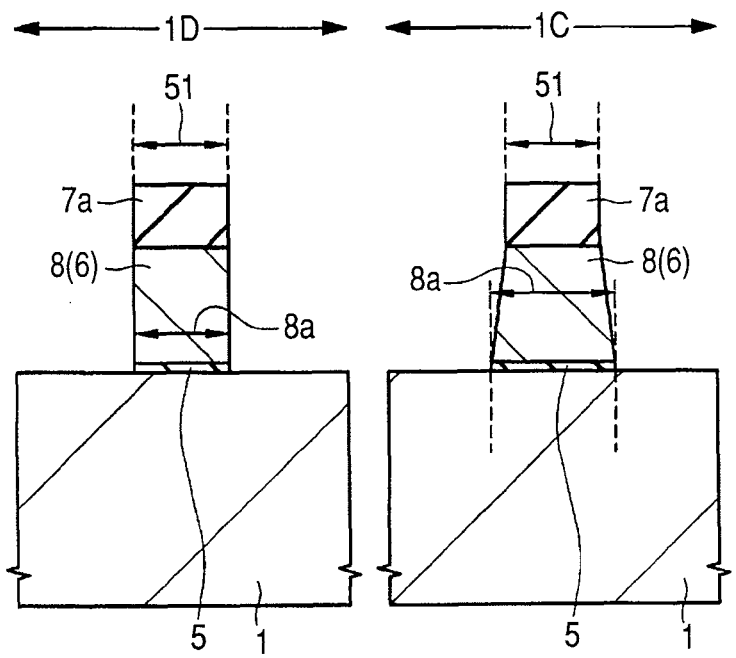
FIG. 44 is a fragmentary cross-sectional view of the semiconductor device of Second comparative example during a fabrication step following that of FIG. 43.

FIGS. 43 and 44 are fragmentary cross-sectional views of a semiconductor device of Second Comparative Example during its fabrication steps. Different from Embodiment 4, the treatment of Step S1 is not performed in this Comparative Example. In each diagram, a peripheral portion (periphery) 1C and a central portion (center) 1D of the main surface of the semiconductor wafer 1 are illustrated.

The step of FIG. 43 corresponds to the step of FIG. 41 and in FIG. 43, the insulating film pattern 7a formed by patterning of the insulating film 7 is illustrated. FIG. 44 corresponds to the step of FIG. 42 but a gate electrode 8 illustrated therein is formed in a manner different from Embodiment 4, that is, by patterning of the conductive film 6 with the insulating film pattern 7a, which has not been subjected to the treatment of Step S1, as an etching mask.

Since in the peripheral portion 1C and central portion 1D on the main surface of the semiconductor wafer 1, the insulating film 7 is patterned by using photoresist patterns formed using the same mask (photomask), the size 51 (size in a direction corresponding to the gate length direction of the gate electrode 8 which will be formed later) of the insulating film pattern 7a is almost equal in the peripheral portion 1C and central portion 1D on the main surface of the semiconductor wafer 1 as illustrated in FIG. 43.

Figure 45:
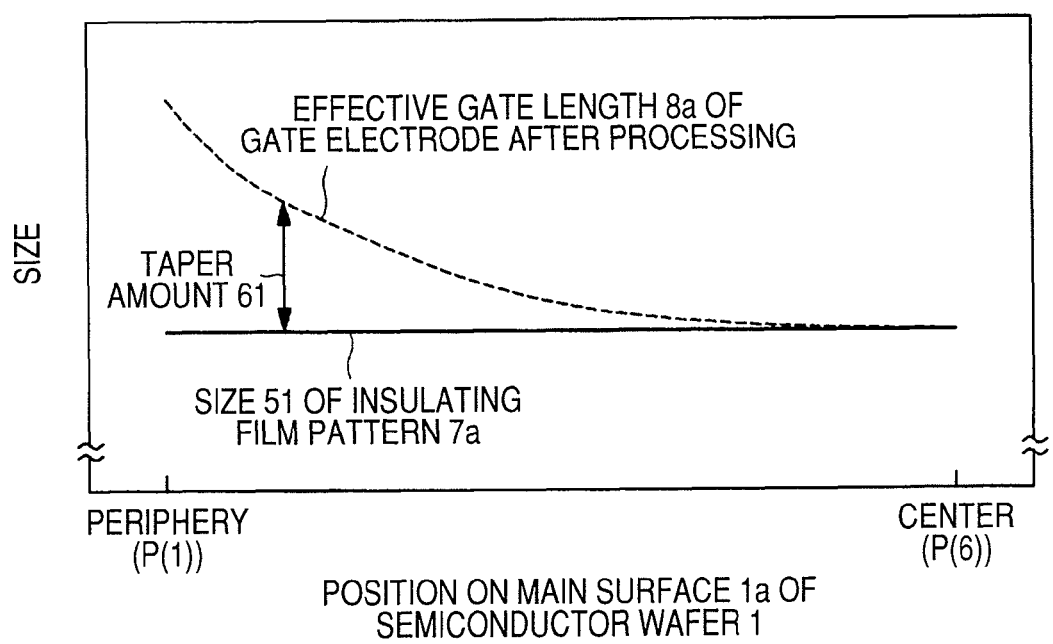
FIG. 45 is a graph showing a size of an insulating film pattern at each position of a semiconductor wafer and an effective gate length of a gate electrode formed using the insulating film pattern having the size.

FIG. 45 is a graph showing the size 51 of the insulating film pattern 7a at each position of the semiconductor wafer 1 and an effective gate length 8a of the gate electrode 8 formed using the insulating film pattern 7a having this size. In this diagram, the gate electrode 8 is formed by patterning the conductive film 6 while using, as an etching mask, the insulating film pattern 7a not subjected to the treatment of Step S1 and having the same size 51 at any position on the semiconductor wafer 1.

When the conductive films 6 in the central portion 1D and in the peripheral portion 1C on the main surface of the semiconductor wafer are dry etched with the insulating film patterns 7a, which have been patterned into the same size 51, as an etching mask, the conductive film 6 tends to be etched into a tapered shape in the peripheral portion 1C compared with that in the central portion 1D as illustrated in FIG. 44. The gate electrode 8 formed in the peripheral portion 1C on the main surface of the semiconductor wafer 1 therefore tends to have a skirt (taper, tapered) shape compared with that in the central portion 1D. As illustrated in FIGS. 44 and 45, the effective gate length of the gate electrode 8 therefore becomes greater in the peripheral portion 1C on the main surface of the semiconductor wafer 1 than in the central portion 1D. This becomes a cause for deteriorating the characteristics of the semiconductor device in the peripheral portion 1C on the main surface of the semiconductor wafer 1, which may cause a reduction in the production yield of the semiconductor device.

In this Embodiment, the gate electrode 8 is formed by patterning the insulating film 7 to form the insulating film pattern 7a, subjecting the insulating film pattern 7a to treatment similar to that employed in Step S1 of Embodiment 1 to correct the size 51 of the insulating film pattern 7a (to correct the size 51 into a size 51a which will be described later), and dry etching the conductive film 6 with the size-corrected insulating film pattern 7a as an etching mask. Concrete procedures of Step S1 are similar to those employed in Embodiment 1 so that description on them is omitted.

Figure 46:
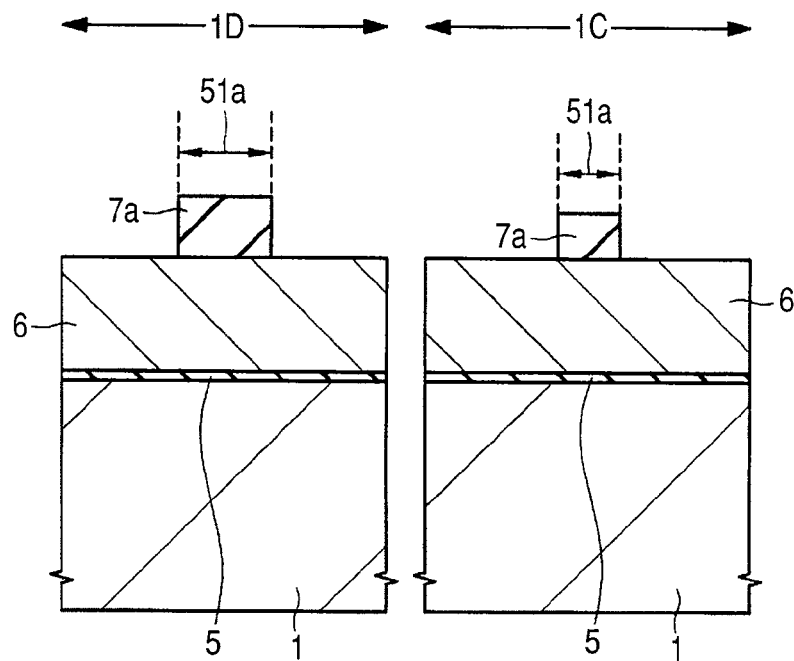
FIG. 46 is a fragmentary cross-sectional view of a semiconductor device according to a further embodiment of the present invention during its manufacturing step.
Figure 47:
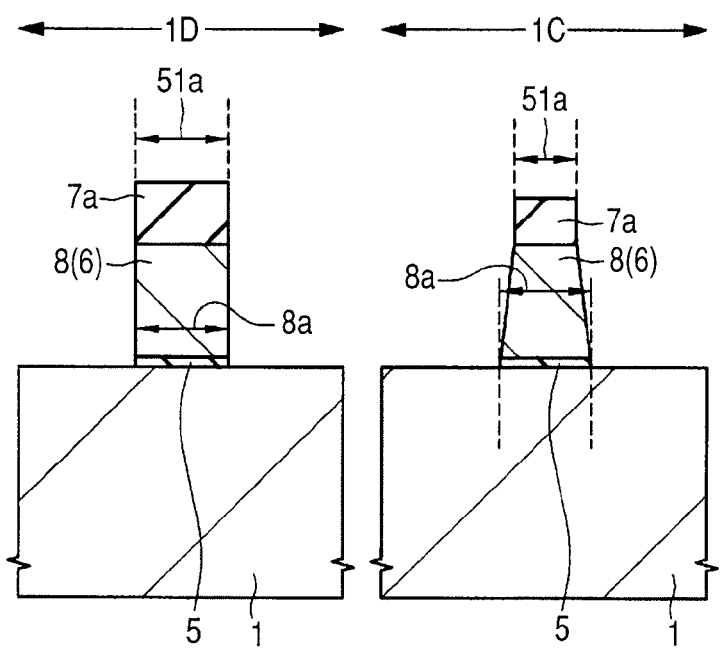
FIG. 47 is a fragmentary cross-sectional view of the semiconductor device during a fabrication step following that of FIG. 46.

FIGS. 46 and 47 are fragmentary cross-sectional views of the semiconductor device according to this Embodiment during its fabrication steps and in each diagram, the peripheral portion 1C and central portion 1D on the main surface of the semiconductor wafer 1 are illustrated. FIG. 46 illustrates the size-corrected insulating film pattern 7a after the formation of the structure of FIG. 43 and treatment of Step S1. FIG. 47 corresponds to the step of FIG. 42 and in this diagram, a gate electrode 8 formed by correcting the size of the insulating film pattern 7a by the treatment of Step S1 as illustrated in FIG. 46, and then patterning the conductive film 6 with the insulating film pattern 7a having the corrected size 51a as an etching mask.

Figure 48:
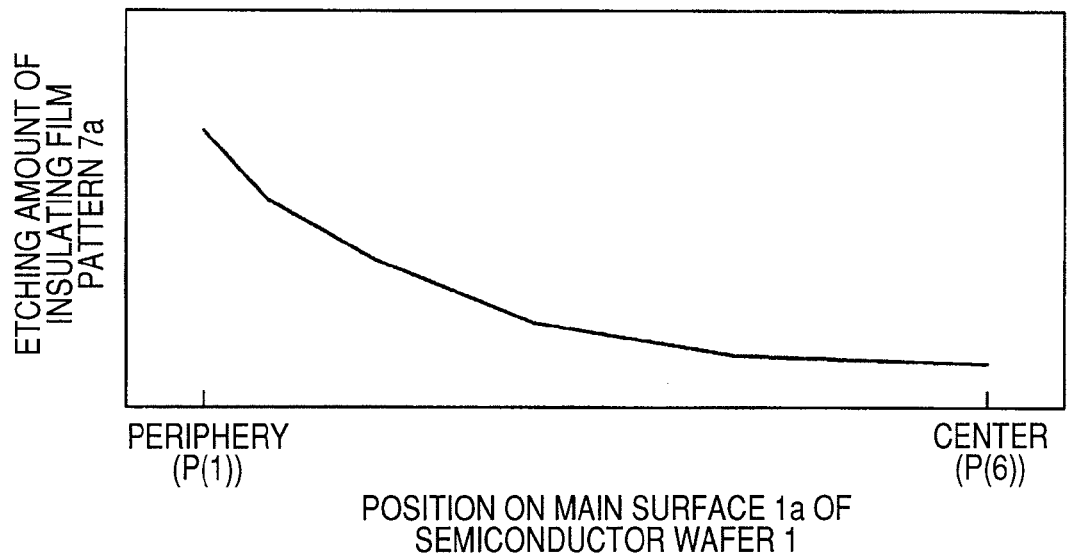
FIG. 48 is a graph showing the etching amount of an insulating film pattern.
Figure 49:
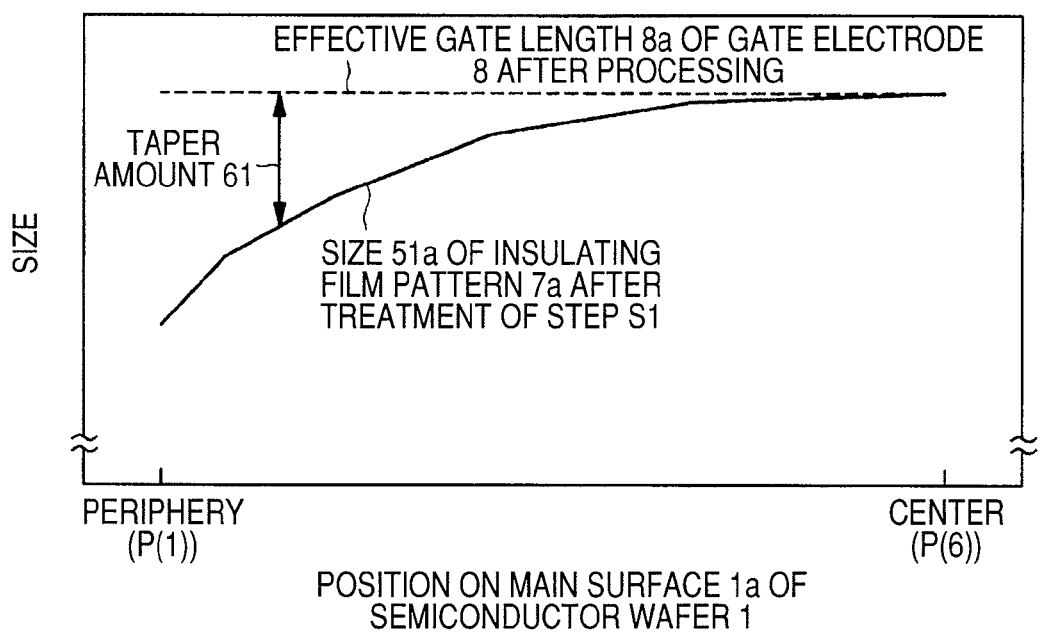
FIG. 49 is a graph showing the size of an insulating film pattern at each position on the main surface of a semiconductor wafer and an effective gate length of a gate electrode formed using the insulating film pattern having the size.

FIG. 48 is a graph showing the etching amount of the insulating film pattern 7a, that is, a reduction amount (corresponding to a difference between the size 51 and 51a) of the size 51 of the insulating film pattern 7a by the treatment of Step S1. FIG. 49 is a graph showing the size 51a of the insulating film pattern 7a after the treatment of Step S1 at each position on the main surface 1a of the semiconductor wafer 1 and effective gate length 8a of the gate electrode 8 formed using the insulating film pattern 7a having the size 51a. In the graph of FIG. 49, shown is the gate electrode 8 formed by changing the size 51a of the insulating film pattern 7a, depending on the position on the main surface 1a of the semiconductor wafer 1 by the treatment of Step S1 and patterning the conductive film 6 with this insulating film pattern 7a as an etching mask. The sizes 51 and 51a of the insulating film pattern 7a are sizes in a direction corresponding to the gate length direction of the gate electrode 8 which will be formed later. The size 51 is a size before the treatment of Step S1 and the size 51a is that after the treatment of Step S1.

In this Embodiment, in order to equalize the distribution of the effective gate length 8a of the gate electrode 8 on the main surface 1a of the semiconductor wafer 1 by the treatment of Step S1, the distribution of the insulating film pattern 7a on the main surface 1a of the semiconductor wafer 1 is corrected by wet etching the insulating film pattern 7a while increasing the etching amount of it for the gate electrode 8 having a large taper amount 61 than the gate electrode 8 having a small taper amount and thereby reducing the size 51. Described specifically, the size 51 of the insulating film pattern 7a is reduced into the size 51a by wet etching of the insulating film pattern 7a with the etchant 37 from the etchant nozzle 36 of the etching apparatus 31, depending on the taper amount (generation degree of tapered shape, degree of tapered shape of the gate electrode 8) 61 of the gate electrode 8 caused by the etching step (processing step of gate electrode 8) of the conductive film 6 with the insulating film pattern 7a as an etching mask. The taper amount 61 of the gate electrode 8 corresponds to a difference between the size 51a of the insulating film pattern 7a and the effective gate length 8a which is the size of the lower portion of the gate electrode 8, and in the graph of FIG. 49, it corresponds to a difference between the solid line and dotted line. In this Embodiment, the etchant 37 serves to reduce the size 51 of the insulating film pattern 7a by etching the insulating film pattern 7a so that an etchant which can etch the insulating film pattern 7a but is not suited for etching of the conductive film 6 is used.

As illustrated in FIGS. 46 and 48, in the peripheral portion 1C on the main surface of the semiconductor wafer 1 where a tapered shape tends to appear at the time of etching of the conductive film 6 (a skirt shape of the gate electrode 8 tends to occur owing to a large taper amount 61), the etching amount (etching time) of the insulating film 7 by Step S1 is made greater (increased) to increase a reduction amount (difference between the size 51 before the treatment of Step S1 and the size 51a after the treatment of Step S1) of the size 51 of the insulating film pattern 7a. In the central portion 1D on the main surface of the semiconductor wafer 1 where the tapered shape hardly appears at the time of etching of the conductive film 6 (a skirt shape of the gate electrode 8 hardly occurs owing to a small taper amount 61), the etching amount (etching time) of the insulating film pattern 7a by Step S1 is made smaller (decreased) to decrease the reduction amount (difference between the size 51 before the treatment of Step S1 and the size 51a after the treatment of Step S1) of the size 51 of the insulating film pattern 7a. In other words, the reduction amount of the size 51 of the insulating film pattern 7a is made greater on the peripheral side than on the central side on the main surface 1a of the semiconductor wafer 1. By this, the insulating film pattern 7a which has the size 51 at any position on the main surface 1a of the semiconductor wafer 1 before the treatment of Step S1 becomes an insulating film pattern 7a having the size 51a, which varies, depending on the position on the main surface 1a of the semiconductor wafer 1.

By etching of the conductive film 6 with the insulating film pattern 7a, which has a size corrected by the treatment of Step S1, as a hard mask, the size (size in the gate length direction) of the upper portion of the gate electrode 8 becomes smaller in the peripheral portion 1C on the main surface of the semiconductor wafer 1 than in the central portion 1D, but the size (size in the gate length direction) of the lower portion of the gate electrode 8, that is, the effective gate length 8a of the gate electrode 8 can be made substantially equal between the peripheral portion 1C and central portion 1D on the main surface of the semiconductor wafer 1. The effective gate length 8a of the gate electrode 8 can therefore be made equal between the central portion 1D and peripheral portion 1C on the main surface of the semiconductor wafer 1, that is, all over the main surface 1a of the semiconductor wafer 1. This makes it possible to prevent deterioration of the characteristics of the semiconductor device in the peripheral portion 1C on the main surface of the semiconductor wafer 1 and to improve the production yield of the semiconductor device.

In this Embodiment, similar to Embodiment 1, the semiconductor wafer 1 is divided into a plurality of sections (corresponding to the above-described sections RG(1) to RG(5) and the moving speed of the etchant nozzle 36 in each section is controlled. The moving speed of the etchant nozzle 36 therefore differs on the peripheral side and central side of the semiconductor wafer 1.

The distribution of the taper amount 61 of the gate electrode 8 on the main surface 1a of the semiconductor wafer 1 in this Embodiment, which is illustrated in FIG. 49, corresponds to the deposition thickness distribution of the insulating film 11 on the main surface 1a of the semiconductor wafer 1 in Embodiment 1, which is illustrated in FIG. 18. In Embodiment 1, the moving speed of the etchant nozzle 36 is controlled depending on the thickness distribution of the insulating film 11 on the main surface 1a of the semiconductor wafer 1. Also in this Embodiment, the moving speed of the etchant nozzle 36 may be controlled depending on the distribution of the taper amount 61 of the gate electrode 8 which is caused at the time of processing of the gate electrode 8. More specifically, as the moving speed of the etchant nozzle 36 is controlled, depending on a change rate C(n) of the deposition thickness of the insulating film 11 in a radial direction of the main surface 1a of the semiconductor wafer 1 in Embodiment 1, the moving speed of the etchant nozzle 36 may be controlled, depending on a change rate (change rate in a radial direction of the main surface 1a of the semiconductor wafer 1) of the taper amount 61 of the gate electrode 8 in this Embodiment. In other words, in a region where a change rate of the taper amount 61 of the gate electrode 8 is large, the moving speed of the etchant nozzle 36 is decreased, while in a region where a change rate of the taper amount 61 of the gate electrode 8 is small, the moving speed of the etchant nozzle 36 may be increased.

Even if the generation degree of the taper amount 61 during processing of the gate electrode 8 is not simple and a reduction amount (etching amount of the insulating film pattern 7a) of the size 51 of the insulating film pattern 7a is not proportional to a distance from the center of the main surface 1a of the semiconductor wafer 1, the size 51a of the insulating film pattern 7a can be controlled to a desired distribution by carrying out the treatment of Step S1 as in Embodiment 1, whereby a complex distribution as illustrated in FIG. 49 can be realized. This makes it possible to make uniform the effective gate length 8a of the gate electrode 8 within the main surface of the semiconductor wafer 1. As a result, the characteristics of the semiconductor device within the main surface of the semiconductor wafer 1 can be made uniform and the production yield of the semiconductor device can be improved.

The invention made by the present inventor was so far described based on its embodiments. The present invention is not limited to or by these embodiments. It is needless to say that the invention can be modified without departing from the scope of the invention.

The present invention can be applied to a fabrication technology of a semiconductor device.

What is claimed is:

1. A fabrication method of a semiconductor device, comprising the steps of:
    (a) preparing a semiconductor wafer;
    (b) forming a first conductive film for gate electrode over the main surface of the semiconductor wafer;
    (c) forming a first insulating film over the first conductive film;
    (d) patterning the first insulating film;
    (e) after the step (d), correcting the size of the first insulating film pattern over the semiconductor wafer; and
    (f) after the step (e), etching the first conductive film with the first insulating film pattern as an etching mask to form the gate electrode,
    wherein in the step (e),
    an etchant for etching the first insulating film pattern is supplied to the main surface of the semiconductor wafer from an etchant supply means while rotating the semiconductor wafer and moving thereabove the etchant supply means from the peripheral side to the central side of the main surface of the semiconductor wafer,
    the moving speed of the etchant supply means is changed between the peripheral side and central side of the semiconductor wafer, and
    the moving speed of the etchant supply means is controlled, depending on the distribution, over the semiconductor wafer, of a taper amount of the gate electrode generated during the step (f).

* * * * *